(12) United States Patent
Miyamoto et al.

(10) Patent No.: US 6,900,074 B2
(45) Date of Patent: May 31, 2005

(54) METHOD OF MANUFACTURING A SEMICONDUCTOR DEVICE HAVING PLURAL SEMICONDUCTOR CHIPS, WHEREIN ELECTRODES OF THE SEMICONDUCTOR CHIPS ARE ELECTRICALLY CONNECTED TOGETHER VIA WIRING SUBSTRATES OF THE SEMICONDUCTOR CHIPS

(75) Inventors: Toshio Miyamoto, Kodaira (JP); Asao Nishimura, Kokubunji (JP); Koki Noguchi, Tokyo (JP); Satoshi Michishita, Tokorozawa (JP); Masashi Horiguchi, Kawasaki (JP); Masaharu Kubo, Hachioji (JP); Kazuyoshi Shiba, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/422,942

(22) Filed: Apr. 25, 2003

(65) Prior Publication Data

US 2003/0209740 A1 Nov. 13, 2003

Related U.S. Application Data

(63) Continuation of application No. 10/050,950, filed on Jan. 22, 2002, now Pat. No. 6,611,012, which is a continuation of application No. 09/984,089, filed on Oct. 26, 2001, now Pat. No. 6,492,719, which is a continuation of application No. 09/319,044, filed on Jul. 30, 1999, now Pat. No. 6,335,565.

(51) Int. Cl.[7] .......................... H01L 21/48; H01L 23/02

(52) U.S. Cl. ...................... 438/108; 438/109; 257/686; 257/724; 257/778

(58) Field of Search ................................ 257/686, 698, 257/724, 778; 438/108, 109, 667, 672, 675, 461

(56) References Cited

U.S. PATENT DOCUMENTS

| 5,677,569 A | 10/1997 | Choi et al. |
| 5,910,685 A | 6/1999 | Watanabe et al. |
| 5,939,789 A | 8/1999 | Kawai et al. |
| 5,973,403 A | 10/1999 | Wark |
| 6,020,629 A | 2/2000 | Farnworth |
| 6,060,770 A * | 5/2000 | Nakamura et al. .......... 257/668 |
| 6,097,081 A | 8/2000 | Masuda et al. |
| 6,107,679 A | 8/2000 | Noguchi |
| 6,181,002 B1 | 1/2001 | Juso et al. |
| 6,239,496 B1 * | 5/2001 | Asada ........................ 257/777 |

FOREIGN PATENT DOCUMENTS

| JP | 64-81348 | 3/1989 | |
| JP | 2-198148 | 8/1990 | |
| JP | 4-280667 | 10/1992 | |
| JP | 4-342162 | 11/1992 | |
| JP | 5-75015 | 3/1993 | |
| JP | 05198737 A * | 8/1993 | ......... H01L/25/065 |
| JP | 7-78934 | 3/1995 | |

* cited by examiner

Primary Examiner—Minh-Loan Tran
(74) Attorney, Agent, or Firm—Mattingly, Stanger & Malur, P.C.

(57) ABSTRACT

Described herein is a stacked package according to the present invention, wherein a plurality of tape carriers which seal semiconductor chips, are multilayered in upward and downward directions. In the stacked package, one ends of leads formed over the whole surfaces of each tape carrier are electrically connected to their corresponding connecting terminals of the semiconductor chip. Other ends of the leads are electrically connected to their corresponding through holes defined in the tape carrier. Connecting terminals common to the plurality of semiconductor chips are formed at the same places of the plurality of tape carriers and withdrawn to the same external connecting terminals through a plurality of mutually-penetrated through holes.

19 Claims, 91 Drawing Sheets

FIG. 14

| Pin | Signal |
|---|---|
| 1 | Vss |
| 2 | Vss |
| 3 | Vcc |
| 4 | Vss |
| 5 | Vss |
| 6 | A3 |
| 7 | A4 |
| 8 | A2 |
| 9 | A5 |
| 10 | A1 |
| 11 | A6 |
| 12 | A0 |
| 13 | A7 |
| 14 | A8 |
| 15 | A9 |
| 16 | A10 |
| 17 | A11 |
| 18 | /RAS |
| 19 | /OE |
| 20 | /WE |
| 21 | /UCAS |
| 22 | /LCAS |
| 23 | DQ8 |
| 24 | DQ7 |
| 25 | DQ9 |
| 26 | DQ6 |
| 27 | DQ10 |
| 28 | DQ5 |
| 29 | DQ11 |
| 30 | DQ4 |
| 31 | Vcc |
| 32 | Vss |
| 33 | Vcc |
| 34 | Vss |
| 35 | DQ12 |
| 36 | DQ3 |
| 37 | DQ13 |
| 38 | DQ2 |
| 39 | DQ14 |
| 40 | DQ1 |
| 41 | DQ15 |
| 42 | DQ0 |
| 43 | Vss |
| 44 | Vcc |
| 45 | Vss |
| 46 | Vcc |
| 47 | Vss |
| 48 | Vcc |

FIG. 15

| CATEGORY | SYMBOL | INPUT/OUTPUT | DESIGNATION | FUNCTION |
|---|---|---|---|---|
| POWER SOURCE | Vcc | INPUT | POWER SUPPLY | CONNECT Vcc TERMINAL TO POWER SUPPLIES FOR ALL THE SYSTEMS. IF OPEN TERMINAL EXISTS, DEVICE DOES NOT OPERATE |
| | Vss | INPUT | GROUND | CONNECT Vss TERMINAL TO GROUND FOR ALL THE SYSTEMS. IF OPEN TERMINAL EXISTS, DEVICE DOES NOT OPERATE |
| | Vpp | INPUT | PROGRAM POWER SUPPLY | CONNECT Vpp TERMINAL TO POWER SUPPLY (Vcc) UPON NORMAL OPERATION. APPLY 12.5V IN PROM MODE |
| CLOCK | PLLVcc | INPUT | PLL POWER SUPPLY | THIS IS POWER SUPPLY FOR BUILT-IN PLL OSCILLATOR |
| | PLLVss | INPUT | PLL GROUND | THIS IS GRUND FOR BUILT-IN PLL OSCILLATOR |
| | PLLCAP | INPUT | PLL CAPACITY | THIS IS EXTERNAL CAPACITY TERMINAL FOR BUILT-IN PLL OSCILLATOR |
| | EXTAL | INPUT | EXTERNAL CLOCK | THIS CONNECTS CRYSTAL OSCILLATOR, EXTAL TERMINAL CAN ALSO INPUT EXTERNAL CLOCK THERETHROUGH |
| | XTAL | INPUT | CRYSTAL | THIS CONNECTS CRYSTAL OSCILLATOR |
| | CK | OUTPUT | SYSTEM CLOCK | THIS SUPPLIES SYSTEM CLOCK TO PERIPHERAL DEVICE |
| SYSTEM CONTROL | RES | INPUT | POWER-ON RESET | WHEN LOW LEVEL IS APPLIED TO THIS TERMINAL, POWER-ON RESET STATE IS REACHED |
| | MRES | INPUT | MANUAL RESET | WHEN LOW LEVEL IS APPLIED TO THIS TERMINAL, MANUAL RESET STATE IS REACHED |
| | WDTOVF | OUTPUT | WATCH DOG TIMER OVERFLOW | OVERFLOW OUTPUT SIGNAL FROM WDT |
| | BREQ | INPUT | BUS RIGHT REQUEST | WHEN EXTERNAL DEVICE REQUESTS RELEASE OF BUS RIGHT, SET THIS TERMINAL TO LOW LEVEL |
| | BACK | OUTPUT | BUS RIGHT REQUEST ACKNOWLEDGE | THIS TERMINAL INDICATES EXTERNAL DEVICE IS ALLOWED TO HAVE BUS RIGHT, DEVICE HAVING OUTPUTTED/BREQ SIGNAL CAN RECOGNIZE ACQUISITION OF BUS RIGHT IN RESPONSE TO/BACK SIGNAL |
| OPERATION MODE CONTROL | MD0~MD3 | INPUT | MODE SETTING | THIS IS TERMINAL FOR DETERMINING OPERATION MODE. DON'T CHANGE INPUT VALUE DURING OPERATION |

FIG. 16

| CATEGORY | SYMBOL | INPUT/OUTPUT | DESIGNATION | FUNCTION |
|---|---|---|---|---|
| INTERRUPT | NMI | INPUT | NON-MASKABLE INTERRUPT | THIS IS NON-MASKABLE INTERRUPT REQUEST TERMINAL. THIS CAN SELECT WHICH ONE OF LEADING EDGE AND TRAILING EDGE SHOULD BE ACCEPTED |
| | $\overline{IRQ0} \sim \overline{IRQ7}$ | INPUT | INTERRUPT REQUESTS 0~7 | THEY ARE MASKABLE INTERRUPT REQUEST TERMINALS. SELECTION OF LEVEL INPUT AND EDGE INPUT IS ALLOWED |
| | $\overline{IRQOUT}$ | OUTPUT | INTERRUPT REQUEST OUTPUT | THIS INDICATES OCCURRENCE OF INTERRUPT FACTOR. THIS ALLOWS RECOGNITION OF OCCURRENCE OF INTERRUPT EVEN DURING BUS RELEASE |
| ADDRESS BUS | A0~A21 | OUTPUT | ADDRESS BUS | THEY OUTPUT ADDRESSES |
| DATA BUS | D0~D15 (112 PIN) D0~D31 (144 PIN) | OUTPUT | DATA BUSES | THEY ARE 16-BIT (112-PIN VERSION) OR 32-BIT (144-PIN VERSION) BIDIRECTIONAL DATA BUSES |
| BUS CONTROL | $\overline{CS0} \sim \overline{CS3}$ | OUTPUT | CHIP SELECT 0~3 | THEY ARE CHIP SELECT SIGNALS FOR EXTERNAL MEMORY OR DEVICE |
| | $\overline{RD}$ | OUTPUT | READ | THIS INDICATES READING OF DATA FROM EXTERNAL DEVICE |
| | $\overline{WRH}$ | OUTPUT | WRITE ON HIGH-ORDER SIDE | THIS INDICATES WRITING TO THE EIGHT UPPER BITS (BITS 15 TO 8) OF EXTERNAL DATA |
| | $\overline{WRL}$ | OUTPUT | WRITE ON LOW-ORDER SIDE | THIS INDICATES WRITING TO THE EIGHT LOWER BITS (BITS 7 TO 0) OF EXTERNAL DATA |
| | $\overline{WAIT}$ | INPUT | WAIT | THIS IS INPUT FOR INSERTING WAIT CYCLE INTO BUS CYCLE USED WHEN EXTERNAL SPACE IS ACCESSED |
| | $\overline{RAS}$ | OUTPUT | ROW ADDRESS STROBE | THIS IS TIMING SIGNAL FOR ROW ADDRESS STROBE OF DRAM |
| | $\overline{CASH}$ | OUTPUT | COLUMN ADDRESS STROBE ON HIGH-ORDER SIDE | THIS IS TIMING SIGNAL FOR COLUMN ADDRESS STROBE OF DRAM. THIS IS OUTPUTTED WHEN THE EIGHT UPPER BITS OF DATA ARE ACCESSED |
| | $\overline{CASL}$ | OUTPUT | COLUMN ADDRESS STROBE ON LOW-ORDER SIDE | THIS IS TIMING SIGNAL FOR COLUMN ADDRESS STROBE OF DRAM |
| | $\overline{RDWR}$ | OUTPUT | DRAM READ/WRITE | THIS IS DRAM WRITE STROBE SIGNAL |
| | $\overline{AH}$ | OUTPUT | ADDRESS HOLD | MULTIPLEX BUS FOR ADDRESS/DATA IS USED. THIS IS ADDRESS HOLD TIMING SIGNAL WITH RESPECT TO DEVICE |
| | $\overline{WRHH}$ (144 PIN) | OUTPUT | WRITE ON HH SIDE | THIS INDICATES WRITING OF BITS 31 TO 24 OR EXTERNAL DATA |
| | $\overline{WRHL}$ (144 PIN) | OUTPUT | WRITE ON HL SIDE | THIS INDICATES WRITING OF BITS 23 TO 16 OR EXTERNAL DATA |
| | $\overline{CASHH}$ (144 PIN) | OUTPUT | COLUMN ADDRESS STROBE ON HH SIDE | THIS IS TIMING SIGNAL FOR COLUMN ADDRESS STROBE OF DRAM. THIS IS OUTPUTTED WHEN BITS 31 TO 24 OF DATA ARE ACCESSED |
| | $\overline{CASHL}$ (144 PIN) | OUTPUT | COLUMN ADDRESS STROBE ON HL SIDE | THIS IS TIMING SIGNAL FOR COLUMN ADDRESS STROBE OF DRAM. THIS IS OUTPUTTED WHEN BITS 23 TO 16 OF DATA ARE ACCESSED |

FIG. 17

| CATEGORY | SYMBOL | INPUT/OUTPUT | DESIGNATION | FUNCTION |
|---|---|---|---|---|
| MULTI-FUNCTION TIMER PULSE UNIT | TCLKA TCLKB TCLKC TCLKD | INPUT | MTU TIMER CLOCK INPUT | THEY ARE EXTERNAL CLOCK INPUT TERMINALS TO MTU COUNTER |
| | TIOC0A TIOC0B TIOC0C TIOC0D | INPUT/OUTPUT | MTU INPUT CAPTURE/OUTPUT COMPARE (CHANNEL 0) | THEY ARE INPUT CAPTURE INPUT/OUTPUT COMPARE OUTPUT/PWM OUTPUT TERMINALS OF CHANNEL 0 |
| | TIOC1A TIOC1B | INPUT/OUTPUT | MTU INPUT CAPTURE/OUTPUT COMPARE (CHANNEL 1) | THEY ARE INPUT CAPTURE INPUT/OUTPUT COMPARE OUTPUT/PWM OUTPUT TERMINALS OF CHANNEL 1 |
| | TIOC2A TIOC2B | INPUT/OUTPUT | MTU INPUT CAPTURE/OUTPUT COMPARE (CHANNEL 2) | THEY ARE INPUT CAPTURE INPUT/OUTPUT COMPARE OUTPUT/PWM OUTPUT TERMINALS OF CHANNEL 2 |
| | TIOC3A TIOC3B TIOC3C TIOC3D | INPUT/OUTPUT | MTU INPUT CAPTURE/OUTPUT COMPARE (CHANNEL 3) | THEY ARE INPUT CAPTURE INPUT/OUTPUT COMPARE OUTPUT/PWM OUTPUT TERMINALS OF CHANNEL 3 |
| | TIOC4A TIOC4B TIOC4C TIOC4D | INPUT/OUTPUT | MTU INPUT CAPTURE/OUTPUT COMPARE (CHANNEL 4) | THEY ARE INPUT CAPTURE INPUT/OUTPUT COMPARE OUTPUT/PWM OUTPUT TERMINALS OF CHANNEL 4 |
| DIRECT MEMORY ACCESS CONTROLLER (DMAC) | DREQ0 DREQ1 | INPUT | DMA TRANSFER REQUESTS (CHANNELS 0, 1) | THEY ARE INPUT TERMINALS FOR DMA TRANSFER REQUESTS FROM OUTSIDE |
| | DRAK0 DRAK1 | OUTPUT | DREQ REQUEST ACCEPTANCE (CHANNELS 0, 1) | THEY OUTPUT SAMPLING ACCEPTANCE OF INPUTS FOR DMA TRANSFER REQUESTS FROM OUTSIDE |
| | DACK0 DACK1 | OUTPUT | DMA TRANSFER STROBE (CHANNELS 0, 1) | THEY OUTPUT STROBE FOR EXTERNAL DMA TRANSFER REQUESTS TO EXTERNAL I/O |

FIG. 18

| CATEGORY | SYMBOL | INPUT/OUTPUT | DESIGNATION | FUNCTION |
|---|---|---|---|---|
| SERIAL COMMUNI-CATION INTERFACE (SCI) | TXD0 TXD1 | OUTPUT | TRANSMIT DATA (CHANNELS 0 AND 1) | THEY ARE TRANSMIT DATA OUTPUT TERMINALS FOR SCI0 AND CEI1 |
| | RXD0 RXD1 | INPUT | RECEIVE DATA (CHANNELS 0 AND 1) | THEY ARE RECEIVE DATA INPUT TERMINALS FOR SCI0 AND CEI1 |
| | SCK0 SCK1 | INPUT/OUTPUT | SERIAL CLOCK (CHANNELS 0 AND 1) | THEY ARE CLOCK INPUT/OUTPUT TERMINALS FOR SCI0 AND CEI1 |
| A/D CONVERTER | AVCC | INPUT | ANALOG POWER SUPPLY | CONNECTS POTENTIAL OF VCC WHICH IS ANALOG POWER SUPPLY |
| | AVSS | INPUT | ANALOG GROUND | CONNECTS POTENTIAL OF VSS WHICH IS ANALOG POWER SUPPLY |
| | AVref (ONLY 144 PIN) | INPUT | ANALOG REFERENCE POWER SUPPLY | THIS IS ANALOG REFERENCE POWER SUPPLY INPUT TERMINAL |
| | AN0~AN7 | INPUT | ANALOG INPUT | THEY ARE ANALOG SIGNAL INPUT TERMINALS |
| | $\overline{ADTRG}$ | INPUT | A/D CONVERSION TRIGGER INPUT | THIS IS A/D-CONVERSION STARTING EXTERNAL TRIGGER INPUT |
| I/O PORT | $\overline{POE0}$~$\overline{POE3}$ | INPUT | PORT OUTPUT ENABLE | THEY ARE INPUT TERMINALS FOR PERFORMING DRIVE CONTROL ON PORT TERMINALS UPON OUTPUT SETTING OF GENERAL-PURPOSE PORTS |
| | PA0~PA15 (112 PIN) PA0~PA23 (144 PIN) | INPUT/OUTPUT | GENERAL-PURPOSE PORTS | THEY ARE GENERAL-PURPOSE INPUT/OUTPUT PORT TERMINALS THEY CAN DESIGNATE INPUT/OUTPUT EVER ONE BITS |
| | PB0~PB9 | INPUT/OUTPUT | GENERAL-PURPOSE PORTS | THEY ARE GENERAL-PURPOSE INPUT/OUTPUT PORT TERMINALS THEY CAN DESIGNATE INPUT/OUTPUT EVER ONE BITS |
| | PC0~PC15 | INPUT/OUTPUT | GENERAL-PURPOSE PORTS | THEY ARE GENERAL-PURPOSE INPUT/OUTPUT PORT TERMINALS THEY CAN DESIGNATE INPUT/OUTPUT EVER ONE BITS |
| | PD0~PD15 (112 PIN) PD0~PD31 (144 PIN) | INPUT/OUTPUT | GENERAL-PURPOSE PORTS | THEY ARE GENERAL-PURPOSE INPUT/OUTPUT PORT TERMINALS THEY CAN DESIGNATE INPUT/OUTPUT EVER ONE BITS |
| | PE0~PE15 | INPUT/OUTPUT | GENERAL-PURPOSE PORTS | THEY ARE GENERAL-PURPOSE INPUT/OUTPUT PORT TERMINALS THEY CAN DESIGNATE INPUT/OUTPUT EVER ONE BITS |
| | PF0~PF7 | INPUT | GENERAL-PURPOSE PORTS | THEY ARE GENERAL-PURPOSE INPUT PORT TERMINALS |

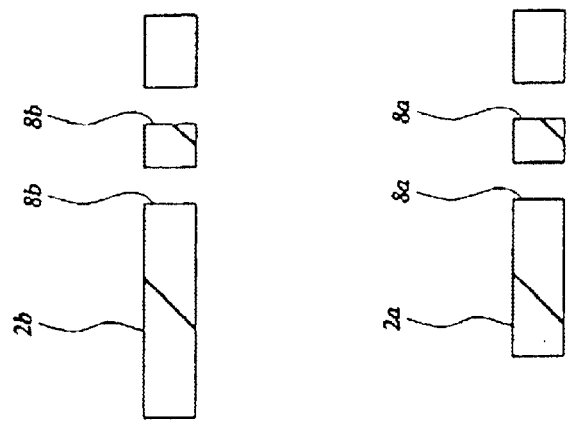
FIG. 29
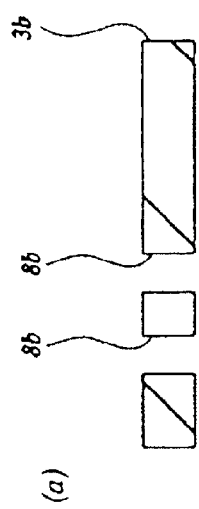
(a)
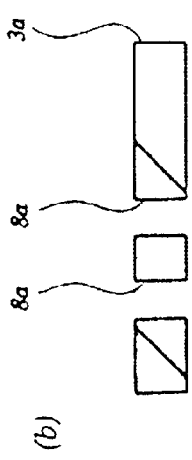
(b)

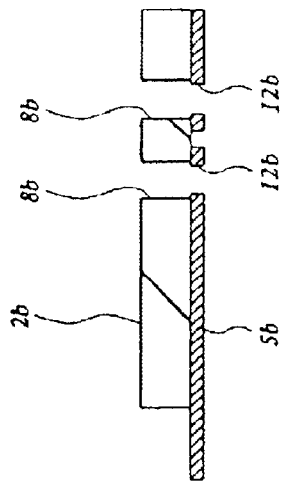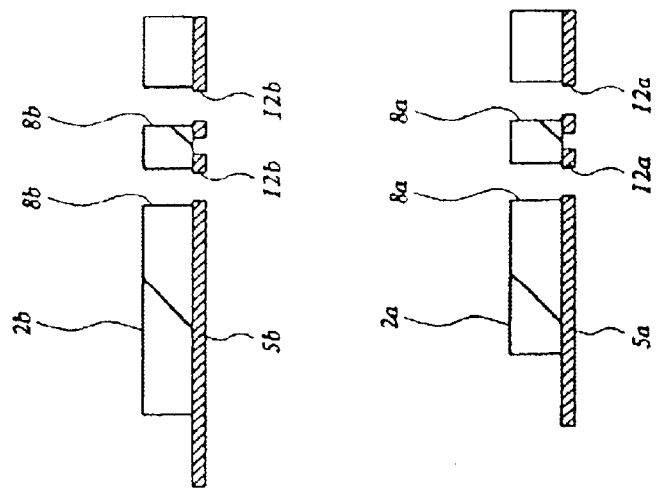
FIG. 30
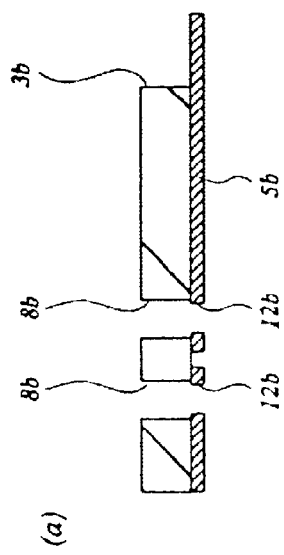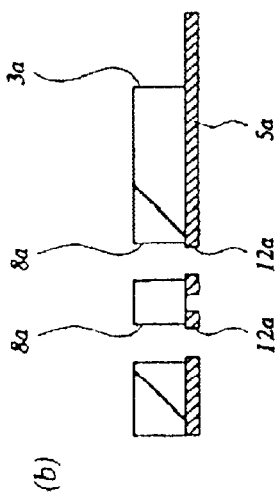

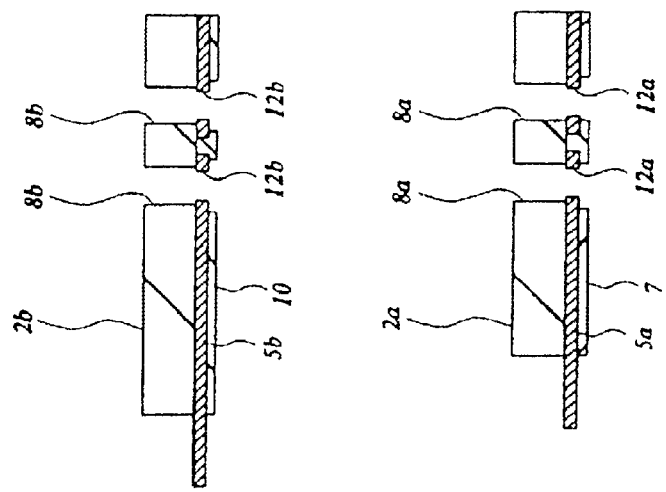
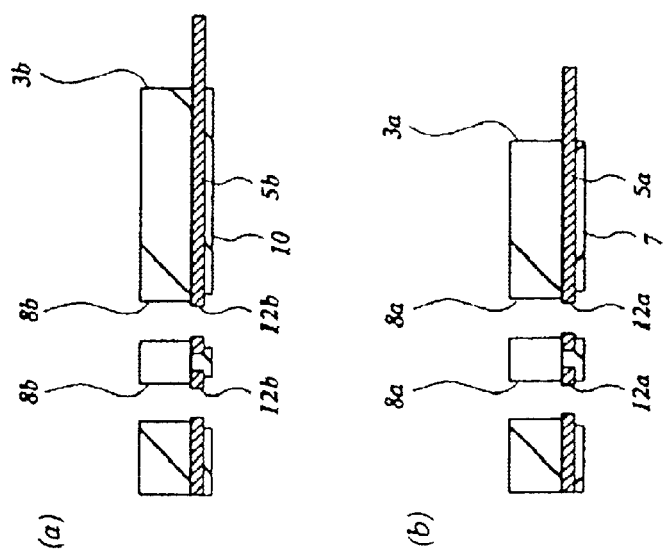
FIG. 31

FIG. 48
(a) 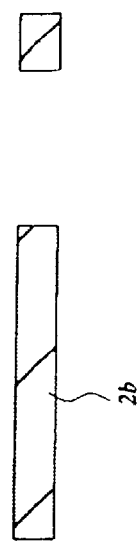 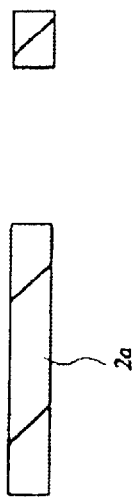
(b) 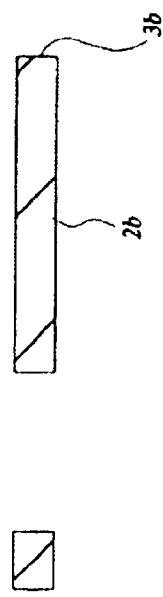 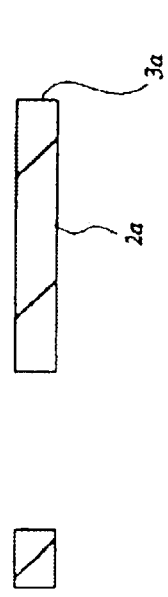

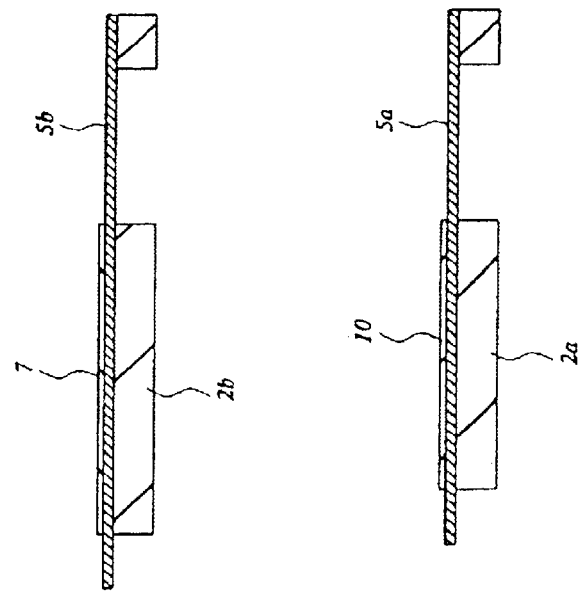
FIG. 49
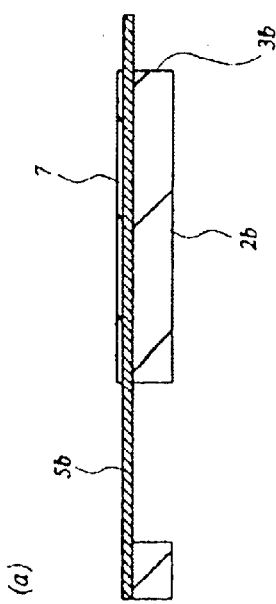
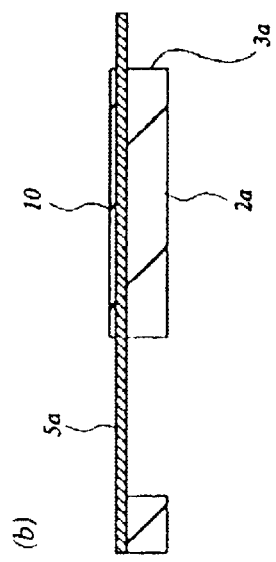

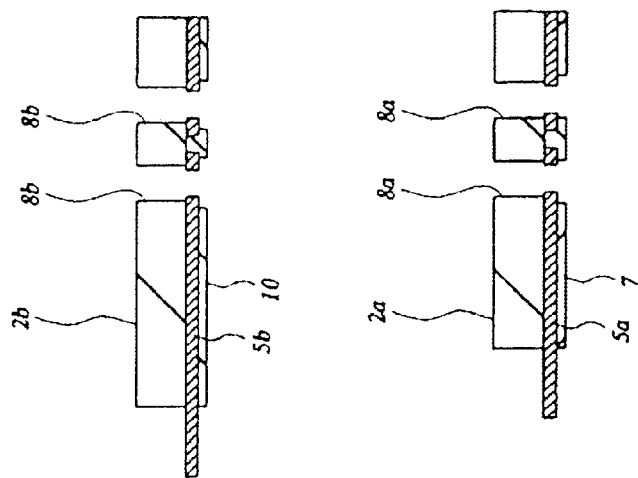
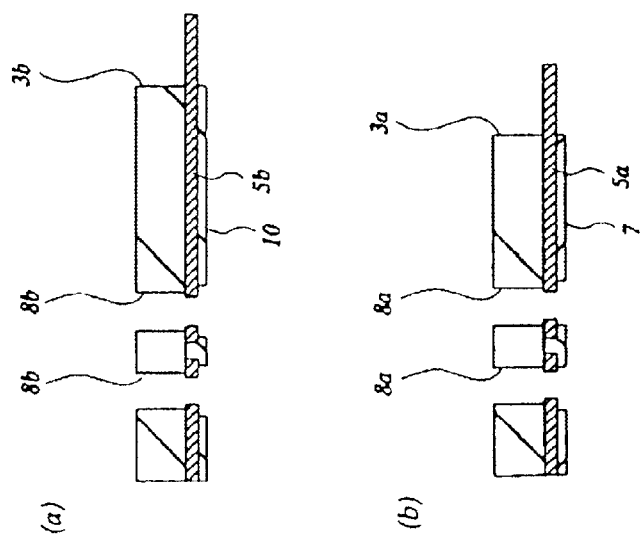
FIG. 61

METHOD OF MANUFACTURING A SEMICONDUCTOR DEVICE HAVING PLURAL SEMICONDUCTOR CHIPS, WHEREIN ELECTRODES OF THE SEMICONDUCTOR CHIPS ARE ELECTRICALLY CONNECTED TOGETHER VIA WIRING SUBSTRATES OF THE SEMICONDUCTOR CHIPS

This is a continuation application of U.S. Ser. No. 10/050,950, filed Jan. 22, 2002, which is now U.S. Pat. No. 6,611,012; which is a continuation application of U.S. Ser. No. 09/984,089, filed on Oct. 26, 2001, now U.S. Pat. No. 6,492,719, which is a continuation application of U.S. Ser. No. 09/319,044, filed Jul. 30, 1999, now U.S. Pat. 6,335,565; which is a 371 of PCT/JP96/03549, filed Dec. 4, 1996. This application is related to U.S. Ser. No. 10/050,951, filed Jan. 22, 2002.

TECHNICAL FIELD

The present invention relates to a semiconductor device wherein a plurality of types of semiconductor chips are held in a single package from an MCM (Multi Chip Module)-based approach so that signals can be inputted thereto and outputted therefrom with respect to each other, and particularly to a technique effective for application to a semiconductor device wherein a microcomputer including a CPU (Central Processing Unit), a programmable non-volatile memory such as a flash memory or the like, a DRAM (Dynamic Random Access Memory), and a logic LSI such as an ASIC (Application Specific Integrated Circuit) or the like are brought into one package.

BACKGROUND ART

The present inventors have discussed a technique wherein in a semiconductor device about a system on-chip, a plurality of types of semiconductor chips are accommodated or held in a single package so as to be able to input signals thereto and output the same therefrom with respect to each other from an MCM-based approach without bringing all of a microcomputer, a flash memory, a DRAM, an ASIC, etc. into one chip upon implementation of an approach to a DRMA/SIMM (Single In-line memory Module) having the high needs of users and a flash memory/DRAM-based microcomputer on-chip. The following is the corresponding technique discussed by the present inventors. Its summary is as follows:

A move attempt to form a microcomputer, a flash memory, a DRAM, an ASIC, etc. on one chip thereby to achieve the speeding up of a data transfer rate, space saving (improvements in packing density), low power consumption, etc. has recently been made active in front end technology such as a multimedia, information communications, etc. However, the formation of such many kinds of LSIs on one chip will cause an extreme increase in the load on a semiconductor manufacturing process.

This reason will be described below based on a process for placing or forming the microcomputer, flash memory, DRAM and ASIC in mixed form, which has been discussed by the present inventors. A summary of the mixed-loading process is as follows:

A p-type impurity (boron) is ion-implanted in a principal surface of a semiconductor substrate 100 to form a p well 101 as shown in FIG. 78. Thereafter, a field oxide film 102 is formed over the surface of the p well 101 by a LOCOS method. An element or device formed at the left end in the drawing is a MOSFET which constitutes each memory cell of a DRAM, devices formed at a position adjacent to the right side are a MOSFET which constitutes each memory cell of a flash memory and a MOSFET for a high voltage, which constitutes part of a peripheral circuit of the flash memory. A device formed at the right end is a MOSFET which constitutes a logic LSI such as a microcomputer, an ASIC or the like. Incidentally, an actual LSI is comprised principally of an n channel MOSFET and a p channel MOSFET. However, only a region for forming the n channel MOSFET will be illustrated to simplify its description.

Next, a tunnel oxide film 103 for the flash memory is formed as shown in FIG. 79. The thickness of the tunnel oxide film 103 is set so as to range from about 8 nm to 13 nm.

Next, as shown in FIG. 80, a polycrystal silicon film deposited on the semiconductor substrate 100 by CVD is subjected to patterning to form a floating gate 104 (part thereof) for the flash memory. Thereafter, a silicon oxide film, a silicon nitride film and a silicon oxide film are layered over the floating gate 104 as shown in FIG. 81 thereby to form a second insulating film (ONO film) 105 whose thickness ranges from about 10 nm to 30 nm.

Next, a gate oxide film 106 for the MOSFET which withstands a high voltage, is formed in a peripheral circuit region of the flash memory as shown in FIG. 82. The gate oxide film 106 is formed to a thickness (which ranges from 10 nm to 30 nm) thicker than the thicknesses of gate oxide films for other MOSFETs.

Next, a gate oxide film 107 for the MOSFET which constitutes the logic LSI, and a gate oxide film 130 for the MOSFET which constitutes each memory cell for DRAM, are formed as shown in FIG. 83. The thickness of the gate oxide film 107 is set so as to range from about 4 nm to 10 nm, whereas the thickness of the gate oxide film 130 is set so as to range from about 8 nm to 15 nm.

Next, as shown in FIG. 84, the polycrystal silicon film deposited over the semiconductor substrate 100 by CVD is subjected to patterning thereby to simultaneously form gate electrodes (word lines) for each individual memory cells of the DRAM, a control gate 109 for the flash memory, a gate electrode 110 for the high-withstand MOSFET, a gate electrode 111 for the MOSFET which constitutes the logic LSI. Thereafter, the (partly-formed) floating gate 104 for the flash memory is subjected to patterning to form a floating gate 104 as shown in FIG. 85.

Next, n-type impurities (phosphorus and arsenic) are ion-implanted in part of a memory cell region of the flash memory as shown in FIG. 86 to form an $n^+$-type semiconductor region 112 for the flash memory. Thereafter, the n-type impurities (phosphorus and arsenic) are ion-implanted in part of the memory cell region of the flash memory, the peripheral circuit region thereof and a logic LSI forming region as shown in FIG. 87 thereby to simultaneously form $n^-$-type semiconductor regions 113 and 113 for the flash memory, $n^-$-type semiconductor regions 113 and 113 for the high-withstand MOSFET, and $n^-$-type semiconductor regions 113 and 113 for the MOSFET which constitutes the logic LSI.

Next, as shown in FIG. 88, side wall spacers 114 are respectively formed over the side walls of the gate electrodes (word lines) 108 for each individual memory cells of DRAM, the control gate 109 for the flash memory, the gate electrode 110 for the MOSFET for a high voltage, and the gate electrode 111 for the MOSFET which constitutes the logic LSI.

Next, the n-type impurities (phosphorus and arsenic) are ion-implanted in part of the memory cell region of the flash memory, the peripheral circuit region and the logic LSI forming region as shown in FIG. 89 to simultaneously form an n$^+$-type semiconductor region 115 for the flash memory, n$^+$-type semiconductor regions 115 and 115 for the high-withstand MOSFET, and n$^+$-type semiconductor regions 115 and 115 for the MOSFET which constitutes the logic LSI, whereby one of a source region and a drain region for the flash memory, a source region and a drain region for the high-withstand MOSFET, and a source region and a drain region for the MOSFET constituting the logic LSI are brought to an LDD (Lightly Doped Drain) structure.

Next, as shown in FIG. 90, a silicon oxide film 116 deposited over the semiconductor substrate 100 by CVD is etched to define connecting holes on both sides of the gate electrodes (word lines) of the DRAM and define a connecting hole in an upper portion of the n$^+$-type semiconductor region 112 for the flash memory. Thereafter, plugs 117 each composed of a polycrystal silicon film are formed inside these connecting holes. On both sides of the gate electrodes of the DRAM, n-type semiconductor regions 118 are formed by impurities diffused from the polycrystal silicon film. Thereafter, the polycrystal silicon film deposited over the silicon oxide film 116 by CVD is subjected to patterning to form each bit line BL for the DRAM and each bit line BL for the flash memory.

Next, a silicon oxide film 119 is deposited over the semiconductor substrate 100 by CVD as shown in FIG. 91. Thereafter, a polycrystal silicon film deposited over the silicon oxide film 119 is subjected to patterning to form lower electrodes 120 of capacitors for the DRAM.

A tantalum oxide film (or nitride silicon film) and the polycrystal silicon film deposited over the semiconductor substrate 100 are patterned to form an capacitive insulating film 121 and an upper electrode 122 of each capacitor for the DRAM as shown in FIG. 92. Thereafter, a silicon oxide film 123 is deposited over the semiconductor substrate 100 by CVD as shown in FIG. 93. An Al film deposited over the silicon oxide film 123 is subjected to patterning to form metal wires or interconnections 124 as a first layer. Afterwards, a silicon oxide film 125 is deposited over the semiconductor substrate 100 by CVD as shown in FIG. 94. Thereafter, an Al film deposited over the silicon oxide film 125 is subjected to patterning to form metal interconnections 126 as a second layer.

The above description is the summary of the process for forming the microcomputer, flash memory, DRAM and ASIC in mixed form.

According to the discussions of the present inventors, the above-described process has the following problems.

(1) The attainment of the speeding up of a logic unit needs to shorten a gate length of each MOSFET and thin the thickness of a gate oxide film. On the other hand, it is necessary to make the thickness of a gate oxide film of each MOSFET for a DRAM thicker than that of a gate oxide film of each MOSFET for the logic unit to some extent in consideration of a withstand voltage or high voltage. Further, a gate oxide film of each high-withstand MOSFET for a flash memory to which a high voltage is applied, needs to have a thicker thickness in order to ensure a sufficient withstand voltage. That is, when the DRAM, logic and flash memory are placed in mixed form, it is necessary to provide gate oxide films having thicknesses which vary according to required power levels. Therefore, the number of process steps and the number of masks increase by a large amount.

(2) When a DRAM is comprised of one transistor+one capacitor, a high-temperature heat treatment (corresponding to heat treatment for stabilizing the tantalum oxide film or high-temperature nitriding treatment) is taken upon formation of the capacitor. It is therefore necessary to set the gate length at the logic unit longer more or less However, when the gate length at the logic unit is made longer, the speeding up of the logic unit will fall a sacrifice.

(3) Since the height of the DRAM on the semiconductor chip is higher than the logic unit and there is a step-like offset between the two, this exerts a bad influence on wiring formation. This tendency becomes pronounced in the case of a DRAM which adopts a stacked capacitor (Stacked Capacitor) structure in particular.

Thus, when one attempts to achieve one chip while the respective performance of the DRAM, logic, and flash memory are being maintained together, the number of process steps and the number of masks greatly increase. Alternatively, a mixed-loading process suitable for the achievement of one chip must be developed again. Even in either case, the manufacturing cost greatly increases.

There is also a strong demand for the loading of both a flash memory and a DRAM into a microcomputer system including a CPU even from a circuital standpoint based on a functional block configuration in addition to the above-described manufacturing process-based cost analysis. When the packageability to a built-in apparatus is taken into consideration, the integration of the two types of semiconductor chips comprised of the flash memory and DRAM into one package is indispensable. Therefore, the present inventors have thought that a decrease in the number of external connecting terminals and a reduction in the packing area due to the integration of a plurality of types of semiconductor chips into one package could be achieved by assigning signals used in common to the mutual semiconductor chips to common external connecting terminals respectively, and the costdown to the microcomputer system could be achieved even from the circuital standpoint.

An object of the present invention is to provide a semiconductor device wherein in a package structure of a type wherein two types of semiconductor chips corresponding to a CPU and a flash memory, and a DRAM are integrated or combined into one package, a decrease in the number of external connecting terminals and a reduction in the packing area due to the integration of the two types of semiconductor chips into one package can be achieved even from a circuital standpoint based on a functional block configuration, and the costdown to a microcomputer system can be achieved.

Another object of the present invention is to provide a semiconductor device wherein when a DRAM is set as a synchronous DRAM where a logic circuit such as an ASIC or the like is incorporated into respective semiconductor chips, external connecting terminals can be further made common, thereby making it possible to provide a much further reduction in the number of external connecting terminals and achieve the costdown thereto.

A further object of the present invention is to provide the above-described semiconductor device at low cost.

When two types of semiconductor chips corresponding to a so-called flash memory-equipped microcomputer, which is equipped with a CPU and a flash memory, for example, and a semiconductor chip referred to as so-called DRAM on-chip logic, which is equipped with a DRAM and a logic circuit such as an ASIC or the like are considered in the above-described microcomputer system, it is essential that countermeasures against the operation between the flash memory-equipped microcomputer and the DRAM on-chip logic should be taken. In other words, it is necessary to take countermeasures against data transfer rates with respect to an access operation to the DRAM of the DRAM on-chip logic from the flash memory-equipped microcomputer and an access operation to the DRAM from the logic circuit inside the DRAM on-chip logic.

When it is desired to connect between the semiconductor chips respectively corresponding to the aforementioned flash memory-equipped microcomputer and DRAM on-chip logic at high speed, for example, they can be connected to each other at high speed by using an interface directly coupled to the DRAM. However, if the logic circuit of the DRAM on-chip logic desires to access the DRAM, then there is known, as a first method, a method of sending a wait signal back to the CPU when the logic circuit is in operation. Since the present method must use an asynchronous memory as a memory to be handled between the flash memory-equipped microcomputer and the DRAM on-chip logic, the transfer of data in one clock cycle cannot be performed, i.e., the transfer of data in two-clock cycle is performed because the time required to read or recognize the wait signal cannot be taken or spent.

As a second method capable of implementing one clock cycle, may be mentioned a method of allowing the flash memory-equipped microcomputer to perform bus arbitration in the on-chip logic itself. According to this method, since the logic circuit of the DRAM on-chip logic outputs a request signal for making a request to the CPU for a bus release and the CPU cannot do anything during a period in which a bus is set free to the logic circuit, the present method will cause a malfunction or inconvenience that overheads of the arbitration increase and the CPU itself cannot perform time-based control.

Therefore, the present inventors have focused attention on the fact that the time may preferably be controlled by the CPU itself of the flash memory-equipped microcomputer. The present inventors thought from such attention that a self-refresh period of the DRAM as viewed from the flash memory-equipped microcomputer was effectively used to thereby allow a self-refresh operation of the DRAM, and an access operation to the DRAM from the logic circuit lying inside the DRMA on-chip logic was made possible during this self-refresh period, whereby the transfer of data between the flash memory-equipped microcomputer and the DRAM on-chip logic could be achieved at high speed.

One object of the present invention is to provide a semiconductor device wherein in semiconductor chips each equipped with a DRAM and a logic circuit such as an ASIC or the like, the need for wait control is eliminated and a self-refresh period of the DRAM as viewed from the outside is effectively used to thereby allow an access operation to the DRAM from the logic circuit during this self-refresh period, whereby the speeding up of the transfer of data between the outside and each semiconductor chip can be implemented.

The present invention also provides a semiconductor device wherein even in the case of a package structure in which two types of chips corresponding to a semiconductor chip equipped with a DRAM and a logic circuit and a semiconductor chip equipped with a CPU and a flash memory are combined into one package, wait control is made unnecessary and an access operation to the DRAM from the logic circuit is made possible during a self-refresh period of the DRAM as viewed from the CPU, whereby the speeding up of the transfer of data between the semiconductor chips can be implemented.

Further, the present invention provides a semiconductor device capable of facilitating the creation of programs since wait control used to perform wait-signal exchanges becomes unnecessary and timing itself provided for processing can be controlled from a CPU.

Moreover, the present invention provides a semiconductor device wherein the use of a general-purpose DRAM interface makes it possible to directly connect a semiconductor chip equipped with a DRAM and a logic circuit and a semiconductor chip equipped with a CPU and a flash memory to one another so that they are operable at high speed.

The above and other objects of the present invention and novel features thereof will become apparent from the following description of the present specification and the accompanying drawings.

DISCLOSURE OF THE INVENTION

Summaries of typical ones of the inventions disclosed in the present application will be described in brief as follows:

That is, the present invention provides one semiconductor device comprising a stacked package in which a plurality of tape carriers which seal a plurality of semiconductor chips, are stacked on one another in upward and downward directions, and wherein connecting terminals shared between the plurality of semiconductor chips are drawn to the same external connecting terminals of the stacked package through conductive layers formed in the tape carriers.

The present invention provides another semiconductor device wherein one ends of leads formed over the whole surface of each tape carrier referred to above are respectively electrically connected to connecting terminals of each semiconductor chip referred to above, the other ends of the leads are respectively electrically connected to through holes defined in each tape carrier, and the connecting terminals common to the plurality of semiconductor chips are formed at the same positions of the plurality of tape carriers and withdrawn to the same external connecting terminals via a plurality of mutually-penetrated through holes.

The present invention provides a further semiconductor device wherein the external connecting terminals are solder bumps formed at one ends of the through holes of the tape carrier corresponding to the lowest layer.

The present invention provides a still further semiconductor device wherein the external connecting terminals are formed over the whole surface of the tape carrier corresponding to the lowest layer and one ends thereof are leads which protrude to the outside of the tape carrier.

The present invention provides a still further semiconductor device wherein the external connecting terminals include some used as conductive pins, which are inserted into the through holes and others used as conductive pins, which protrude to the outside of the tape carrier.

The present invention provides a still further semiconductor device wherein one ends of the leads formed over the whole surface of each tape carrier referred to above are electrically connected to the connecting terminals of each semiconductor chip referred to above and the other ends of the leads protrude to the outside of each tape carrier so as to form the external connecting terminals, and a plurality of leads withdrawn from the connecting terminals common to the plurality of semiconductor chips are superimposed on one another in the outside of each tape carrier to thereby form common external connecting terminals.

The present invention provides a still further semiconductor device wherein one ends of the leads formed over the whole surface of each tape carrier referred to above are electrically connected to the connecting terminals of each semiconductor chip referred to above and the other ends of the leads protrude to the outside of each tape carrier so as to form the external connecting terminals, and a plurality of leads withdrawn from the connecting terminals common to the plurality of semiconductor chips are joined onto common electrodes of a mounting substrate.

The above and other objects of the present invention and novel features thereof will become apparent from the following description of the present specification and the accompanying drawings.

BRIEF DESCRIPTION OF THE DRAWINGS

FIGS. 7 through 14 are respectively functional block diagrams showing examples of internal configurations of semiconductor chips constituting the semiconductor device according to the embodiment of the present invention and are explanatory diagrams illustrating examples of terminal functions thereof;

FIGS. 15 through 18 are explanatory diagram depicting tables indicative of examples of terminal functions of each semiconductor chip;

FIGS. 29 through 37 are respectively cross-sectional views illustrating a method of manufacturing a semiconductor device according to an embodiment of the present invention;

FIGS. 38 through 66 are respectively cross-sectional views depicting another method of manufacturing the semiconductor device;

BEST MODE FOR CARRYING OUT THE INVENTION

Figure 1:
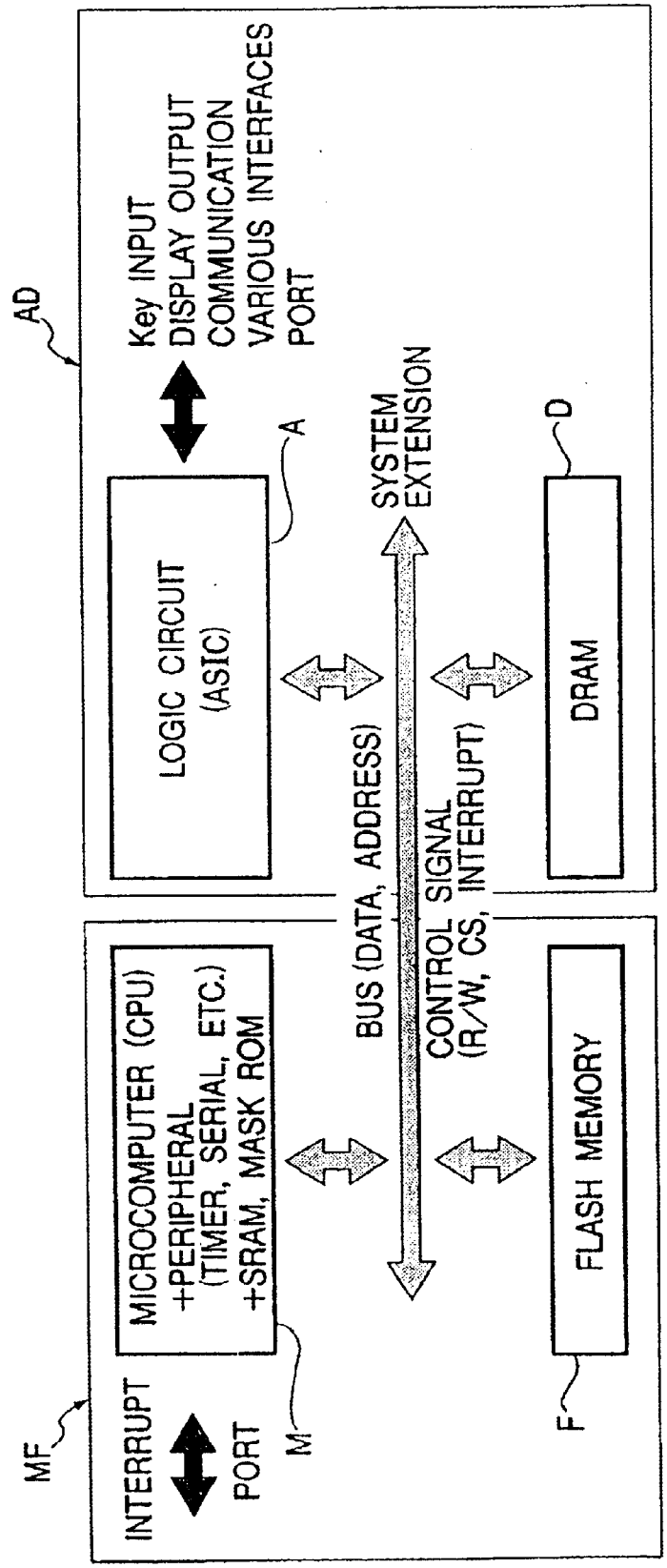
FIGS. 1 through 6 are respectively schematic block diagrams showing examples of configurations of a semiconductor device according to an embodiment of the present invention.

Preferred embodiments of the present invention will hereinafter be described in detail with reference to the accompanying drawings. Parts or components having the same functions in all the drawings for describing the embodiments are identified by the same reference numerals and their repetitive description will be omitted.

An example of a configuration of a semiconductor device according to the present embodiment will first be explained with reference to FIGS. 1 through 6.

The semiconductor device according to the present embodiment is an LSI package having a stacked or multi-layered structure in which a plurality of types of semiconductor chips are connected to one another so that signals can be inputted to and outputted therefrom. As shown in FIG. 1 as one example of its configuration, the semiconductor device comprises a chip MF (first semiconductor chip) referred to as a so-called flash memory-mounted microcomputer, which is equipped with a microcomputer M including a CPU, a memory and peripheral circuits, etc. and a flash memory F, and a chip AD (second semiconductor chip) referred to as so-called DRAM on-chip logic, which is equipped with a DRM D and a logic circuit A such as ASIC or the like. Connecting terminals of the respective chips MF and AD are electrically connected to one another through a bus inside the package and electrically connected to external connecting terminals allowing connections with the outside.

Now, the flash memory F is a programmable non-volatile memory corresponding to one LSI memory. This flash memory is a memory for performing writing or erasing according to the application of a high voltage to each memory cell. The DRAM D is a memory corresponding to one LSI memory, which has the necessity for supplying a control (refresh) signal for reproduction of repetitive data with a view toward holding the contents of data. Further, the ASIC is an IC designed for special purposes or a dedicated IC. This is an LSI developed and sold for special devices, which is different from a general-purpose LSI sold on the general market as in the case of a large-capacity memory LSI and a microprocessor LSI.

Figure 2:
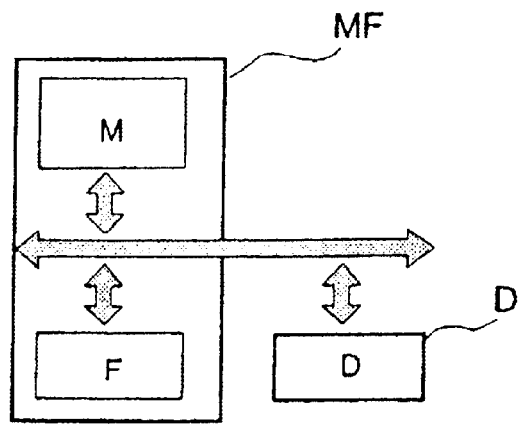

As shown in FIG. 2 as another example of configuration, the semiconductor device comprises a chip MF (first semiconductor chip) equipped with a microcomputer M including a CPU, a memory and peripheral circuits or the like and a flash memory F, and a chip D (second semiconductor chip) equipped with a DRAM D alone. The present example takes a configuration in which the logic circuit A such as ASIC or the like is eliminated from the second semiconductor chip in the configured example shown in FIG. 1.

Figure 3:
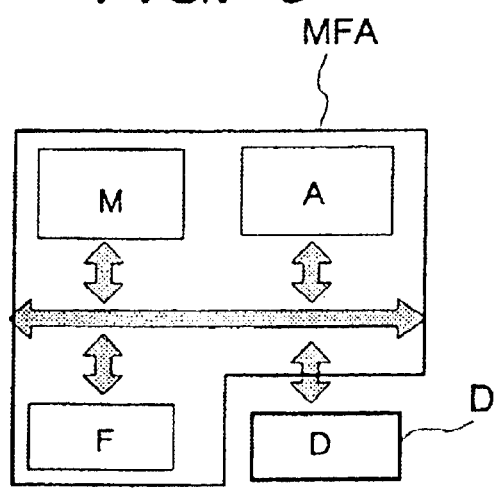

Further, as shown in FIG. 3 as a further example of configuration, the present semiconductor device comprises a chip MFA (first semiconductor chip) referred to as a so-called flash memory-mounted on-chip logic microcomputer, which is equipped with a microcomputer M including a CPU, a memory and peripheral circuits or the like, a flash memory F and a logic circuit A, and a chip D (second semiconductor chip) equipped with a DRAM D alone. The present example takes a configuration in which the first semiconductor chip in the configured example shown in FIG. 2 is equipped with the logic circuit A such as ASIC or the like.

Figure 4:
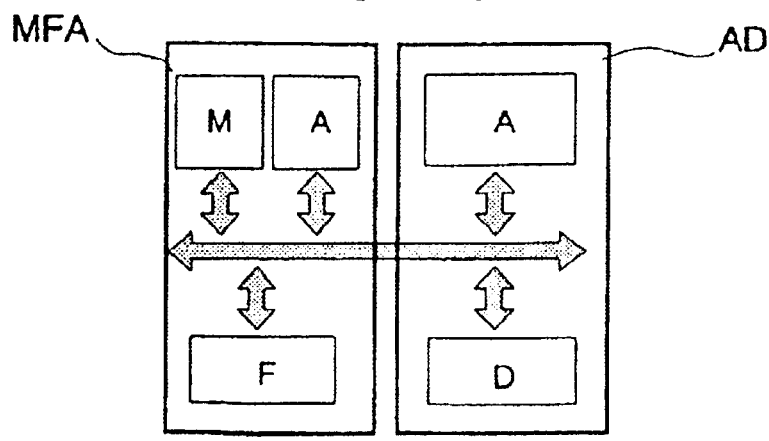
Figure 5:
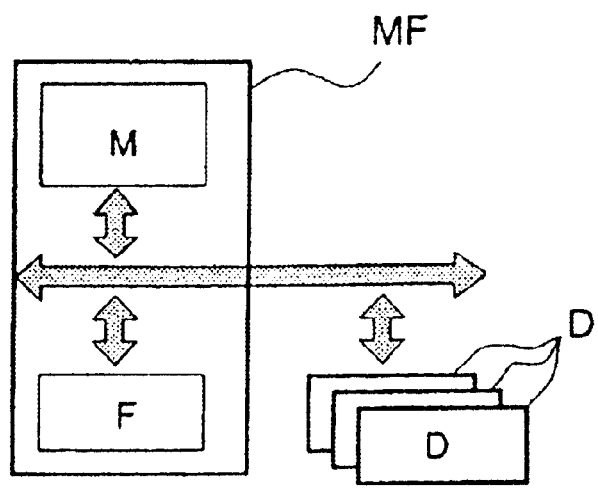
Figure 6:
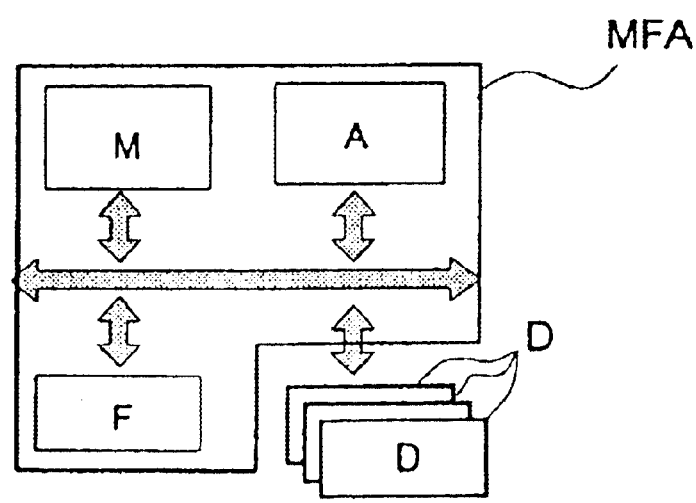

In addition to the above, the present semiconductor device can take various configurations as in the cases where, for example, it comprises a chip MFA and a chip AD as shown in FIG. 4 as a modification of FIG. 1 by way of example in addition to the above, it comprises one chip MF and a plurality of chips D as shown in FIG. 5 as a modification of FIG. 2, and it comprises a chip MFA and a plurality of chips D as shown in FIG. 6 as a modification of FIG. 3.

In the above-described configured examples of the semiconductor device, which respectively comprise combinations of the chip MF+the chip AD, the chip MF+the chip D, the chip MF+the chip D, the chip MFA+the chip AD, the chip MF+the chip D (expansion) and the chip MFA+the chip D (expansion), the microcomputers M, flash memories F, DRAMs D, logic circuits A, etc. contained in the respective chips comprise similar functional blocks even if the chips are different from one another in configuration.

The chips AD and D are easy to be directly connected to the chips MF and MFA owing to general-purpose DRAM interface specifications. DRAMs D are used as expansion memories in their corresponding semiconductor devices. Further, the logic circuit A such as ASIC of the chip AD is capable of performing access control over DRAM D inside the chip AD independent of access control by CPU of the chip MFA.

Summaries of the respective semiconductor chips will now be explained with reference to FIGS. 7 through 14. In particular, the chip MF, the chip AD and the chip D will be described in order. FIGS. 15 through 18 respectively show tables or lists illustrative of examples of terminal functions of the chip MF.

Figure 7:
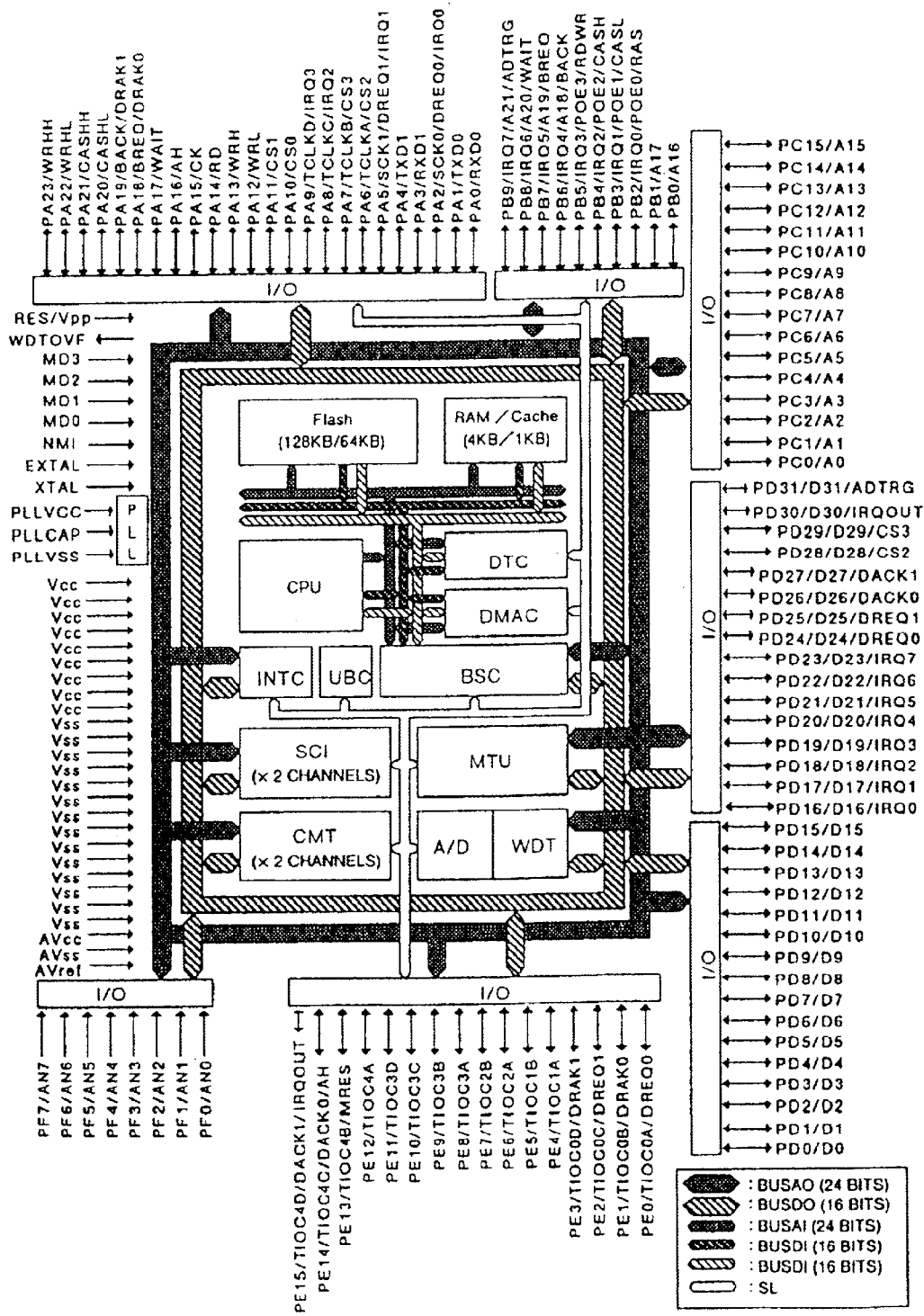
Figure 8:
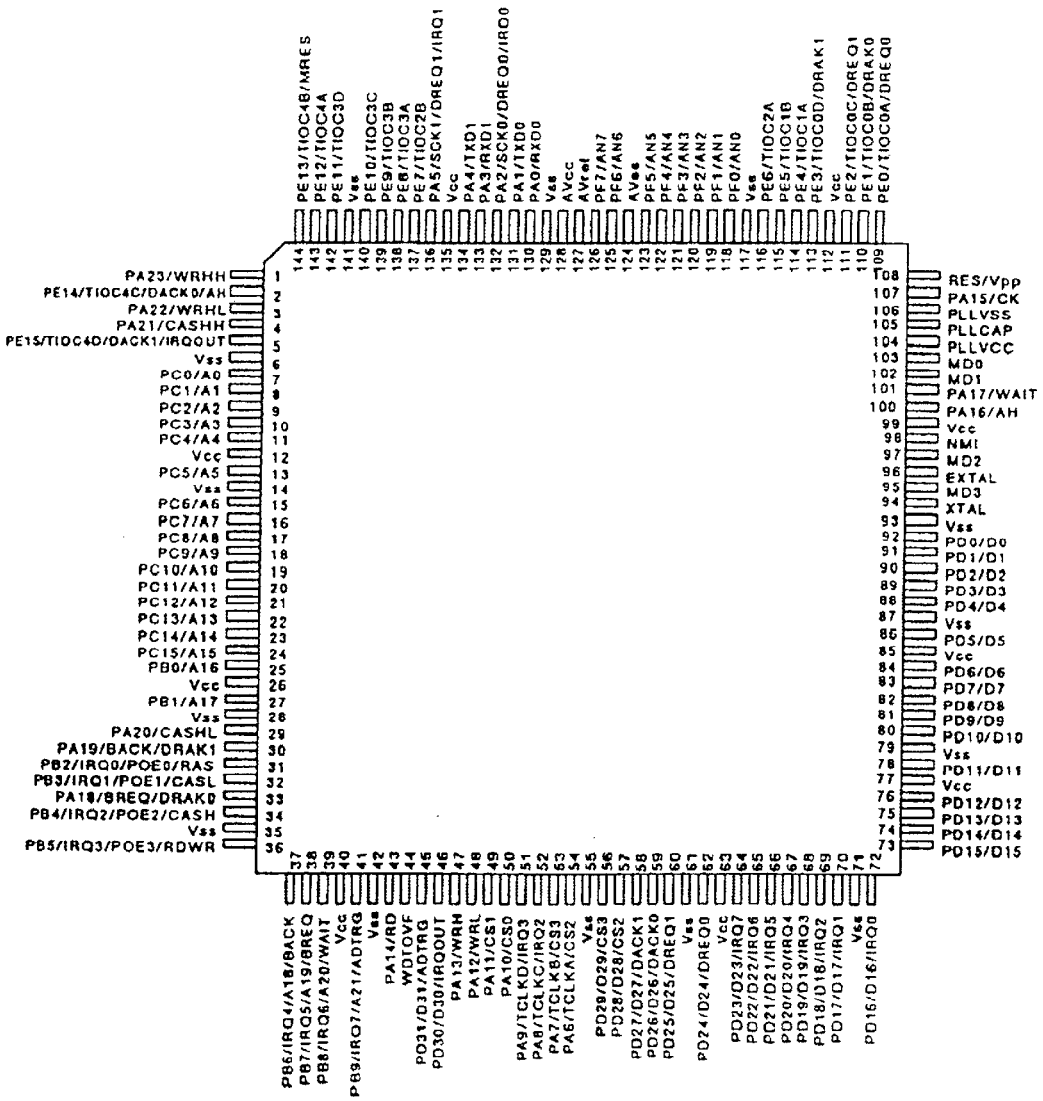
Figure 9:
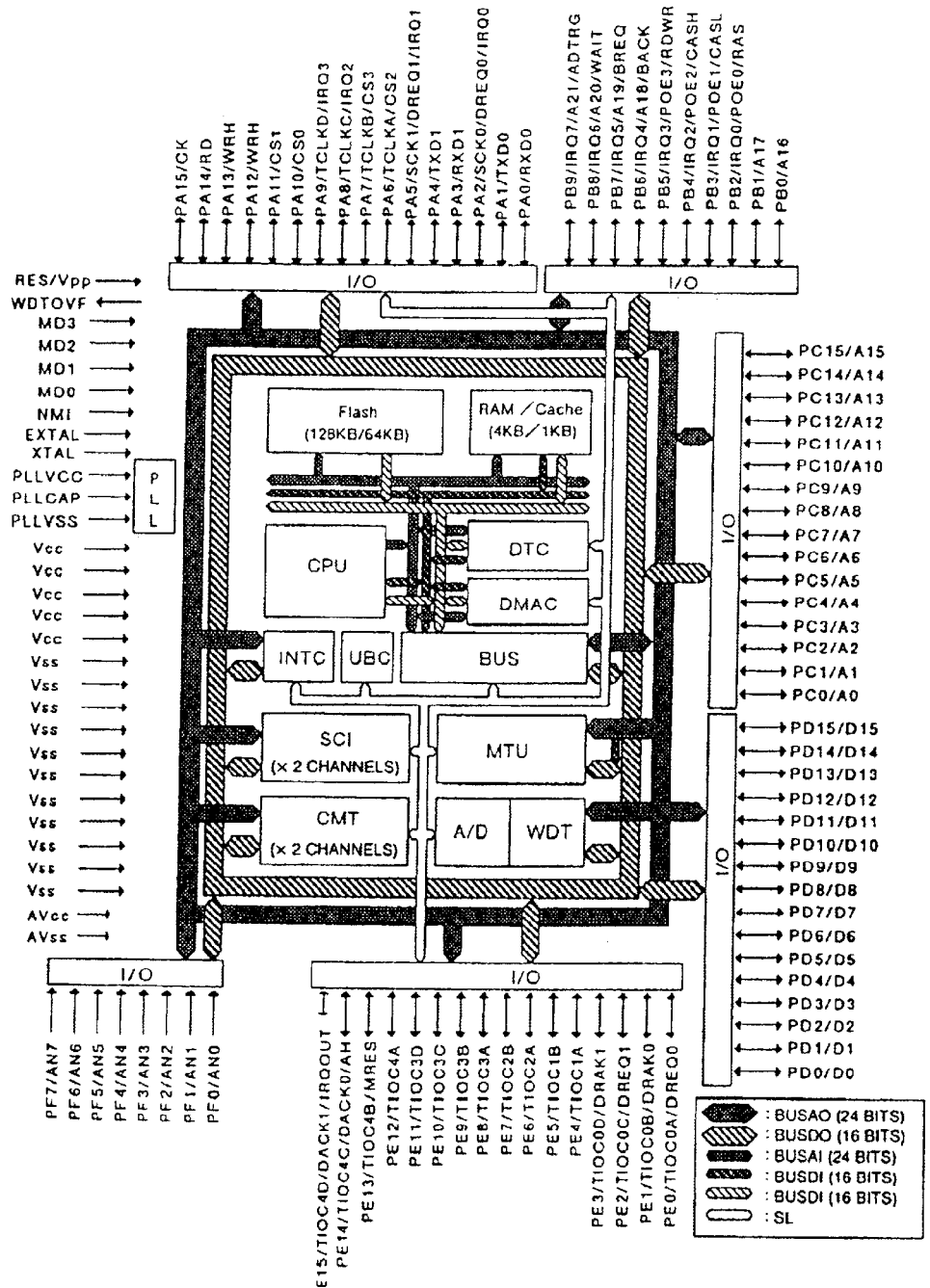
Figure 10:
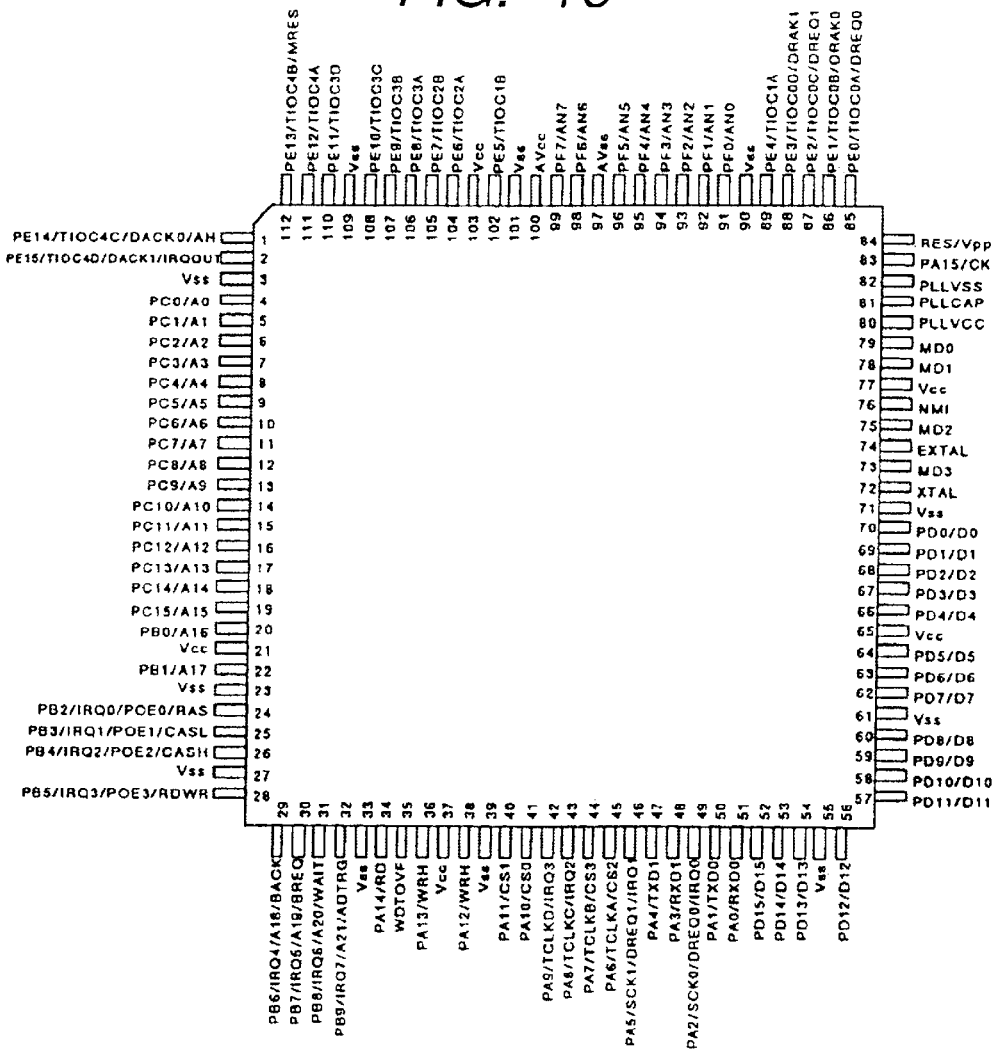

FIGS. 7 and 8 respectively show an example illustrative of 144 pins employed in the chip MF. FIG. 7 is a functional block diagram showing an example of an internal configuration of the chip MF, and FIG. 8 is an explanatory view showing an example illustrative of terminal functions, respectively. FIGS. 9 and 10 respectively show an example illustrative of 112 pins employed in the chip MF. FIG. 9 is a functional block diagram showing an example of an internal configuration of the chip MF, and FIG. 10 is an explanatory view showing an example illustrative of terminal functions, respectively. Incidentally, the chip MF having the 144 pins is different from the chip MF having the 112 pins in that data input/output external terminals are respectively different from one another at D0 through D31 and D0 through D15 in association with 32-bit and 16-bit data widths. The chip MF having the 144 pins will be principally explained here.

The chip MF having the 144 pins takes a circuit configuration formed with at least a microcomputer and a flash memory and having an overall control/processing function of a semiconductor device and an electrically batch or one-time erasable programmable function. As shown in FIG. 7 by way of example, the chip MF comprises a processor CPU, a flash memory Flash, a random access memory/cache memory RAM/Cache, a data transfer controller DTC, a direct memory access controller DMAC, a bus state controller BSC, a user break controller UBC, an interrupt controller INTC, a serial communication interface SCI, a multi-function timer pulse unit MTU, a compare match timer CMT, an A/D converter A/D, a watchdog timer WDT, a phase-locked loop circuit PLL, etc.

The processor CPU is a central processing unit having a RISC type command or instruction set, for example. Since the CPU operates on one-instruction/one-cycle basis, its instruction execution speed is greatly improved. Further, the CPU takes an internal 32-bit configuration and has enhanced data throughput. As CPU's features, the CPU is provided with various functions such as a general-purpose register machine (general-purpose register: 32 bits×16, control register: 32 bits×3 and system register: 32 bits×4), a RISC corresponding instruction set (improvements in code efficiency based on a 16-bit fixed length defined as an instruction length, load store architecture (basic arithmetic operation being executed between registers), a reduction in disturbance of a pipeline at branch-off due to the adoption of a delay branch instruction, a C language-oriented instruction set), an instruction execution time corresponding to one instruction/one cycle (35 ns/instruction upon 28 MHz-based operation), an address space given as 4 GB on the architecture, an execution of 32×32→64 multiplication in 2 to 4 cycles and an execution of 32×32+64→64 sum-of-product arithmetic operation in 2 to 4 cycles with a built-in multiplier, a 5-stage pipeline system, etc.

The flash memory Flash is a circuit having, for example, a 64K-byte or 128K-byte electrically one-time erasable programmable memory incorporated therein. The flash memory Flash is electrically connected to the CPU, DMAC and DTC through a data bus having a 32-bit width, for example. The CPU, DMAC and DTC can access the flash memory Flash with 8, 16 or 32-bit width. Data held in the flash memory Flash can be accessed in one state at all times.

The random access memory/cache memory RAM/Cache is a memory which comprises, for example, a 4 KB random access memory RAM and a 1 KB cache memory Cache. As features of the present Cache, the Cache is provided with various functions that, for example, an instruction code and a PC relative read/data caching are executed, a line length is 4 bytes (one long word: 2 instruction lengths), cache tags are given as 256 entries, a direct map method, a built-in ROM/RAM and a built-in I/O area are not intended for cache and also used for a built-in RAM, 2 KB of the built-in RAM is used for an address array/data array upon cache enabling.

The data transfer controller DTC is a circuit started up by an interruption or software and capable of performing data transfer. As DTC's features, the DTC is provided with various functions that, for example, each data transfer independent of the CPU can be performed according to a peripheral I/O interrupt request, transfer modes can be set every interrupt factors (each transfer mode can be set onto the corresponding memory), a plurality of data transfers can be made to one start-up factor, an abundance of transfer modes (normal mode/repeat mode/block transfer mode) can be selected, a transfer unit can be set to byte/word/long word, an interrupt to start up the DTC is required of the CPU (an interrupt to the CPU can be produced after the completion of one data transfer and an interrupt to the CPU can be generated after the completion of all the designated or specified data transfers), and the start-up of each transfer can be performed by software. With respect to an address space, a transfer-source address and a transfer-destination address can be both specified by 32 bits. With respect to each device intended for transfer, data transfers are effected on a flash memory Flash serving as a built-in memory, a RAM/Cache, an external memory, built-in peripheral circuits, etc.

The direct memory access controller DMAC is a circuit which comprises 4 channels, for example and is capable of performing transfers of data between an external device with a DACK (transfer request reception or acknowledge signal), an external memory, a memory-mapped external device and built-in peripheral circuits (except for DMAC, BSC and UBC) as an alternative to the CPU. The use of the DMAC makes it possible to reduce a load on the CPU and improve the operation efficiency of the chip MF. As features for the DMAC, may be mentioned, the support of a cycle-stealing transfer, the support of a dual address mode transfer and the ability to make switching between direct transfer/indirect transfer modes (channel 3 alone). The direct transfer mode corresponds to the function of transferring data located at the transfer-source address to the transfer-destination address. The indirect transfer mode corresponds to the function of using data placed at the transfer-source address as an address and transferring data at that address to the transfer-destination address. There are also provided a reload function, and transfer request functions based on an external request, a built-in circuit and an auto request in a specific channel. Further, there are provided various functions such as the selection of a bus mode, the setting of priorities according to a priority fixing mode and a round robin mode, an interruption request to the CPU, etc.

The bus state controller BSC is a circuit which performs separation or division of an address space and output control signals according to various memories, for example. Thus, DRAM, SRAM, ROM, etc. can be directly connected to the chip MF without an externally-provided circuit. Features of the BSC include various functions such as the support of memory access at external expansion (external data bus: 32 bits), the division of the address space into five areas (i.e., SRAM space×4 areas, DRAM space×1 area), the output of bus sizes (8/16/32 bits), the number of wait cycles and chip select signals corresponding to the respective areas to the respective areas, the output of a DRAM bar RAS signal and a bar CAS signal upon DRAM space access, the ability to set characteristics such as an ability to generate a Tp cycle for ensuring a RAS precharge time, a DRAM burst access function (high-speed access mode support of DRAM), a DRAM refresh function (the support of a programmable refresh interval, a bar CAS before bar RAS refresh/self-refresh), the ability to insert a wait cycle based on an external wait signal, the ability to access an address data multiplex I/O device, etc.

The user break controller UBC is a circuit for providing the function of facilitating a user's program debug. When a break condition is set to the UBC, a user break interruption takes place according to the contents of a CPC-based bus cycle or DMAC and DTC-based bus cycles. The use of such a function makes it possible to easily create a high-function self monitor debugger. Thus, even if a large-scaled in-circuit emulator is not used, the chip MF itself can debug a program with ease. Features of the UBC are as follows: The CPU or DMAC produces an interrupt when a bus cycle corresponding to a given set condition is produced. It is also easy to construct an on-chip debugger. Further, addresses, a CPU cycle or DMA/DTC cycle, an instruction fetch or data access, reading or writing, and operand sizes (long word, word, byte) can be set as break conditions. With the establishment of the break conditions, a user break interruption takes place, so that a user break interrupt exception routine created by a user can be executed.

The interrupt controller INTC is a circuit for making a decision as to priorities of interrupt factors and controlling each interrupt request to the processor CPU. The present INTC has a register for setting the priorities to the respective interrupts. Thus, the interrupt requests can be processed in accordance with the priorities set by a user. Features of the INTC are follows: The number of external interrupt terminals is 9, the number of internal interrupt factors is 43, and 16-level priorities can be set. Further, the occurrence of a noise canceler function and interrupt indicative of the state of an NMI terminal can be outputted to the outside. When a bus right is being released, the chip MF notifies the occurrence of a built-in peripheral circuit interrupt to an external bus master, whereby the chip MF is able to request the bus right.

The serial communication interface SCI comprises, for example, two channels independent of each other. The two channels have the same function The present SCI is a circuit capable of performing serial communications in the form of two systems of an asynchronous communication and a clock synchronous communication. Further, the present SCI is provided with the function (multi-processor communication function) of performing serial communications between a plurality of processors. Features of the present SCI include various functions such as the ability to select an asynchronous/clock synchronous mode per channel, the ability to perform transmission and reception simultaneously (full duplex), the incorporation of a dedicated baud-rate generator therein, the function of performing communications between multi-processors, etc.

The multi-function timer pulse unit MTU is a circuit made up of a 6-channel 16-bit timer, for example. Features of the present MTU include the following various functions: A process for inputting and outputting sixteen types of waveform outputs or sixteen types of pulses at maximum can be performed with 16-bit timer 5 channels as a base. Sixteen output compare registers and input capture registers, independent comparators corresponding to 16 in total, and eight types of counter input clocks can be selected. Further, there are provided an input capture function, pulse output modes (one shot/toggle/PWM/complementary PWM/reset synchronous PWM), a function for synchronizing a plurality of counters, complementary PWM output modes (the output of a non-overlap waveform for control of a 6-phase inverter, dead time automatic setting, the ability to set PWM duty to an arbitrary one of 0 to 100%, an output OFF function), a reset synchronous PWM mode (the output of positive-phase/anti-phase PWM waveforms in the form of three phases), a phase count mode (the ability to perform a 2-phase encoder counting process), etc.

The compare match timer CMT comprises two channels, for example and is made up of a 16-bit free running counter and one compare register or the like. The compare match timer CMT is provided with the function of generating an interrupt request according to a compare match.

The A/D converter A/D takes a 10-bit×8 channel configuration and is capable of performing conversion according to an external trigger. Further, the A/D converter A/D has sample and hold functions incorporated therein in the form of two units and is capable of simultaneously sampling two channels.

The watch dog timer WDT is a one-channel timer and is a circuit capable of monitoring the corresponding system. When the value of a counter is overflown due to a runaway or the like of the system without being properly rewritten by the CPU, the watch dog timer WDT outputs an overflow signal to the outside. Simultaneously, the watch dog timer WDT can also generate an internal reset signal for the chip MF. When the watch dog timer is not used as the WDT, it can be used also as an interval timer. When the watch dog timer is used as the interval timer, it generates an interval timer interrupt each time the counter is overflown. Further, the watch dog timer WDT is used even upon canceling or clearing of a standby mode. Incidentally, the internal reset signal can be generated according to the setting of the corresponding register. A power-on reset or manual reset can be selected as the type of reset. As WDT's features, the WDT is provided with the ability to perform switching between the watch dog timer and the interval timer, the function of generating an internal reset, an external signal or an interruption upon the occurrence of count overflow, etc.

The phase-locked loop circuit PLL is defined as a circuit which incorporates a clock oscillator therein, for example, and serves as a PLL circuit for clock multiplication.

In the chip MF constructed as described above, these internal circuits are electrically interconnected with each other by an internal address bus BUSAI and high-order and low-order internal data buses BUSDI as shown in FIG. 7. Further, a peripheral address bus BUSAO, a peripheral data bus BSUDO and a control signal line SL connect between these internal circuits and external connecting terminals I/O.

The internal address bus BUSAI is given as a 24-bit bus width and is mutually electrically connected between the processor CPU, flash memory Flash, random access memory/cache memory RAM/Cache, data transfer controller DTC, direct memory access controller DMAC and bus state controller BSC.

The internal data buses BUSDI comprise a high-order 16-bit bus and a low-order 16-bit bus and are respectively mutually connected between the processor CPU, flash memory Flash, random access memory/cache memory RAM/Cache, data transfer controller DTC, direct memory access controller DMAC and bus state controller BSC. The high-order 16-bit bus and the low-order 16-bit bus can correspond to a 32-bit data width.

The peripheral address bus BUSAO is set as a 24-bit bus width and is electrically connected between the respective internal circuits of the bus state controller BSC, interrupt controller INTC, serial communication interface SCI, multi-function timer pulse unit MTU, compare match timer CMT and watch dog timer WDT, and the external connecting terminals I/O.

The peripheral data bus BUSDO is set as a 16-bit bus width and is electrically connected between the respective internal circuits of the bus state controller BSC, interrupt controller INTC, serial communication interface SCI, multi-function timer pulse unit MTU, compare match timer CMT and watch dog timer WDT, and the external connecting terminals I/O.

The control signal line SL is electrically connected between the respective internal circuits of the data transfer controller DTC, direct memory access controller DMAC, bus state controller BSC, user break controller UBC, interrupt controller INTC, serial communication interface SCI, multi-function timer pulse unit MTU, compare match timer CMT and A/D converter A/D and between these internal circuits an the external connecting terminals I/O.

In the present chip MF, such a function layout as shown in FIG. 8 is taken as the external connecting terminals I/O, which comprise 98 input/output terminals and 8 input terminals. Functions of the respective external connecting terminals I/O are represented as shown in the respective lists illustrative of examples of the category, symbol, input/output and designation and their corresponding terminal functions as shown in FIGS. 15 through 18. Incidentally, the chip MF having the 112 pins is represented in the form of such a function layout as shown in FIG. 10, which includes 74 input/output terminals and 8 input/output terminals.

Figure 11:
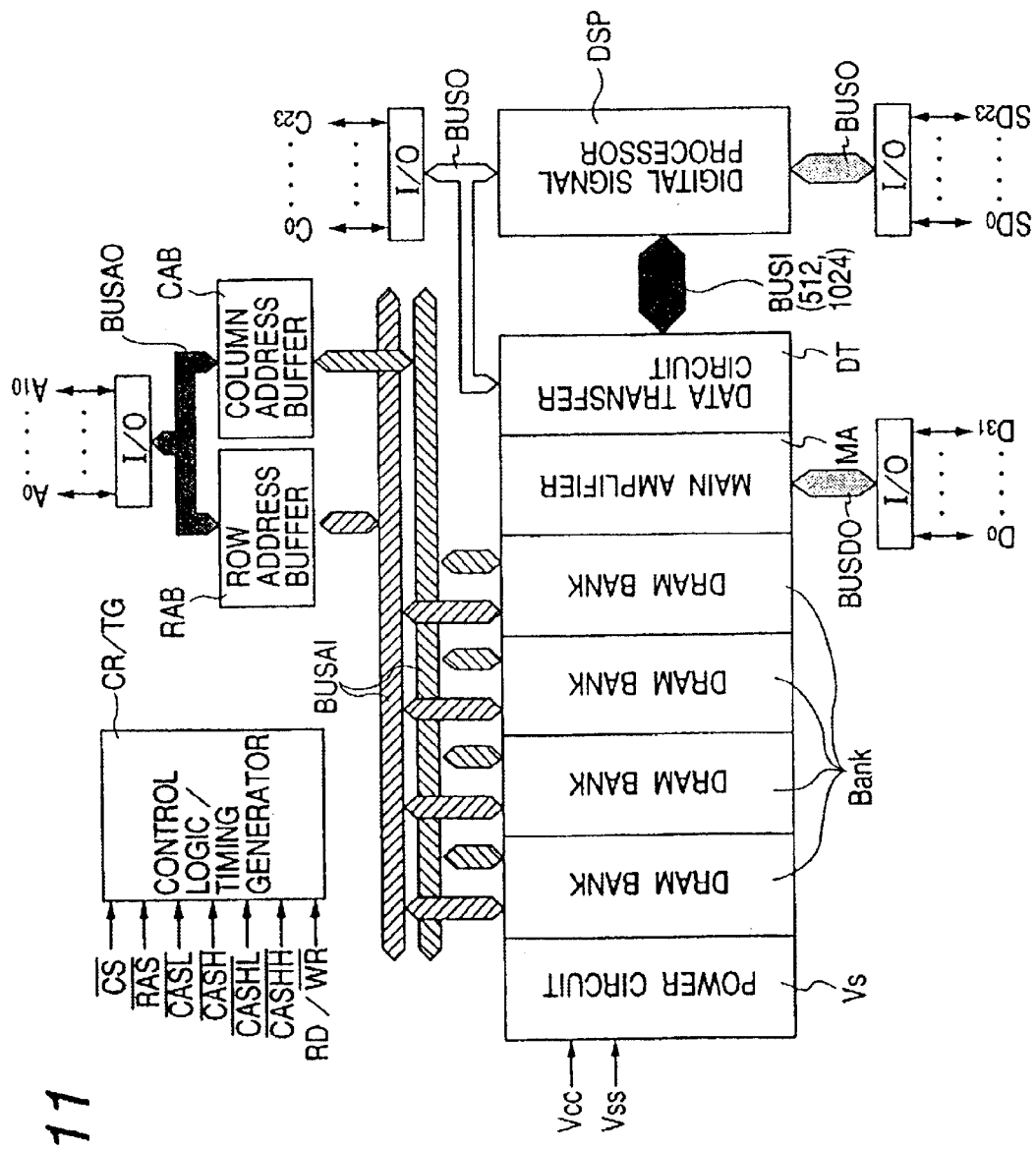
Figure 12:
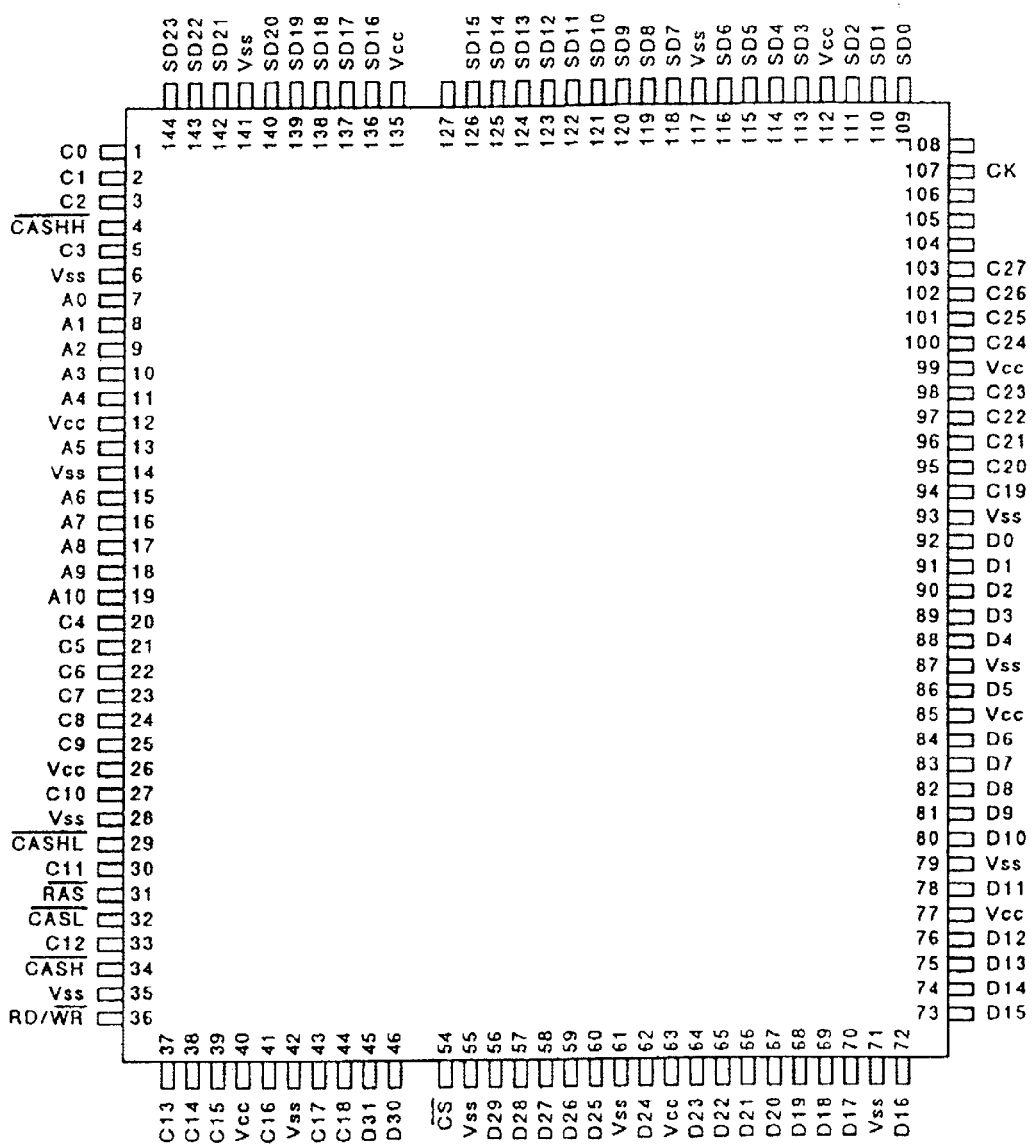

FIG. 11 is a functional block diagram showing an example of an internal configuration of the chip AD. FIG. 12 is an explanatory view showing an example illustrative of its terminal functions. Incidentally, the chip AD shows an example illustrative of 144 pins.

The present chip AD takes a circuit configuration in which the DRAM and ASIC are formed and which has a memory function capable of performing write/read whenever necessary and a processing function using a logic circuit. As shown in FIG. 11 by way of example, the present chip AD comprises a power circuit VS, a plurality of DRAM banks Bank, a main amplifier MA, a data transfer circuit DT, a digital signal processor DSP, a row address buffer RAB, a column address buffer CAB, and a control logic/timing generator CR/TG. Incidentally, the DRAM may include an occasionally writable/readable simple dynamic random access memory DRAM which needs a storage holding operation, a clock-based sync-type synchronous DRAM (SDRAM), an extended data out DRAM (EDO-DRAM) capable of lengthening a data output time interval, etc.

The power circuit VS is a circuit for receiving a power supply voltage Vcc and a ground voltage Vss from the outside and supplying power supplies or voltages necessary for the plurality of DRAM banks Bank and the main amplifier MA.

The plurality of DRAM banks Bank are capable of operating independently. Each bank includes, for example, a memory cell, a word decoder, a column decoder, a sense amplifier and a timing generator. The capacity of each DRAM bank Bank is given in the form of 256K bits per bank.

The main amplifier MA is a circuit for performing the inputting and outputting of data between the plurality of DRAM banks Bank and external connecting terminals D0 through D31. For example, 128 global data lines and many global data lines are provided between the main amplifier MA and the respective DRAM banks Bank. Data is transferred therebetween through the global data lines.

The data transfer circuit DT switches data transfer patterns between a DRAM comprised of the DRAM banks Bank and the main amplifier MA or the like and the digital signal processor DSP in real time. The data transfer circuit DT is capable of selecting one of adjacent data and clearing the data, for example.

The digital signal processor DSP is a circuit for executing the processing of digital signals such as images or pictures, voice, etc. In the case of image processing, for example, the digital signal processor DSP executes a process for removing or erasing a hidden surface based on a Z-comparison, a process for giving a α-blend based feeling of transparency, etc. Further, the digital signal processor DSP outputs data from serial output ports SD0 through SD23 to an output device such as a display or the like. The digital signal processor DSP and the data transfer circuit DT are controlled by control signals C0 through C27.

The row address buffer RAB and the column address buffer CAB are circuits for respectively taking in or capturing address signals from external address signal input terminals A0 through A10 to thereby produce internal address signals and supplying them to the respective DRAM banks Bank. They capture row addresses with a timing of a bar RAS and capture column addresses with timings of a bar CASL, a bar CASH, a bar CASHL and a bar CASHH, respectively.

The control logic/timing generator CR/TG is a circuit for generating various timing signals necessary for the operation of the DRAM. An input bar CS is a chip select signal, the bar RAS is a row address strobe signal and the bar CASL, bar CASH, bar CASHL and bar CASHH are respectively column address strobe signals. Further, a RD/bar WR is a read/write signal (if the signal is high in level, then it shows reading, whereas if the signal is low in level, then it shows writing). The four column address strobe signals are used to allow byte control (read/write control for each byte). The bar CASL is used for the least significant bytes D0 through D7, the bar CASH is used for the second bytes D8 through D15 as counted from the least significance, the bar CASHL is used for the third bytes D16 through D23 as counted from the least significance, and the bar CASHH is used for the most significant bytes D24 through D31.

In the internal circuits of the chip AD constructed as described above, the plurality of DRAM banks Bank, the row address buffer RAB and the column address buffer CAB are electrically interconnected with each other by internal address buses BUSAI. Further, the row address buffer RAB, the column address buffer CAB and the external connecting terminal I/O are electrically interconnected with each other by a peripheral address bus BUSAO, and the main amplifier MA and the external connecting terminal I/O are electrically connected to each other by a peripheral data bus BUSDO, respectively.

Further, the data transfer circuit DT and the digital signal processor DSP are electrically interconnected with each other by an address bus and an internal bus BUSI for data. Moreover, the data transfer circuit DT, the digital signal processor DSP and their corresponding external connecting terminals I/O are electrically connected to one another by peripheral buses BUSO for the data and control signals.

The present chip AD is provided with voltage terminals Vcc and Vss for the power supply Vcc and ground Vss, address terminals A0 through A10, data input/output terminals D0 through D31, a chip select terminal bar CS, a row address strobe terminal bar RAS, column address strobe terminals bar CASL, bar CASH, bar CASHL and bar CASHH, a read/write terminal RD/bar WR, clock terminals CK, serial data output terminals SD0 through SD23, and ASIC control signal terminals C0 through C27 as external connecting terminals as shown in FIG. 12.

Figure 13:
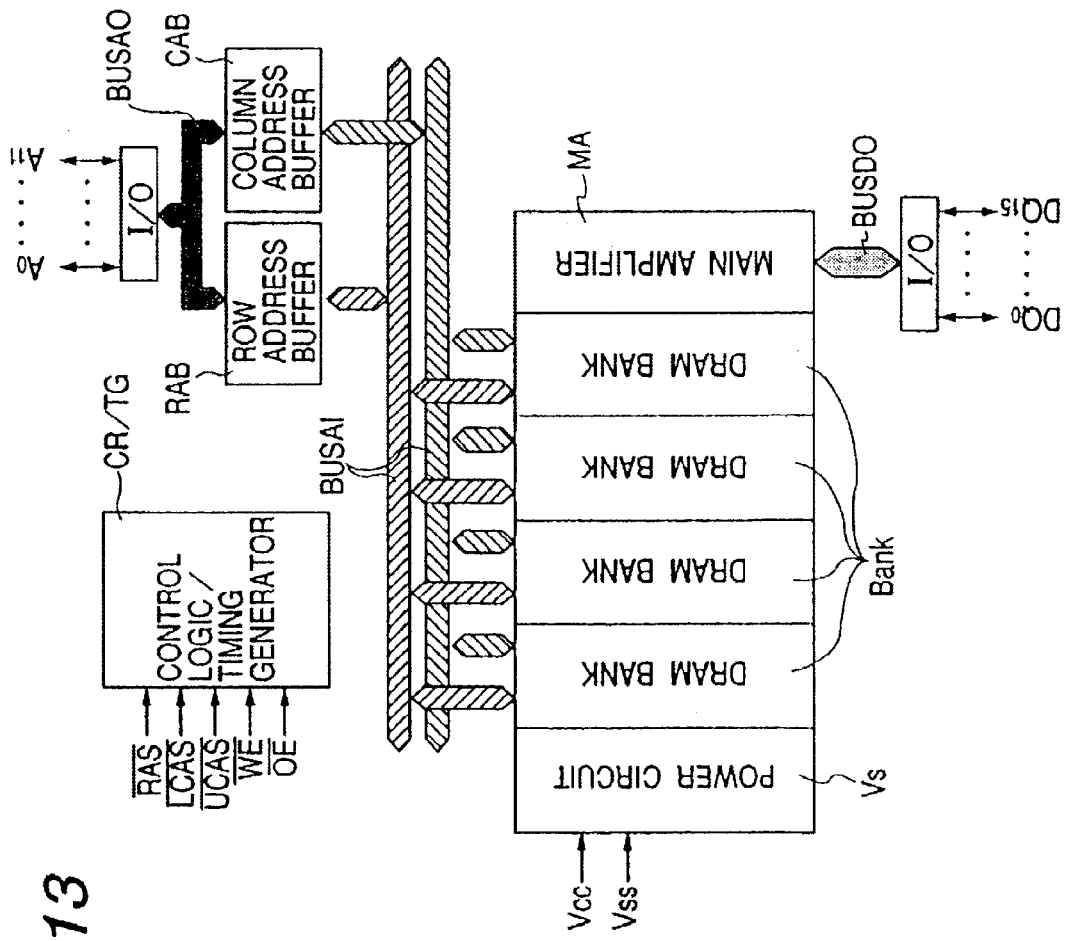

FIG. 13 is a functional block diagram showing an example of an internal configuration of the chip D. FIG. 14 is an explanatory view showing an example illustrative of its terminal functions. Incidentally, the chip D shows an example illustrative of 50 pins.

The chip D takes a circuit configuration in which only a DRAM is formed and which has an occasionally writable/readable memory function. As shown in FIG. 13 by way of example, the chip D comprises a power circuit VS, a plurality of DRAM banks Bank, a main amplifier MA, a row address buffer RAB, a column address buffer CAB, and a control logic/timing generator CR/TG.

The chip D takes a circuit configuration having only the DRAM excluding the logic circuit comprised of the data transfer circuit DT and the digital signal processor DSP of the chip AD shown in FIG. 11. Thus, since the internal circuits constituting the chip D are identical to those of the chip AD, their functional description will be omitted herein.

The chip D is provided with voltage terminals Vcc and Vss for the power supply Vcc and ground Vss, address terminals A0 through A11, data input/output terminals DQ0 through DQ31, a row address strobe terminal bar RAS, a column address strobe terminal bar LCAS, a bar UCAS, a write enable terminal bar WE, and an output enable terminal bar OE as external connecting terminals as shown in FIG. 14.

In the semiconductor device according to the present embodiment, which is comprised of combinations of the chip MF and chip MFA, and one or the plurality of chips AD, and the chip D as described above, signal terminals mutually common to the connecting terminals of the chip MF or MFA and the connecting terminals of the chip AD or D are commonly assigned to the same external connecting terminals. The connecting terminals commonly assigned to the same external connecting terminals will be explained below in detail.

Figure 19:
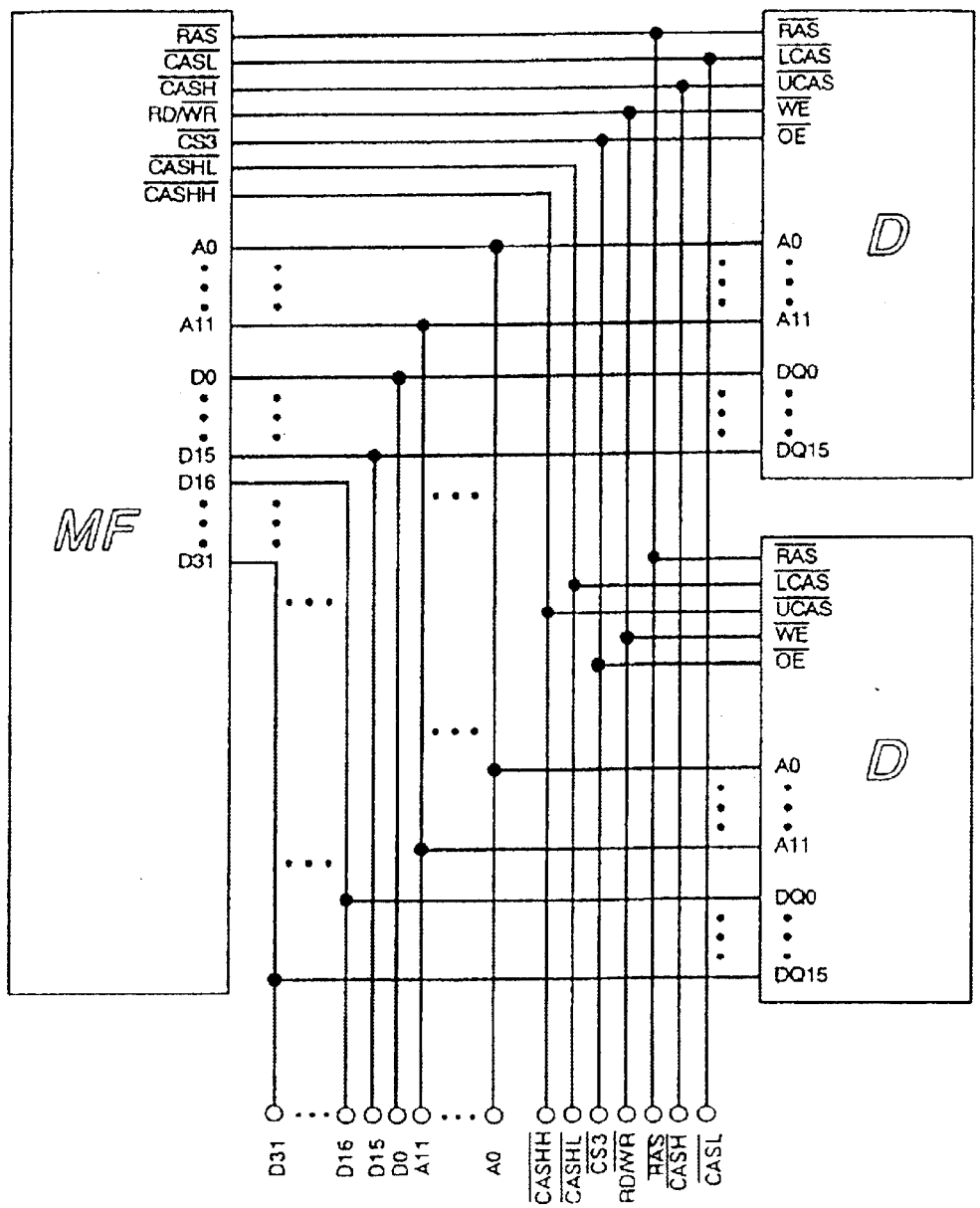
FIGS. 19 and 20 are respectively connection diagrams showing examples of connections between the semiconductor chips.

FIG. 19 is a connection diagram showing an example of connections between the chips MF shown in FIGS. 7 and 8 each having the 144 pins and the two chips D shown in FIGS. 13 and 14 each having the 50 pins. Incidentally, FIG. 19 shows only connections between signal terminals common to the connecting terminals of the chip MF and the connecting terminals of the chip D, and their corresponding external connecting terminals. In practice, the connecting terminals corresponding to signal terminals independent of each other in the chip MF alone are also electrically connected to the external connecting terminals.

Upon the connections between the chip MF having the 144 pins and the two chips D each having the 50 pins, address terminals A0 through A11 of the chip MF are electrically connected to their corresponding address terminals A0 through A11 of the two chips D and electrically connected to the same external connecting terminals A0 through A11. Data input/output terminals D0 through D31 of the chip MF are electrically connected to their corresponding data input/output terminals DQ0 through DQ15 of the chips D in divided form and electrically connected to the same external connecting terminals D0 through D31.

The power supply terminal Vcc and ground terminal Vss of the chip MF are electrically connected to their corresponding power supply terminals Vcc and ground terminals Vss of the chips D. Further, they are electrically connected to the same external connecting terminals Vcc and Vss respectively. Incidentally, since the voltage terminals are actually assigned to the plurality of terminals of the chip MF, chip D and external connecting terminals, they are connected with the same terminals.

Further, as those concerned with the control signals, the row address strobe terminal bar RAS of the chip MF is commonly connected to the two chips D and connected to the external connecting terminal bar RAS. The column address strobe terminals bar CASL and bar CASH of the chip MF are electrically connected to their corresponding column address strobe terminals bar LCAS and bar UCAS of one chip D and electrically connected to their corresponding external connecting terminals bar CASL and bar CASH. The column address strobe terminals bar CASHL and bar CASHH of the chip MF are electrically connected to their corresponding column address strobe terminals bar LCAS and bar UCAS of the other chip D and electrically connected to their corresponding external connecting terminals bar CASHL and bar CASHH.

A read/write terminal RD/bar WR of the chip MF is commonly connected to its corresponding write enable terminal bars WE of the two chips D and its corresponding external connecting terminal RD/bar WR. A chip select terminal bar CS3 of the chip MF is commonly connected to its corresponding output enable terminals bars OE of the two chips D and its corresponding external connecting terminal bar CS3.

Upon the connections between the chip MF, chip D and external connecting terminals as described above, all the connecting terminals of the chip D are used in common with the connecting terminals of the chip MF. They are electrically connected to the same external connecting terminals. Incidentally, since the connecting terminals serving as the signal terminals made independent in the chip MF alone also exist in practice in the semiconductor device based on the chip MF and the chip D, the external connecting terminals connected to the independent connecting terminals are also connectable to the outside.

Figure 20:
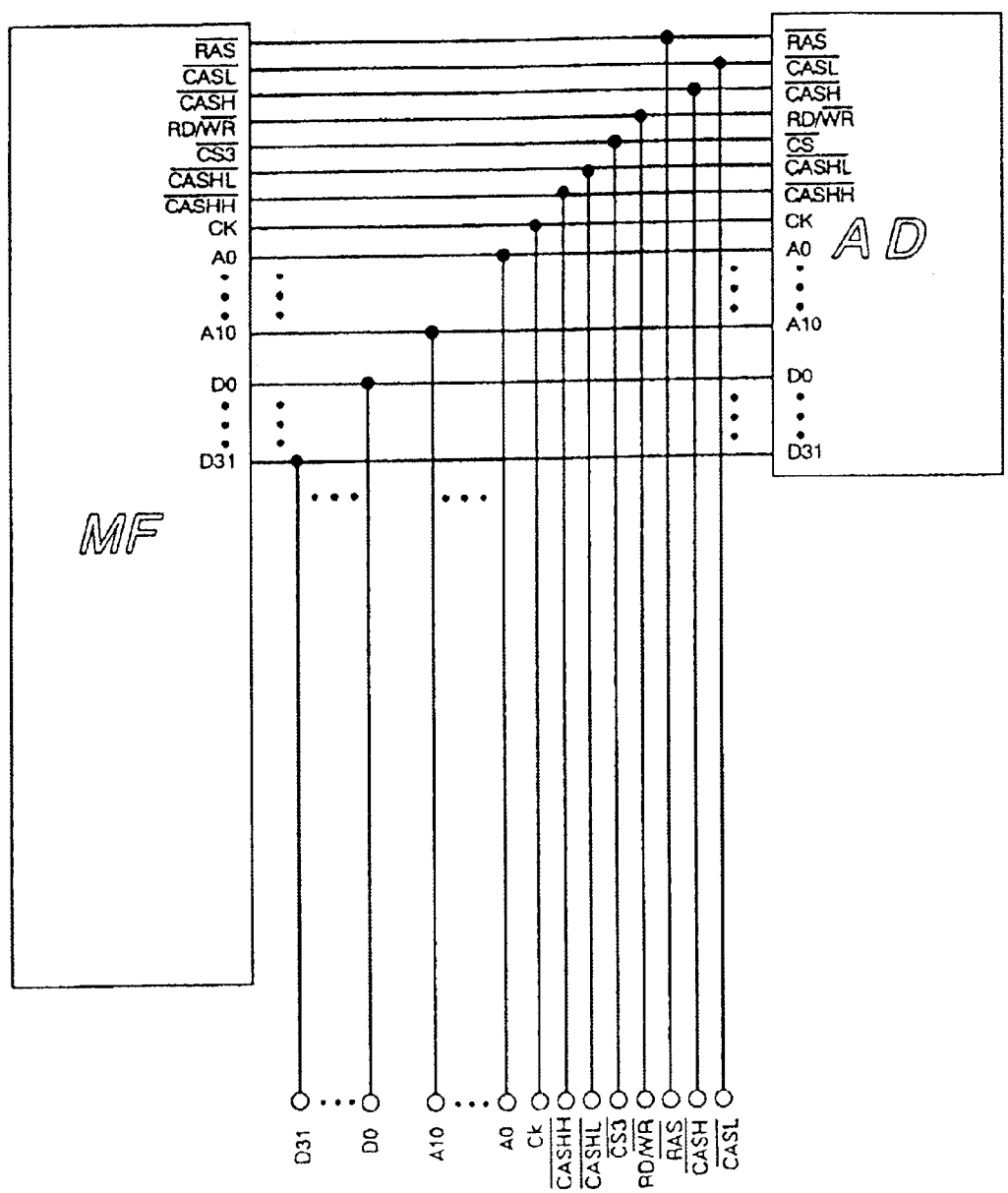

FIG. 20 is a connection diagram showing an example of connections between the chips MF shown in FIGS. 7 and 8 each having the 144 pins and the chips AD shown in FIGS. 11 and 12 each having the 144 pins. Incidentally, FIG. 20 also shows only connections between signal terminals common to the connecting terminals of the chip MF and the connecting terminals of the chip AD, and their corresponding external connecting terminals in a manner similar to FIG. 19. In practice, the connecting terminals corresponding to signal terminals made independent in the chips MF and AD alone are also electrically connected to the external connecting terminals.

Upon the connections between the chip MF having the 144 pins and the chip AD having the 144 pins, address terminals A0 through A10 of the chip MF are electrically connected to their corresponding address terminals A0 through A10 of the chip AD and electrically connected to the same external connecting terminals A0 through A10. Data input/output terminals D0 through D31 of the chip MF are electrically connected to their corresponding data input/output terminals D0 through D31 of the chip AD and electrically connected to the same external connecting terminals D0 through D31.

The power supply terminal Vcc and ground terminal Vss of the chip MF are electrically connected to their corresponding power supply terminal Vcc and ground terminal Vss of the chip AD. Further, they are electrically connected to the same external connecting terminals Vcc and Vss respectively. Incidentally, since the voltage terminals are actually assigned to the plurality of terminals of the chip MF, chip D and external connecting terminals, they are connected to one another by the same terminals.

Further, as those concerned with the control signals, a row address strobe terminal bar RAS, column address strobe terminals bar CASL, bar CASH, bar CASHL and bar CASHH, a read/write terminal RD/bar WR, a chip select terminal bar CS3 and a clock terminal CK of the chip MF are respectively electrically connected to a row address strobe terminal bar RAS, column address strobe terminals bar CASL, bar CASH, bar CASHL and bar CASHH, a read/write terminal RD/bar WR, a chip select terminal bar CS3 and a clock terminal CK of the chip AD. Further, they are respectively electrically connected to a row address strobe terminal bar RAS, column address strobe terminals bar CASL, bar CASH, bar CASHL and bar CASHH, a read/write terminal RD/bar WR, a chip select terminal bar CS3 and a clock terminal CK of the same external connecting terminals.

In the semiconductor device based on the chip MF and the chip AD as described above, the serial data outputs SD0 through SD23 corresponding to the signals peculiar to the chip AD alone, and the ASICA control signal terminals C0 through C27 are actually made independent respectively. Further, the connecting terminals corresponding to the signal terminals made independent in the chip MF alone also exist. Therefore, the external connecting terminals connected to these independent connecting terminals are provided so as to be connectable to the outside.

When the DRAMs of the chips AD and D are defined as synchronous DRAMs in the semiconductor device, it is necessary to further provide synchronization inside the semiconductor device. Therefore, the clock terminal to which a clock signal corresponding to a control signal for synchronization has been assigned, is electrically connected to the same external connecting terminal as the common connecting terminal.

Summaries of the operation of the present embodiment, i.e., the operation of data reading of the chip AD (chip D) to the DRAM from the processor CPU of the chip MF (chip MFA), its data writing operation and its refresh operation will next be explained in the semiconductor device constructed by the combinations of the chip MF and chip MFA and one or plural chips AD and chips D.

(1) Read Operation:

Since an address signal is inputted on a time-sharing basis upon address multiplex, it is necessary to provide two synchronizing signals of the row address strobe signal bar RAS and column address strobe signal bar CAS from the processor CPU. A period or cycle in which the bar RAS is placed in an high level (H), corresponds to a period in which a RAS system circuit is precharged. During this period, any memory operations are not performed inside the chip. On the other hand, a period in which the bar CAS is H, corresponds to a period in which a CAS system circuit such as a data output buffer, a data input buffer or the like is precharged. The operation of data reading of the chip AD from the outside and the operation of data writing thereof are not performed during this period.

When the bar RAS is brought to a low level (L), the RAS system circuit is activated so that the memory operation is started. When the bar CAS becomes L subsequently, the read operation or write operation starts and hence the transfer of data between the chip AD and the external chip MF is performed. Thus, the precharge period and the activation period are alternately repeated in the DRAM of the chip AD. A cycle time of the bar RAS corresponds to that of the chip AD.

The designation of the read operation is performed by setting the write enable signal bar WE to H antecedent to the rise of the bar CAS and holding it until the bar CAS rises. Once data is outputted, the data is held until the bar CAS rises. The type of access time is three and the time intervals required to output the data to the data output terminals from the falling edges of the bar RAS and bar CAS will be called the "bar RAS access time and bar CAS access time" respectively. Further, the time that elapses between the determined time of a column address and the output of data, will be called "address access time".

(2) Write Operation:

Since the relationship between each address signal, the bar RAS and the bar CAS is identical to that at the read operation, the description thereof will be omitted. Further, the timing standards of the bars RAS and CAS such as the cycle time or the like are identical to those at the read operation. However, the write operation is specified by setting the bar WE to L antecedent to the leading edge of the bar CAS. During this cycle, the data output terminal is held in a high impedance state. Incidentally, there are also specifications based on a Read Modify Write operation that data temporarily read into the chip MF lying outside the chip AD is changed by the chip MF while the bar RAS is kept in a state of remaining L, and the so-changed data is written into the same memory cell again.

(3) Refresh Operation:

There are known a refresh operation performed by initiating an interrupt during a random access operation like reading or writing, and a refresh operation performed only to hold information stored inside the chip AD as in the case of a battery backup period. In the former, a bar RAS only refresh and a CBR (bar CAS before bar RAS) refresh are standard. In the latter, a self-refresh is standard.

In the bar RAS only refresh, for example, all the memory cells corresponding to one row (word line) are simultaneously refreshed during one cycle of the bar RAS based on the same timing standards as those for the read and write operations. However, a refresh address must be supplied from the chip MF lying outside the chip AD after the setting of the bar CAS to H.

There are known a centralized refresh and a decentralized refresh as the manner in which this refresh is done. This centralized refresh is a method wherein the refresh is repeated in a minimum cycle and a memory access cannot be performed from the chip MF lying outside the chip AD during this period, whereas during the remaining period, the memory access is accepted from the outside without causing the refresh to be interrupted. With respect to the decentralized refresh, one cycle of the refresh operation is equally decentralized during the maximum refresh period. Since the decentralized refresh is actually used heavily, one cycle of the refresh operation results in timing provided to interrupt a cycle for the normal read/write operation.

The CBR refresh is performed as follows: The presence or absence of a refresh operation is determined inside by setting the bar CAS to L prior to the bar RAS. An address is generated from an internal refresh address counter according to a pulse indicative of such a result of determination to thereby select a word line, whereby its corresponding memory cell is refreshed. It is thus unnecessary to give an address from the outside of the chip AD.

The self-refresh is performed as follows: After the completion of a normal memory cycle, a pulse width of the bar RAS is set to greater than 100 μs, for example with CBR timing set therefor. When the pulse width reaches greater than this time inside the chip, a refresh operation using a refresh address counter and a refresh timer is started. Further, the self-refresh continues so long as the bars RAS and CAS are both L. While the chip AD is reduced in power consumption as refreshed frequency decreases, this frequency is automatically controlled by a timer for detecting an internal temperature of the chip AD. Incidentally, a bar RAS precharge period is required upon shifting from the self-refresh to the normal cycle.

The operation of data reading from the processor CPU of the chip MF to the DRAM of the chip AD, its write operation and its refresh operation are performed in the above-described manner. As one characteristic of the present invention, the logic circuit lying inside the chip AD takes such a circuit configuration as to be able to execute the refresh operation/access operation upon the self-refresh operation for this refresh in particular. A detailed description will be made of the case in which the refresh operation/access operation can be executed upon the self-refresh operation.

Figure 21:
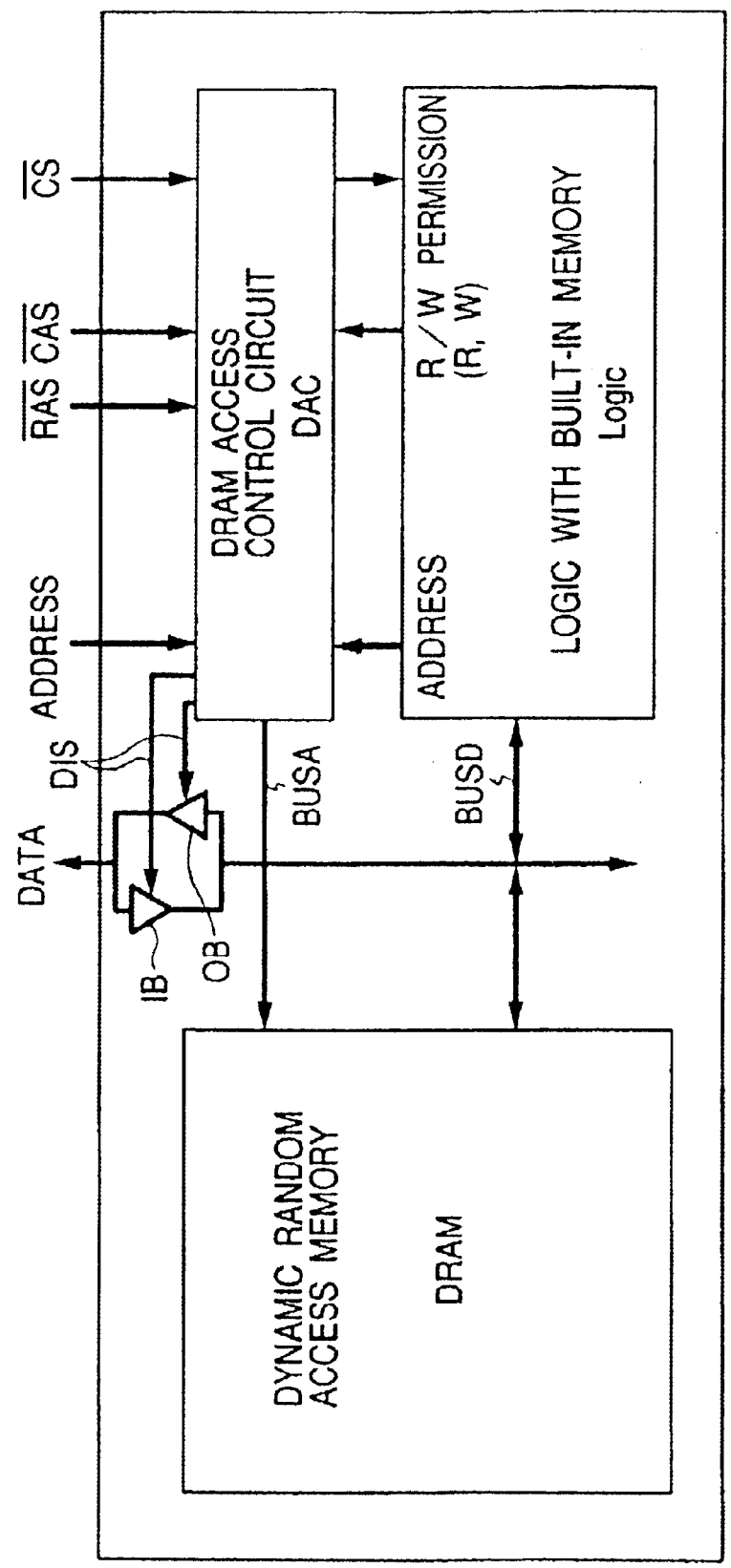
FIG. 21 is a block diagram schematically illustrating an example of the internal function of each semiconductor chip.

FIG. 21 is a rough block diagram schematically showing an example illustrative of internal functions of the chip AD shown in FIG. 11. The chip AD comprises a dynamic random access memory DRAM, a logic Logic with a built-in memory, and a DRAM access control circuit DAC. Incidentally, the DRAM, logic Logic with the built-in memory and DRAM access control circuit DAC respectively correspond to a DRAM portion comprised of the plurality of DRAM banks Bank and the main amplifier MA or the like shown in FIG. 11, an ASIC portion comprised of the data transfer circuit DT and the digital signal processor DSP, and an access control portion comprised of the row address buffer RAB and the column address buffer CAB or the like. Further, an input buffer IB and an output buffer OB correspond to a circuit I/O for performing the input/output of data between the main amplifier MA and the external connecting terminals D0 through D32 shown in FIG. 11 and a circuit I/O electrically connected to the digital signal processor DSP, respectively.

In the chip AD, a chip select signal bar CS, a row address strobe signal bar RAS and a column address strobe signal bar CAS are inputted to control signal terminals. Address signals are inputted to the DRAM access control circuit DAC through address terminals, and data signals are capable of being input and output through their corresponding data input/output terminals. Further, the DRAM and the DRAM access control circuit DAC are electrically interconnected with each other by an address bus BUSA inside the chip AD. The DRAM, the logic Logic with the built-in memory and the data input/output terminals are electrically interconnected with each other by a data bus BUSD. For example, each data input/output terminal corresponds with 8 bits, for example, whereas the data bus BUSD placed inside the chip AD takes a bus with of 64 bits greater than it.

The memory-contained logic Logic and the DRAM access control circuit DAC are electrically connected to each other by an address bus and a control signal line inside the chip AD. A permission or enabling signal for the self-refresh operation is outputted from the DRAM access control circuit DAC to the memory-contained logic Logic. A read/write signal R/W and address signals are outputted from the memory-contained logic Logic to the DRAM access control circuit DAC. Incidentally, the read/write signal R/W may be outputted in parts as a read signal R and a write signal W. During the self-refresh period, data input/output inhibit signals DIS are respectively outputted from the DRAM access control circuit DAC to the input buffer IB and the output buffer OB. In response to the data input/output inhibit signal DIS, the input buffer IB inhibits the input of data from the outside of the chip AD during the self-refresh period. Further, the output buffer OB inhibits the output of data on the data bus BUSD to the outside of the chip AD in response to the data input/output inhibit signal DIS.

Figure 22:
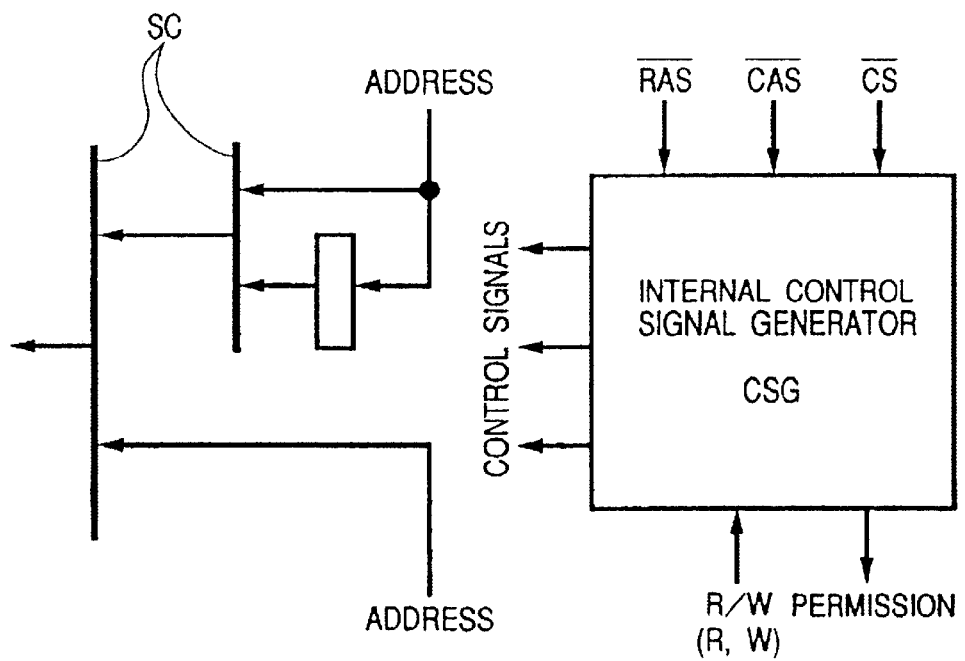
FIG. 22 is a block diagram depicting a detailed example of a DRAM access controller.

FIG. 22 is a block diagram showing a detailed example of the DRAM access control circuit DAC. The DRAM access control circuit DAC comprises an internal control signal generator CSG, a plurality of selector circuits SC, etc. Based on a chip select signal bar CS, a row address strobe signal bar RAS, and a column address strobe signal bar CAS inputted to the internal control signal generator CSG, the DRAM access control circuit DAC generates address selecting control signals, and produces an enabling signal for the self-refresh operation and outputs it to the memory-contained logic Logic.

The memory-contained logic Logic supplied with the enabling signal can be accessed to the DRAM. Thus, the memory-contained logic Logic outputs a read/write R/W to the DRAM access control circuit DAC to make a read/write request thereto and outputs an address signal to the DRAM access control circuit DAC to select an arbitrary memory cell. Thus, the reading/writing of data between the selected memory cell and the memory-contained logic Logic can be performed. Incidentally, the read/write request may be made by outputting a read signal R to the DRAM access control circuit DAC when it is desired to make a read request and outputting a write signal W thereto when it is desired to make a write request.

The address control signals generated from the internal control signal generator CSG are used as address control signals for selecting one of an access operation from the processor CPU of the chip MF lying outside the chip AD and an access operation from the memory-contained logic Logic lying inside the chip AD through the selector circuit SC to thereby select an arbitrary memory cell of the DRAM.

Figure 23:
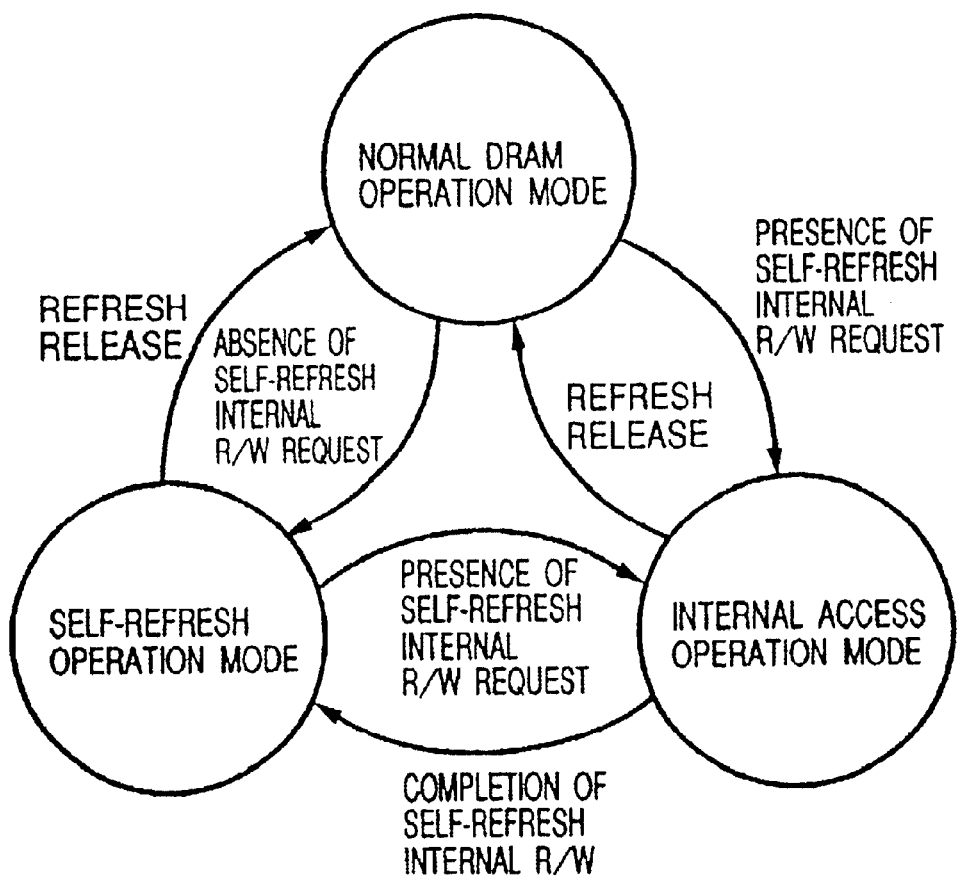
FIG. 23 is an explanatory diagram showing examples of transient states of operation modes employed in an internal control signal generator.

FIG. 23 is an explanatory view showing examples of transient states of operation modes employed in the internal control signal generator CSG. The operation modes are classified into an access operation mode with respect to the normal DRAM, a self-refresh operation mode for the DRAM and an access operation mode with respect to the internal memory-contained logic Logic. The normal DRAM access operation mode is shifted to the self-refresh operation mode without making the read/write request based on the read/write signal R/W issued from the memory-contained logic Logic. A return to the normal DRAM access operation mode is performed by clearing or setting free the refresh.

Further, the self-refresh operation mode is shifted to the internal access operation mode when the read/write request is issued from the memory-contained logic Logic. A return to the self-refresh operation mode is performed according to the completion of the reading/writing. Similarly, the normal DRAM access operation mode is shifted to the internal access operation mode when the read/write request issued from the memory-contained logic Logic is made. A return to the normal DRAM access operation mode is done by clearing the refresh.

Figure 24:
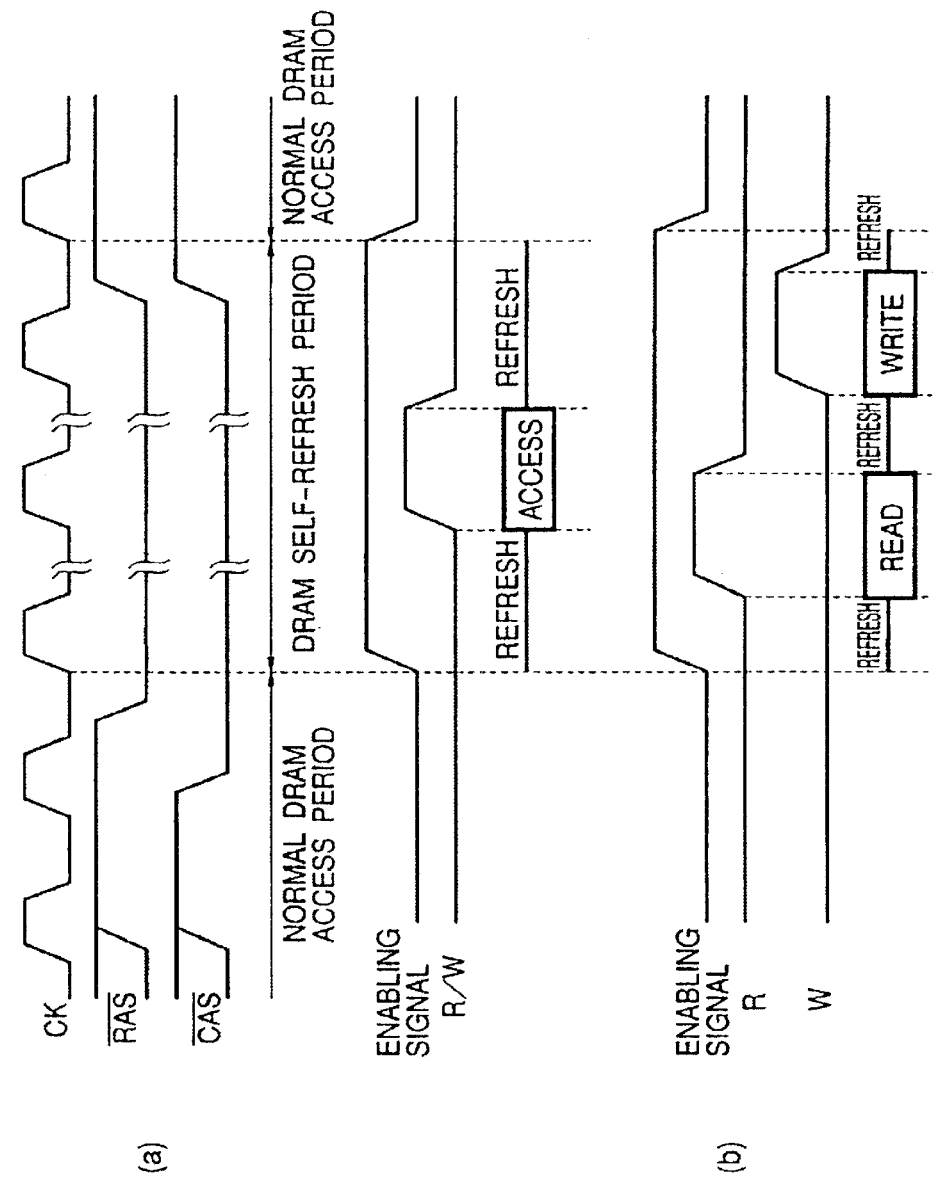
FIG. 24 is an operation timing chart depicting an example illustrative of control of the DRAM access controller over a DRAM.

FIG. 24 is an operation timing chart for describing an example illustrative of control of the DRAM access control circuit DAC including the internal control signal generator CSG over the DRAM. As shown in FIG. 24(a), the operation control on the DRAM includes a normal DRAM access period in which a normal DRAM access can be executed and a DRAM self-refresh period which is placed between the normal DRAM access period and another normal DRAM access period and in which the self-refresh for the DRAM can be executed. The present DRAM self-refresh period corresponds to a period in which the normal access operation to the DRAM from the chip MF is not carried out.

During the DRAM self-refresh period, a self-refresh operation enabling signal is outputted to the memory-contained logic Logic in synchronism with a clock signal CK on the basis of a row address strobe signal bar RAS and a column address strobe signal bar CAS. Only when a request as to the access operation for reading/writing based on the control signal R/W to the DRAM is made from the memory-contained logic Logic, the refresh operation is set free to thereby allow an access operation to the DRAM from the memory-contained logic Logic (digital signal processor DSP).

The refresh operation/access operation in the self-refresh period are actually performed as shown in FIG. 24(b) by way of example. That is, the read operation can be repeated according to the read request based on the control signal R. Further, the refresh operation can be executed between the present reading and another reading and the read operation can be repeated according to the write request based on the control signal W. The refresh operation can be executed between this writing and another writing. In addition, the read and write operations can be repeated according to the read request based on the control signal R and the write request based on the control signal W, and the refresh operation can be executed during a period between the read and write access operations.

Upon execution of the self-refresh operation to the DRAM of the chip AD by the processor CPU of the chip MF, the memory-contained logic Logic of the chip AD can effect an access operation on the DRAM, the data can be written into the DRAM according to the write request issued from the memory-contained logic Logic, and the data can be read from the DRAM according to the read request therefrom in the above-described manner.

Incidentally, the access operation to the DRAM by the memory-contained logic Logic of the chip AD upon this self-refresh operation is performed similarly even where other chips are connected to the chip AD. Similar effects can be expected even in the case of the above-described chip MFA and another semiconductor chip simply including a CPU, for example. That is, each chip can be applied to a semiconductor device having a package structure which allows an external access operation to a DRAM by a chip AD and a self-refresh operation of the DRAM.

Figure 25:
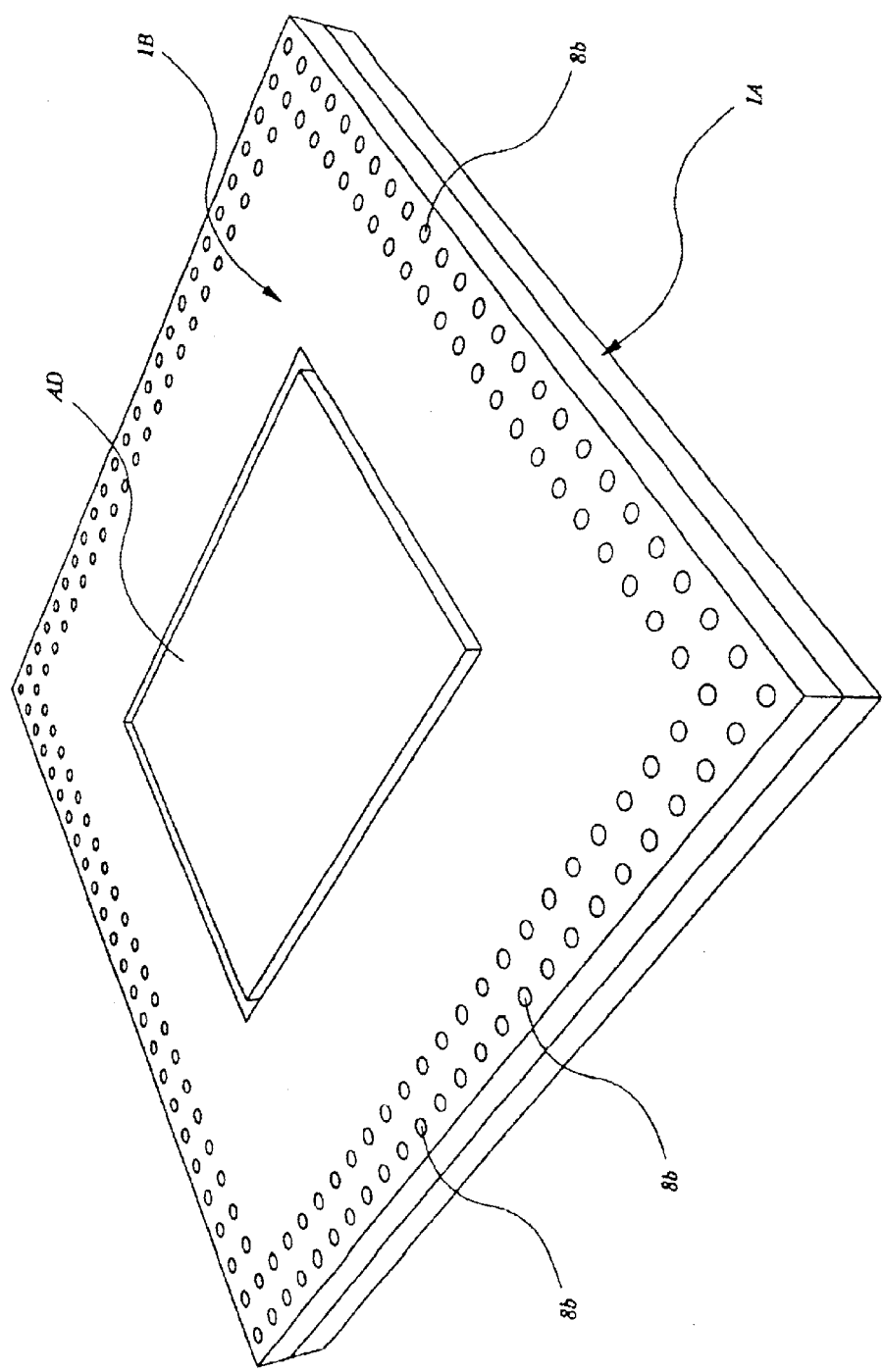
FIG. 25 is an overall perspective view of a package showing an embodiment of the present invention.
Figure 26:
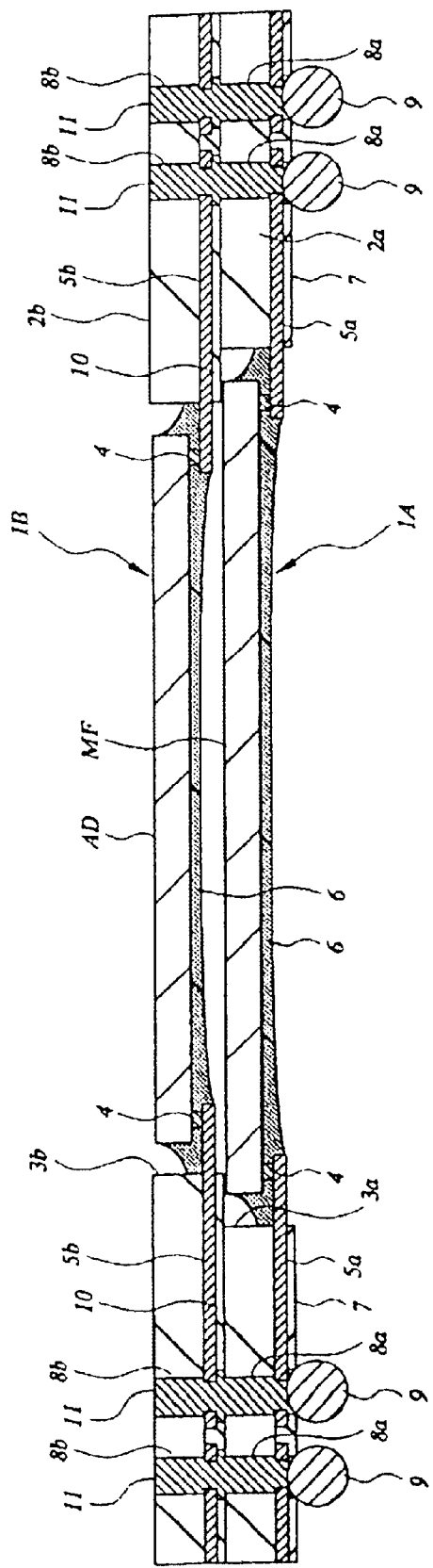
FIG. 26 is a cross-sectional view of the package shown in FIG. 25.

A specific structure of the package according to the present embodiment will next be described in detail. FIG. 25 is an overall perspective view of the package according to the present embodiment, and FIG. 26 is a cross-sectional view of the package, respectively.

The package according to the present embodiment has a multilayered or stacked TCP structure wherein the first chip MF (corresponding to the microcomputer equipped with the flash memory) with the microcomputer and the flash memory formed therein is sealed with a first TCP (Tape Carrier Package) 1A, the second chip AD (corresponding to the DRAM on-chip logic) with the DRAM and ASIC formed therein is sealed with a second TCP1B, and these two TCP1A and TCP1B are superimposed on one another in upward and downward directions so that they are integrally joined together.

The first chip MF sealed with the first TCP1A is placed within a device hole 3a defined in a central portion of a tap carrier 2a with its principal surface (device forming surface) directed downward. Further, the first chip MF is electrically connected to one ends (inner lead portions) of leads 5a formed over the whole surface of the tape carrier 2a through bump electrodes 4 formed at peripheral portions of the principal surface thereof. A potting resin 6 for protecting an LSI (microcomputer equipped with flash memory) formed over the major surface from external environments is placed on the principal surface of the chip MF.

Figure 27:
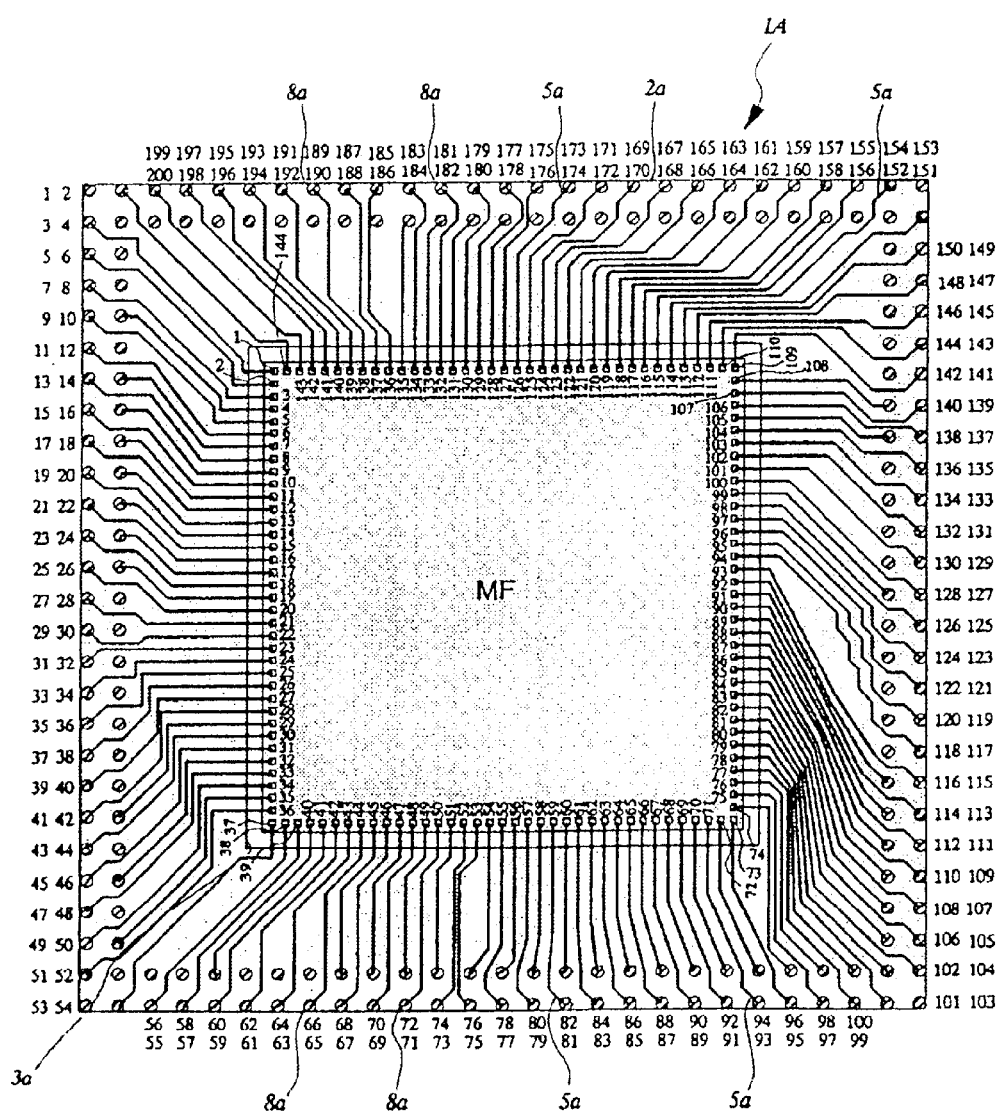
FIGS. 27 and 28 are respectively showing patterns of leads formed over the whole surfaces of tape carriers.

The leads 5a formed over the whole surface of the tape carrier 2a have patterns shown in FIG. 27 respectively. The surfaces of these leads 5a are covered with solder resists 7 except for one ends (inner lead portions) which project into the device hole 3a. The other ends of the respective leads 5a are electrically connected to through holes 8a each extending through one surface to the other surface of the tape carrier 2a. These through holes 8a are placed in two rows along the four sides of the tape carrier 2a. Solder bumps 9 used as external connecting terminals at the time that this multilayered TCP is implemented on a printed wiring board, are bonded onto the surfaces of the respective through holes 8a as shown in FIG. 26.

The second TCP1B is multilayered at an upper portion of the first TCP1A. The TCP1A and TCP1B are bonded tight to each other by an adhesive 10 applied to alignment surfaces of the two. The second chip AD sealed with the TCP1B is placed within a device hole 3b defined in a central portion of a tap carrier 2b with its principal surface directed downward. Further, the second chip AD is electrically connected to one ends (inner lead portions) of leads 5b formed over the whole surface of the tape carrier 2b. A potting resin 6 for protecting an LSI (DRAM on-chip logic) formed over the major surface of the chip AD from external environments is placed on the principal surface of the chip AD.

The outside dimension of the tape carrier 2b of the TCP1B is identical to that of the tape carrier 2a of the TCP1A. Since the outside dimension of the chip AD is smaller than that of the chip MF, the size of the device hole 3b of the tape carrier 2b becomes correspondingly smaller than that of the device hole 3a of the tape carrier 2a.

Figure 28:
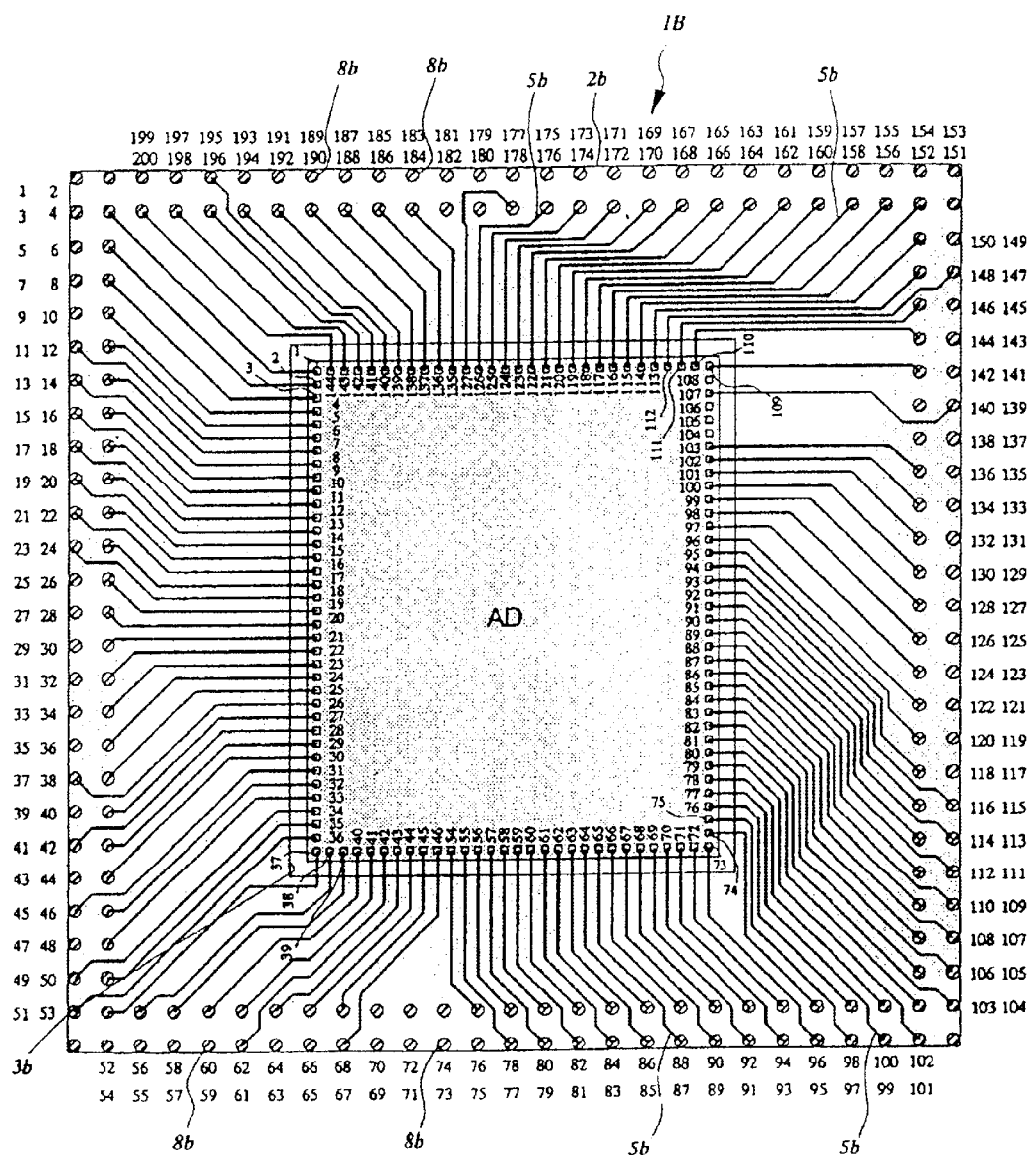

The leads 5b formed over the whole surface of the tape carrier 2b have patterns shown in FIG. 28 respectively. The other ends of the respective leads 5b, are electrically connected to through holes 8b each extending through one surface to the other surface of the tape carrier 2b. These through holes 8b are identical to the through holes 8a of the tape carrier 2a and placed in two rows along the four sides of the tape carrier 2b. The through holes 8a of the tape carrier 2a and the through holes 8b of the tape carrier 2b are formed in the same number and with the same pitch. Further, the through holes 8a and 8b, which face each other when the tape carriers 2a and 2b are superimposed on one another, are placed so as to be accurately superimposed on each other. Solder 11 has been charged into the through holes 8a and 8b. The opposite through holes 8a and 8b are electrically connected to one another with the solder 11 interposed therebetween.

The multilayered TCP according to the present embodiment has a structure in which connecting terminals (pins) shared (i.e., having the same function) between the two chips MF and AD are electrically connected to each other via the through holes 8a and 8b of the tape carriers 2a and 2b, which are placed in the same positions, and they are commonly withdrawn to the outside (printed wiring board) through the solder pumps 9 bonded to one ends of the through holes 8a.

FIG. 27 is given numbers (1 through 144) of the connecting terminals formed in the chip MF and numbers (1 through 200) of the through holes 8a defined in the tape carrier 2a. Further, numbers (1 through 144) of the connecting terminals formed in the chip AD and numbers (1 through 200) of the through holes 8b defined in the tape carrier 2b are assigned to FIG. 28. The through holes 8a and 8b of the tape carriers 2a and 2b, which are placed in the same positions, are identified by the same numbers respectively.

One example illustrative of the layout of the connecting terminals and the through holes 8a and 8b of the chips MF and AD is shown in Table 1. In Table 1, numbers (1 through 144) indicated in the columns of MFpin# correspond to the numbers (1 through 144) of the connecting terminals of the chip MF shown in FIG. 27, whereas numbers (1 through 144) indicated in the columns of ADpin# correspond to the numbers (1 through 144) of the connecting terminals of the chip AD shown in FIG. 28. Further, numbers indicated in the columns of Via# correspond to the numbers assigned to the connecting terminals common to either one of the chips MF and AD or both, of the numbers (1 through 200) of the through holes 8a and 8b shown in FIGS. 27 and 28.

TABLE 1

| Via# | MFpin# | ADpin# |
|---|---|---|
| 3 | 1 | |
| 4 | | 1 |
| 5 | 2 | |
| 6 | | 2 |
| 7 | 3 | |
| 8 | | 3 |
| 10 | 4 | 4 |
| 9 | 5 | |
| 12 | | 5 |
| 11 | 6 | 6 |
| 14 | 7 | 7 |
| 13 | 8 | 8 |
| 16 | 9 | 9 |
| 15 | 10 | 10 |
| 18 | 11 | 11 |
| 17 | 12 | 12 |
| 20 | 13 | 13 |
| 19 | 14 | 14 |
| 22 | 15 | 15 |
| 21 | 16 | 16 |
| 24 | 17 | 17 |
| 23 | 18 | 18 |
| 26 | 19 | 19 |
| 25 | 20 | |
| 28 | | 20 |
| 27 | 21 | |
| 30 | | 21 |
| 29 | 22 | |
| 32 | | 22 |
| 31 | 23 | |
| 34 | | 23 |
| 33 | 24 | |
| 36 | | 24 |
| 35 | 25 | |
| 38 | | 25 |
| 37 | 26 | 26 |
| 39 | 27 | |
| 40 | | 27 |
| 41 | 28 | 28 |
| 42 | 29 | 29 |
| 43 | 30 | |
| 44 | | 30 |
| 45 | 31 | 31 |
| 46 | 32 | 32 |
| 47 | 33 | |
| 48 | | 33 |
| 49 | 34 | 34 |
| 50 | 35 | 35 |
| 51 | 36 | 36 |
| 54 | 37 | |
| 52 | | 37 |
| 55 | 38 | |
| 56 | | 38 |
| 57 | 39 | |
| 58 | | 39 |
| 60 | 40 | 40 |
| 59 | 41 | |
| 62 | | 41 |
| 61 | 42 | 42 |
| 63 | 43 | |
| 64 | | 43 |
| 65 | 44 | |
| 66 | | 44 |
| 68 | 45 | 45 |
| 67 | 46 | 46 |
| 70 | 47 | |
| 69 | 48 | |
| 72 | 49 | |
| 71 | 50 | |
| 74 | 51 | |
| 73 | 52 | |
| 75 | 53 | |
| 76 | 54 | 54 |
| 77 | 55 | 55 |
| 78 | 56 | 56 |
| 79 | 57 | 57 |
| 80 | 58 | 58 |
| 81 | 59 | 59 |
| 82 | 60 | 60 |
| 83 | 61 | 61 |
| 84 | 62 | 62 |
| 85 | 63 | 63 |
| 86 | 64 | 64 |
| 87 | 65 | 65 |
| 88 | 66 | 66 |
| 89 | 67 | 67 |
| 90 | 68 | 68 |
| 91 | 69 | 69 |
| 92 | 70 | 70 |

TABLE 1-continued

| Via# | MFpin# | ADpin# |
|---|---|---|
| 93 | 71 | 71 |
| 94 | 72 | 72 |
| 95 | 73 | 73 |
| 96 | 74 | 74 |
| 97 | 75 | 75 |
| 98 | 76 | 76 |
| 99 | 77 | 77 |
| 100 | 78 | 78 |
| 101 | 79 | 79 |
| 102 | 80 | 80 |
| 104 | 81 | 81 |
| 106 | 82 | 82 |
| 105 | 83 | 83 |
| 108 | 84 | 84 |
| 107 | 85 | 85 |
| 110 | 86 | 86 |
| 109 | 87 | 87 |
| 112 | 88 | 88 |
| 111 | 89 | 89 |
| 114 | 90 | 90 |
| 113 | 91 | 91 |
| 116 | 92 | 92 |
| 115 | 93 | 93 |
| 117 | 94 | |
| 118 | | 94 |
| 119 | 95 | |
| 120 | | 95 |
| 121 | 96 | |
| 122 | | 96 |
| 123 | 97 | |
| 124 | | 97 |
| 125 | 98 | |
| 126 | | 98 |
| 128 | 99 | 99 |
| 127 | 100 | |
| 130 | | 100 |
| 129 | 101 | |
| 132 | | 101 |
| 131 | 102 | |
| 134 | | 102 |
| 133 | 103 | |
| 136 | | 103 |
| 135 | 104 | 104 |
| 138 | 105 | 105 |
| 137 | 106 | 106 |
| 139 | 107 | 107 |
| 140 | 108 | 108 |
| 141 | 109 | |
| 142 | | 109 |
| 143 | 110 | |
| 144 | | 110 |
| 145 | 111 | |
| 146 | | 111 |
| 147 | 112 | 112 |
| 149 | 113 | |
| 148 | | 113 |
| 151 | 114 | |
| 150 | | 114 |
| 154 | 115 | |
| 152 | | 115 |
| 155 | 116 | |
| 156 | | 116 |
| 158 | 117 | 117 |
| 157 | 118 | |
| 160 | | 118 |
| 159 | 119 | |
| 162 | | 119 |
| 161 | 120 | |
| 164 | | 120 |
| 163 | 121 | |
| 166 | | 121 |
| 165 | 122 | |
| 168 | | 122 |
| 167 | 123 | |
| 170 | | 123 |
| 169 | 124 | |
| 172 | | 124 |
| 171 | 125 | |
| 174 | | 125 |
| 173 | 126 | |
| 176 | | 126 |
| 175 | 127 | |
| 177 | 128 | |
| 178 | 129 | 129 |
| 179 | 130 | |
| 180 | 131 | |
| 181 | 132 | |
| 182 | 133 | |
| 183 | 134 | |
| 184 | 135 | 135 |
| 185 | 136 | |
| 186 | | 136 |
| 187 | 137 | |
| 188 | | 137 |
| 189 | 138 | |
| 190 | | 138 |
| 191 | 139 | |
| 192 | | 139 |
| 193 | 140 | |
| 194 | | 140 |
| 195 | 141 | 141 |
| 197 | 142 | |
| 196 | | 142 |
| 199 | 143 | |
| 198 | | 143 |
| 2 | 144 | |
| 200 | | 144 |

As shown in FIGS. 27 and 28, the connecting terminals common to the chips MF and AD are placed substantially in the same positions of the chips MF and AD. Thus, since the routing of the leads 5a and 5b of the tape carriers 2a and 2b becomes easy and the length of each lead can be shortened, the transfer of data between the chips MF and AD can be speeded up. Since the required numbers of through holes 8a and 8b can be minimized, the tape carriers 2a and 2b can be reduced in outside dimensions and the package can be brought into less size.

Although not limited in particular, the respective members constituting the multilayered TCP according to the present embodiment are constructed of the following materials and by the following dimensions.

Each of the tape carriers 2a and 2b is made up of a polyimide film having a thickness of 75 μm. Each of the leads 5a and 5b is comprised of Cu (copper) foil having a thickness of 18 μm. The surfaces of one ends (inner lead portions) of the leads 5a and 5b are given Au (gold) or Sn (tin) plating respectively. The adhesive 10 is composed of polyimide and the thickness thereof is 12 μm. The solder resist 7 is composed of an epoxy resin and the thickness thereof is 20 μm. The solder bumps 9 corresponding to the external connecting terminals and the solder 11 lying within each of the through holes 8a and 8b is composed of an alloy of lead (Pb) and tin (Sn). Each of the chips MF and AD is composed of monocrystalline silicon having a thickness of 50 μm and the potting resin 6 for protecting their principal surfaces is composed of the epoxy resin. Each individual bump electrodes 4 formed over the principal surfaces of the chips MF and AD are respectively composed of Au and their heights are 20 μm. That is, since the total thickness of the chip MF and each bump electrode 4 is thinner than the thickness of the tape carrier 2a and the total thickness of the chip AD and each bump electrode 4 is thinner than the thickness of the tape carrier 2b, the multilayered TCP is brought to an ultra-thin package in which the thickness in a multilayered direction, of the portion excluding the solder bumps 9 is 218 µm.

A method of manufacturing the multilayered TCP according to the present embodiment will next be explained with reference to FIGS. 29 through 37. Incidentally, FIGS. 29(a) through 33(a) are respectively cross-sectional views of TCP1B and FIGS. 29(b) through 37(b) are respectively cross-sectional views of TCP1A.

Tape carriers 2a and 2b each composed of the polyimide film are first prepared as shown in FIG. 29. They are punched to define a device hole 3a and a through hole 8a in the tape carrier 2a and define a device hole 3b and a through hole 8b in the tape carrier 2b. While these tape carriers 2a and 2b are respectively provided as longer films wound around reels, only their parts (corresponding to respective ones of TCP1A and TCP1B) are shown in the drawing.

Next, Cu foil is laminated over the respective one surfaces of the tape carriers 2a and 2b as shown in FIG. 30. Thereafter, the Cu foil is subjected to wet etching to form each lead 5a on the tape carrier 2a and form each lead 5b on the tape carrier 2b. Simultaneously, Cu foil holes 12a are defined in one ends of the through holes 8a and Cu foil holes 12b are defined in one ends of the through holes 8b. To ensure the areas where the solder (11) charged inside the through holes 8a and 8b and the leads 5a and 5b come into contact with each other and prevent breaks in through hole in the subsequent process steps, the diameter of each Cu foil hole 12a is set smaller than that of each through hole 8a and the diameter of each Cu foil hole 12b is set smaller than that of each through hole 8b. Since the Cu foil is low in thermal expansion coefficient and high in dimension stability as compared with the tape carriers 2a and 2b composed of the polyimide, the positioning of the tape carriers at the time that the tape carrier 2a and the tape carrier 2b are superimposed or overlaid on one another using the through holes 8a and 8b in the subsequent process steps, can be performed with high accuracy if the diameters of the Cu foil holes 12a and 12b are set smaller than those of the through holes 8a and 8b.

Next, the surface of one end (inner lead portion) of each lead 5a, which projects into the device hole 3a of the tape carrier 2a, and the surface of one end (inner lead portion) of each lead 5b, which protrudes into the device hole 3b of the tape carrier 2b, are given Au or Sn plating by an electrolytic plating method as shown in FIG. 31. Thereafter, a solder resist 7 is applied to the lower surface of the tape carrier 2a and an adhesive 10 is applied to the lower surface of the tape carrier 2b.

Figure 32:
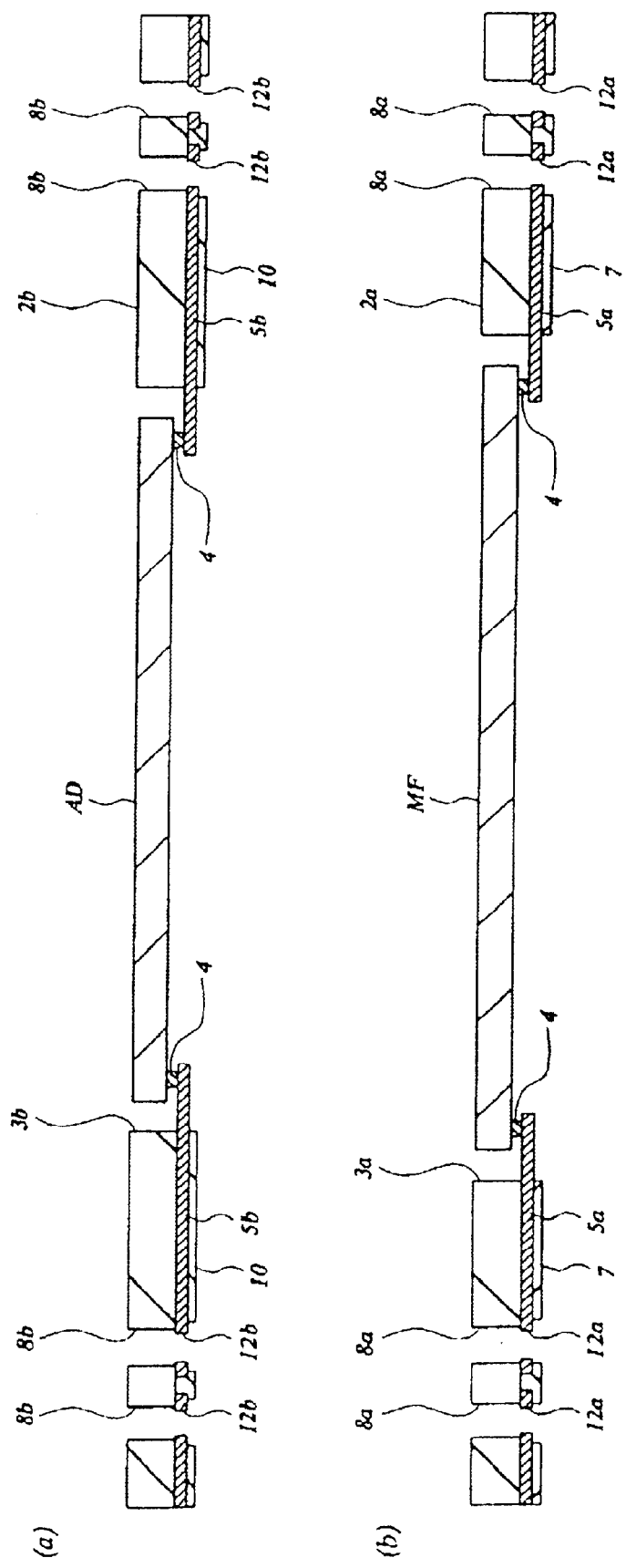

The bump electrodes 4 and the leads 5a of the tape carrier 2a formed at the connecting terminals of the chip MF are collectively connected to one another by a gang bonding method as shown in FIG. 32. Further, the bump electrodes 4 and the leads 5b of the tape carrier 2b formed at the connecting terminals of the chip AD are collectively connected to one another by the gang bonding method. After the backs of the chips MF and AD have been polished in advance in a wafer state, their thicknesses are set thin up to 50 µm by spin etching. The bump electrodes 4 are formed in a final process step of a wafer process by using a stud bump boding method. Since the inner lead portions of the leads 5a and 5b are given Au or Sn plating, the leads 5a and the bump electrodes 4, and the leads 5b and the bump electrodes 4 are respectively joined to one another by an Au—Au junction or an Au—Sn eutectic junction. The junctions between the leads 5a and 5b and the bump electrodes 4 may be done by a single point bonding method as an alternative to the gang bonding method respectively.

Figure 33:
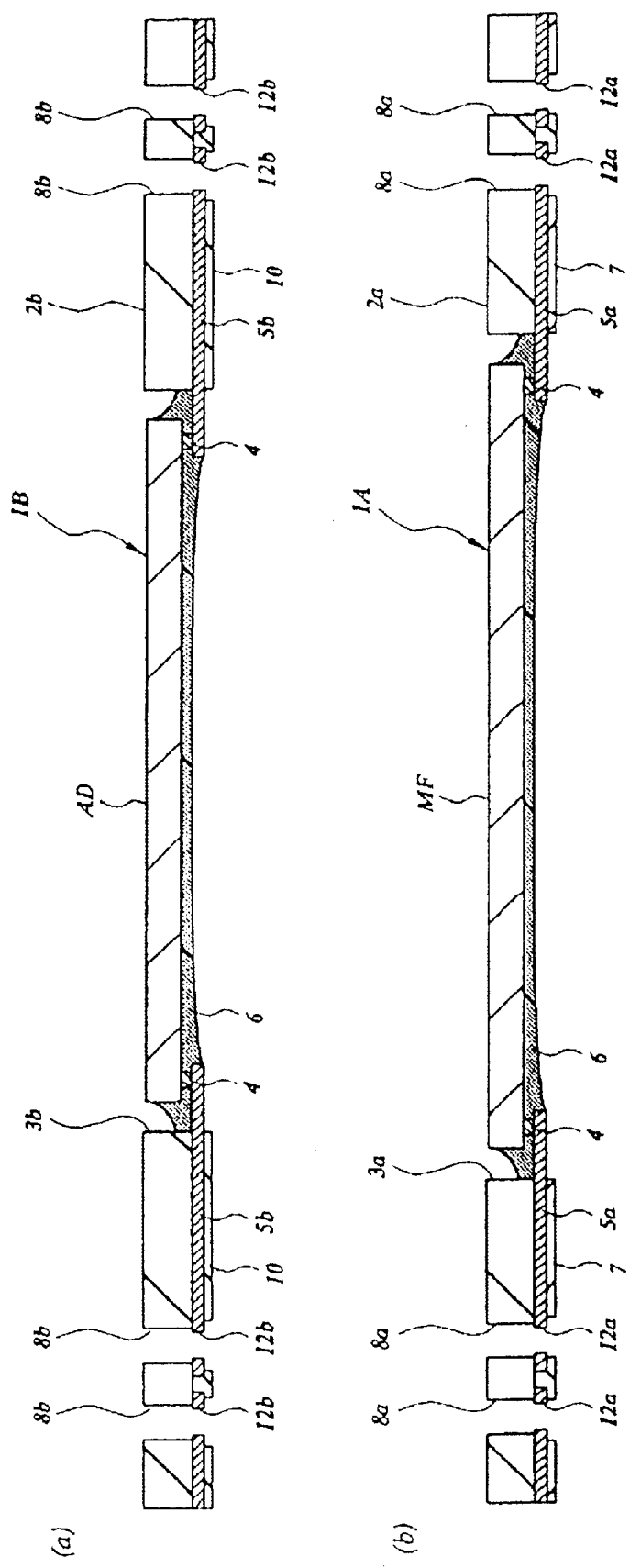

A potting resin 6 is inserted into a clearance defined by the principal surface of the chip MF and the tape carrier 2a and each device hole 3a thereof by using a resin potting dispenser as shown in FIG. 33. Similarly, the potting resin 6 is put into a clearance defined by the principal surface of the chip AD and the tape carrier 2b and each device hole 3b thereof.

Next, the longer tape carriers 2a and 2b are divided into pieces or fractions by using a cutting die. Thereafter, each individual tape carriers 2a and 2b are mounted into their corresponding sockets and subjected to an aging test, thereby selecting good products or items. The aging of the tape carriers 2a and 2b is performed while pins for the sockets are being applied or tapped onto testing pads formed at respective portions of the tape carriers 2a and 2b. The TCP1A in which the chip MF is sealed and the TCP1B in which the chip AD is sealed, are substantially completed in the process steps used up to now.

Figure 34:
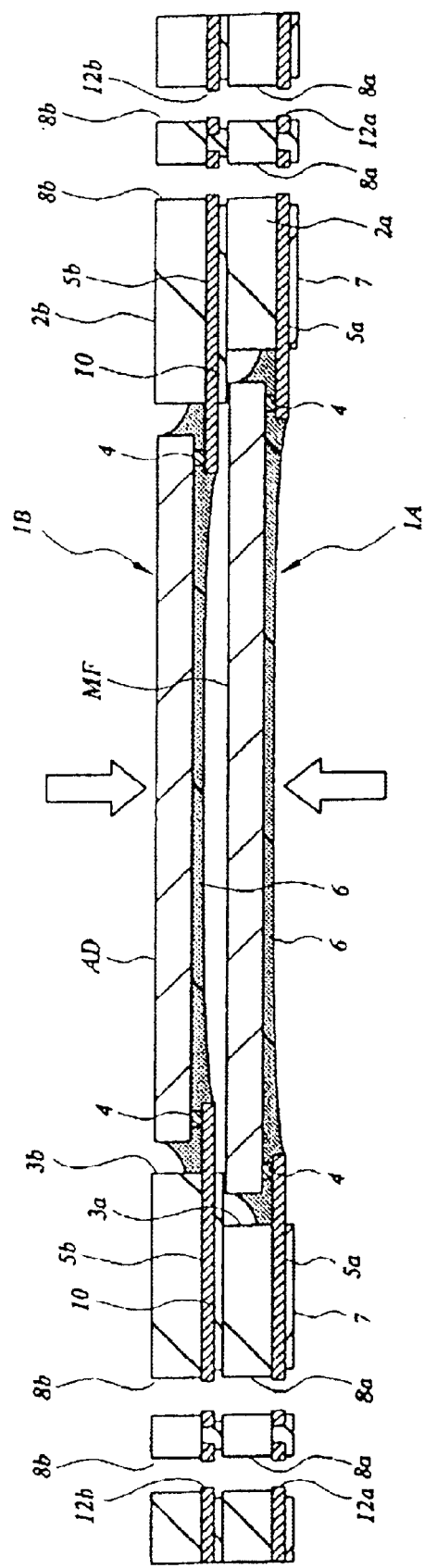

Next, the tape carriers 2a and 2b are superimposed on one another so that the opposed through holes 8a and 8b accurately coincide in position with one another as shown in FIG. 34. Further, the tape carriers 2a and 2b are heated and crimped and thereafter bonded to each other with the adhesive 10, whereby the TCP1A and TCP1B are brought into one package. Since the chip MF is thinner than the tape carrier 2a and the chip AD is thinner than the tape carrier 2b as described above, the TCP1A and TCP1B can be bonded tight to each other. The above-described Cu foil holes 12a and 12b are used for the positioning of the through holes 8a and 8b. Alternatively, the testing pads provided at the respective parts of the tape carriers 2a and 2b may be used therefor.

Figure 35:
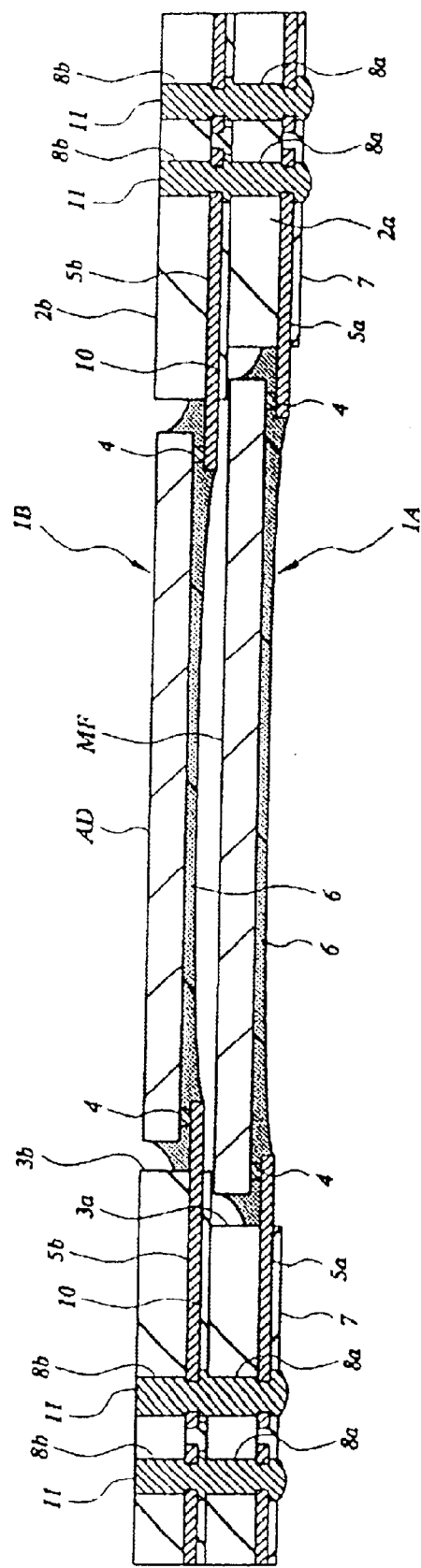
Figure 36:
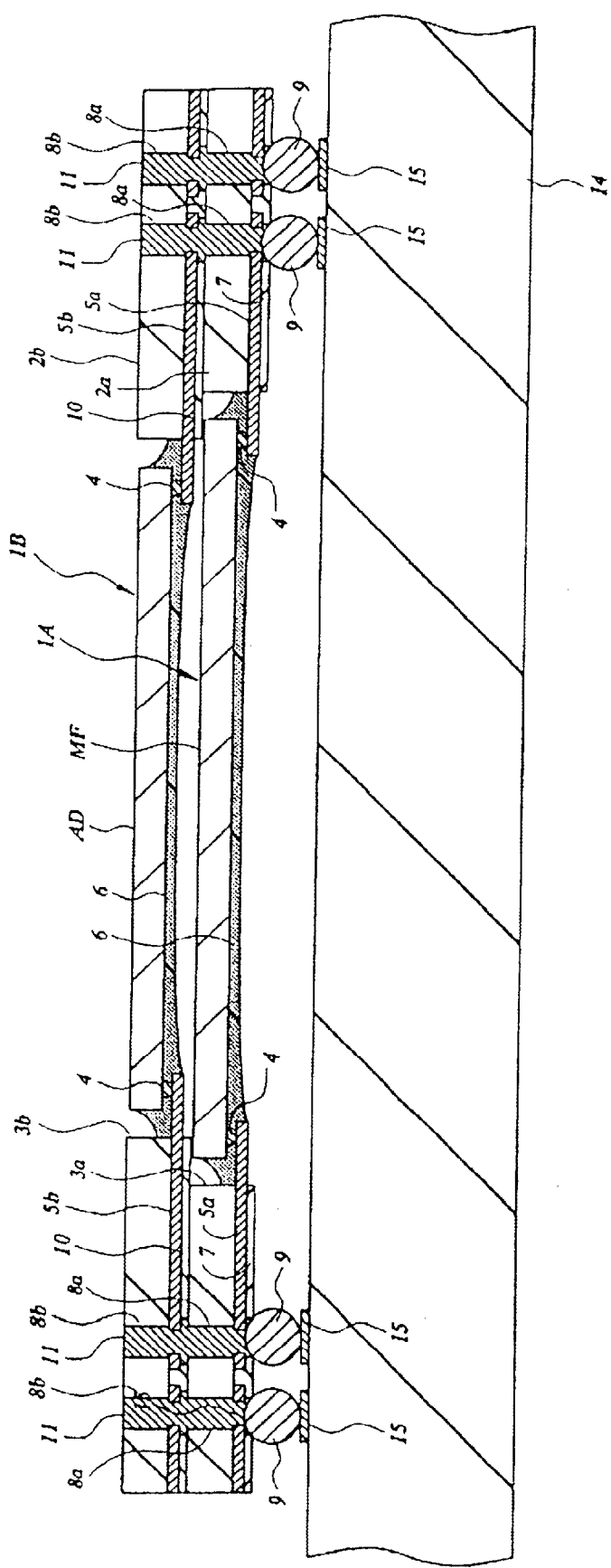

Next, solder paste composed of a lead (Pb)—tin (Sn) alloy is embedded into the through holes 8a and 8b by a screen printing method as shown in FIG. 35. Thereafter, the solder paste is caused to re-flow to thereby form solder 11.

Afterwards, solder bumps 9 are formed at one ends of the through holes 8a of the tape carrier 2a, whereby the multilayered or stacked TCP shown in FIGS. 1 and 2 can be completed. The solder bumps 9 are formed by positioning pre-formed solder balls on their corresponding through holes 8a in a state in which solder bump forming surfaces of the tape carrier 2a are being turned upward and thereafter re-flowing the solder balls. Alternatively, the solder balls 9 may be formed by transferring solder bumps placed on the surface of a glass substrate to the surfaces of the through holes 8a. Each solder bump 9 is composed of a lead (Pb)—tin (Sn) alloy lower in melting point than the solder 11 charged into the through holes 8a and 8b.

In order to implement the multilayered TCP manufactured in this way in the printed wiring board, the solder bumps 9 are positioned on their corresponding electrodes 15 of the printed wiring board 14 and thereafter the solder bumps 9 may be caused to reflow.

Since heat produced from the chips MF and AD escapes to the substrate through the solder bumps 9 principally in the multilayered TCP according to the present embodiment, the corresponding chip higher in the amount of produced heat is placed on the lower side (on the side near the substrate) when the TCP1A and the TCP1B are stacked together. Since the chip MF formed with the microcomputer equipped with the flash memory is greater than the chip AD formed with the DRAM on-chip logic in the number of functional blocks and larger than the chip AD in the amount of produced heat in the above-described example, the chip MF is placed on the lower side of the chip AD. Further, the placement of the corresponding chip large in the number of connecting terminals on the lower side (substrate side) makes it easy to route wires or interconnections for connecting the connecting terminals of the corresponding chip and their corresponding external connecting terminals.

In the system on-chip designed multilayered module large in the amount of produced head in this way, each memory cell of the DRAM formed in the chip AD may preferably adopt a stacked capacitor (STC) structure. This is because the stacked capacitor structure is reduced in thermal leakage current and high in thermal reliability as compared with a planar capacitor structure. Further, the stacked capacitor structure can also reduce the amount of produced heat because a reference cycle therefor can be lengthened.

Figure 37:
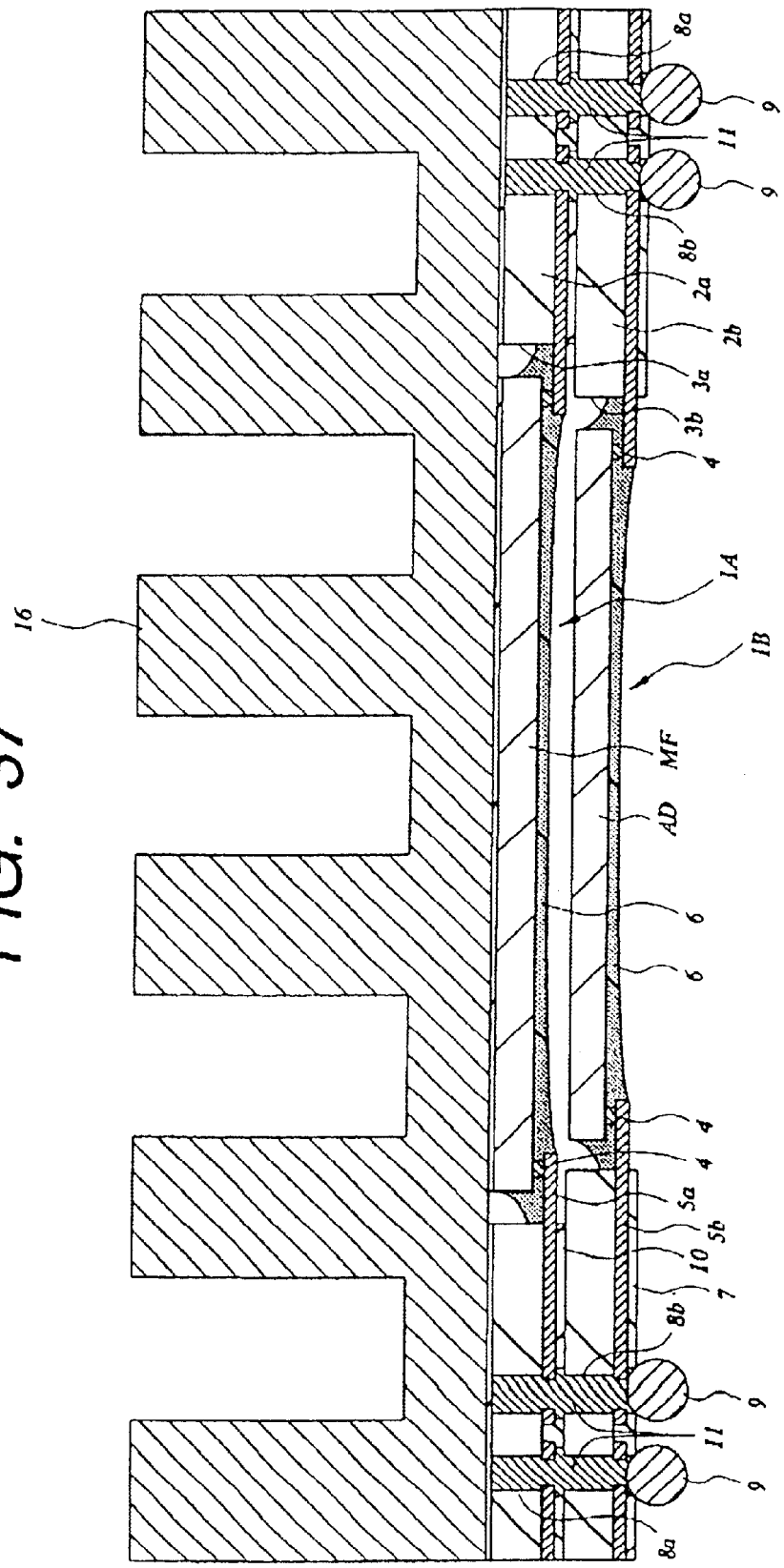

When the amount of heat produced by the chip is so large, a radiation fin 16 composed of a metal such as Al having a high thermal conductivity may be attached to the upper portion of the multilayered TCP as shown in FIG. 37. In this case, a chip MF whose produced amount of heat is large, is placed on an upper portion (on the side near the radiation fin 16) of a chip AD.

Another embodiment of the package according to the present invention will next be described.

While the respective solder 11 have been embedded into the opposite through holes 8a and 8b after the TCP1A and TCP1B have been superimposed on one another in the above-described manufacturing method (see FIGS. 34 and 35), the TCP1A and TCP1B may be brought or combined into one package according to the following method.

Figure 38:
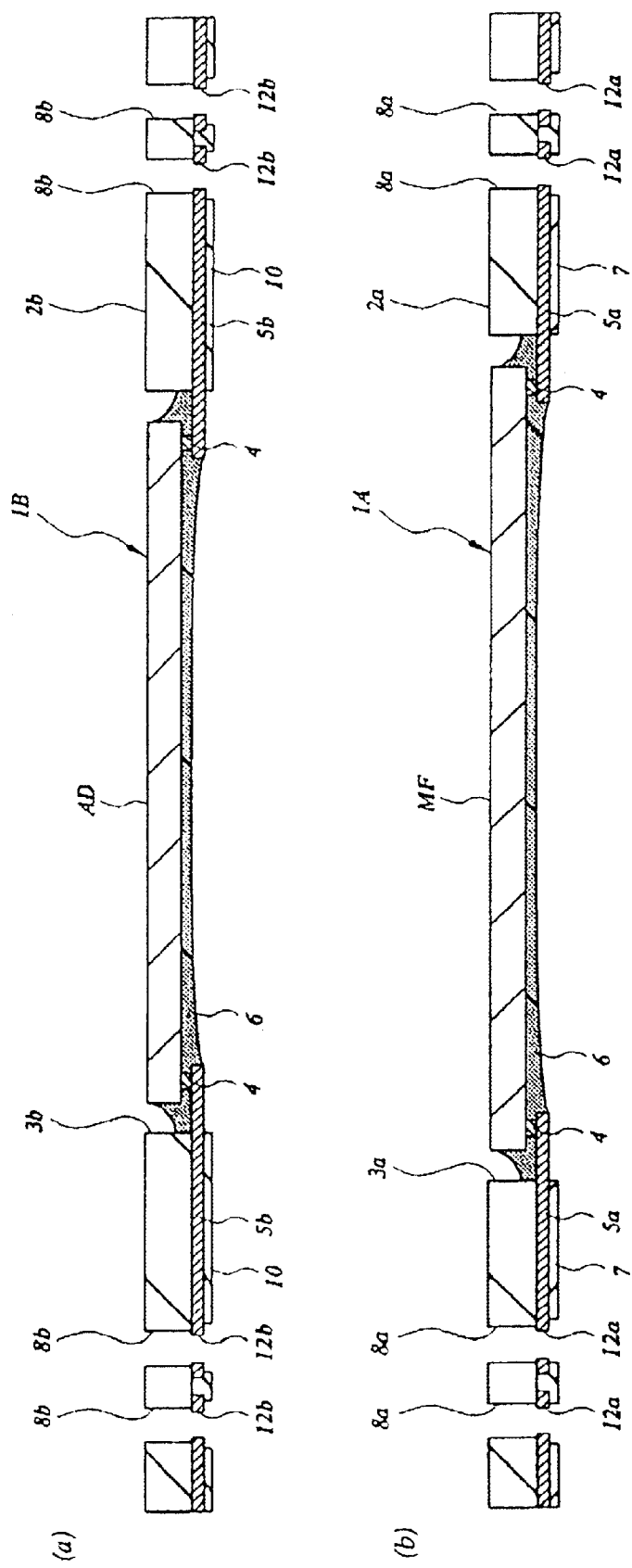
Figure 39:
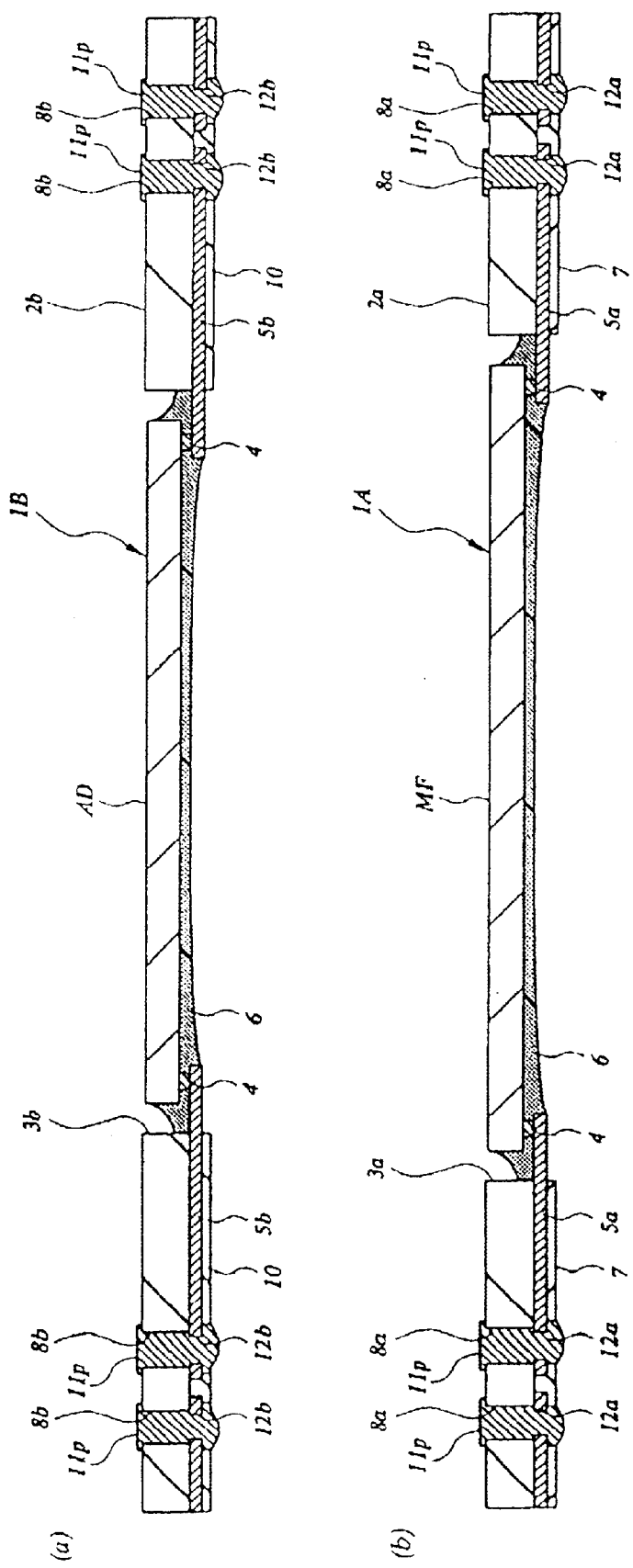

First of all, a TCP1A and a TCP1B are individually formed as shown in FIG. 38 in accordance with the aforementioned method. Next, as shown in FIG. 39, solder paste 11p is embedded into each through hole 8a of the TCP1A and the solder paste 11p is embedded into each through hole 8b of the TCP1B, respectively. A screen printing method is used for the embedding of the solder paste 11p thereinside.

Figure 40:
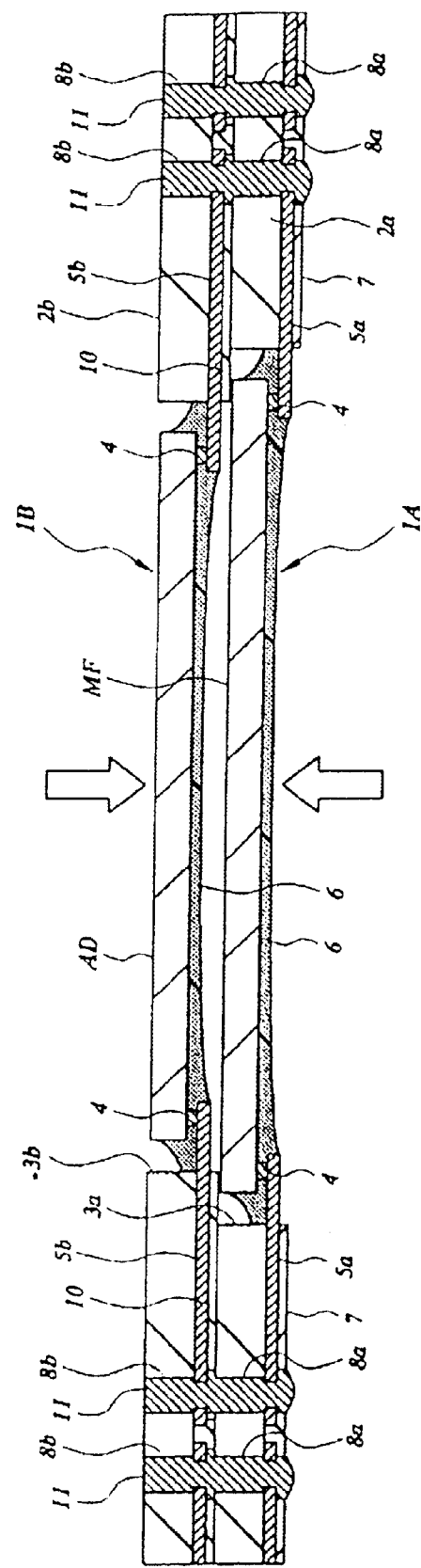

Next, as shown in FIG. 40, tape carriers 2a and 2b are superimposed on one another and heated and pressed under pressure. Thereafter, the two are bonded to each other with an adhesive 10. Further, the solder paste 11p is caused to re-flow to thereby form solder 11 inside the through holes 8a and 8b. The subsequent process steps are identical to those employed in the above-described manufacturing method.

According to the present manufacturing method, since the TCP1A and TCP1B are tacked with an adhesive strength, the opposed through holes 8a and 8b can be prevented from being displaced in position during a period in which the superimposed TCP1A and TCP1B are transferred to a heating furnace or the like where they are heated and pressed under pressure As another method of forming the through holes 8a and 8b, the tape carriers 2a and 2b are superimposed on one another to bring the TCP1A and TCP1B into one package. Thereafter, holes are defined in the tape carriers 2a and 2b by a drill. Next, conductive layers may be formed inside the holes by an electroless plating method.

Figure 41:
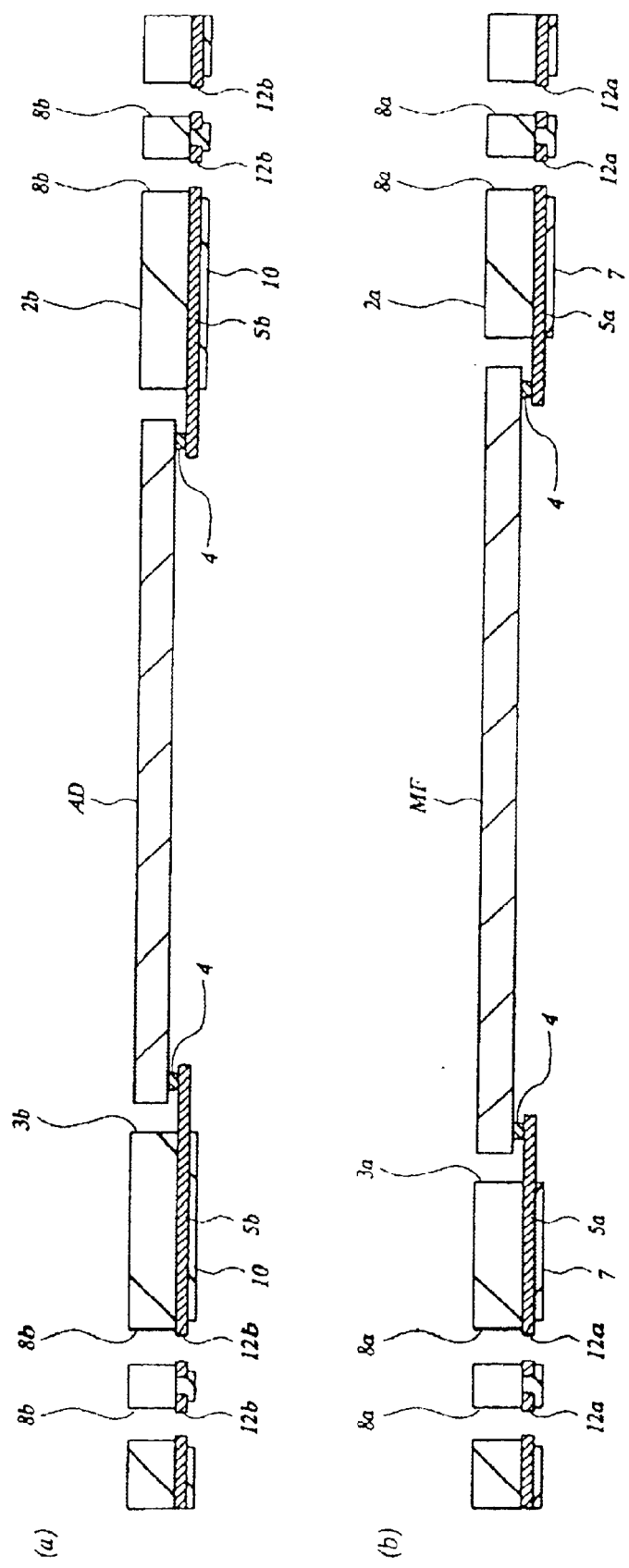

Further, the sealing of the chips MF and AD can be also performed by a transfer mold method as an alternative to the above-described potting method. In this case, the bump electrodes 4 of the chip MF and the leads 5a of the tape carrier 2a are first respectively electrically connected to one another in accordance with the aforementioned method, and the bump electrodes 4 of the chip AD and the leads 5b of the tape carrier 2b are next respectively electrically connected to one another, as shown in FIG. 41.

Figure 42:
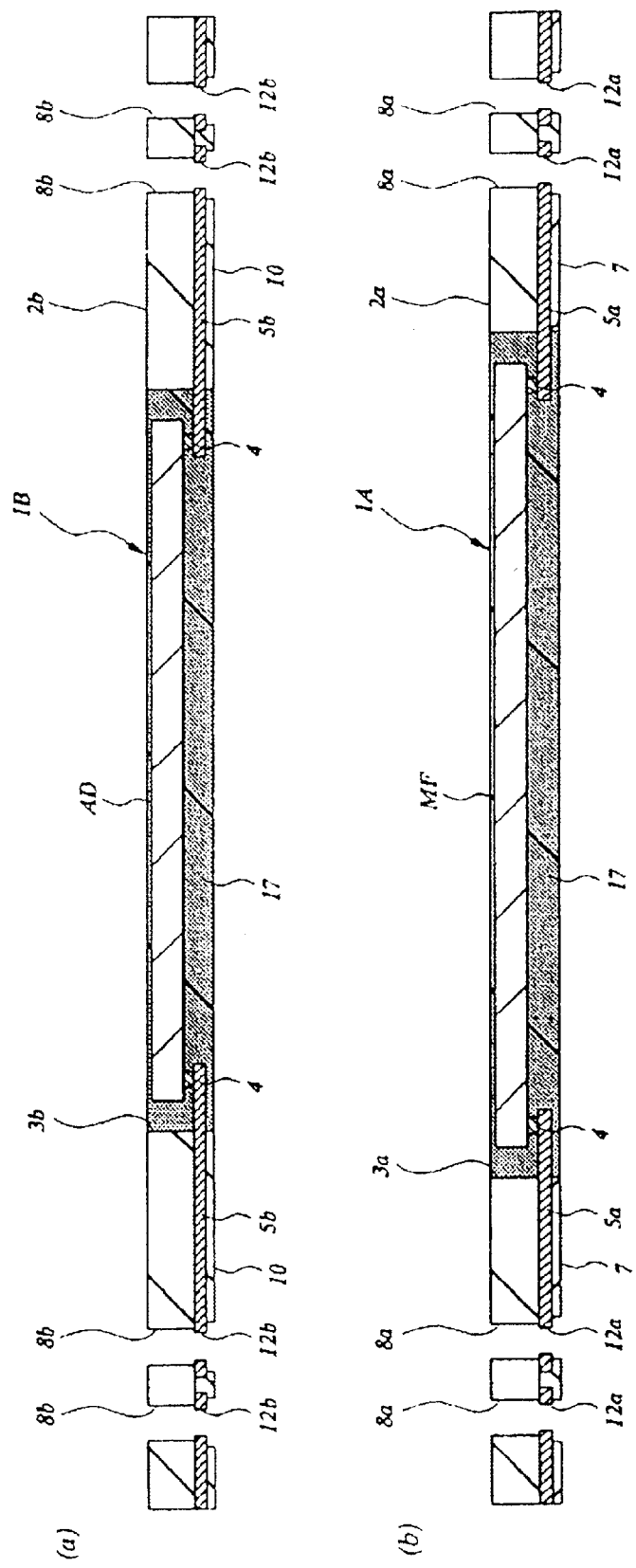

Next, the chips MF and AD are sealed with a mold resin 17 as shown in FIG. 42. In order to seal the respective chips MF and AD, the tape carriers 2a and 2b are mounted to their corresponding molding dies and a plurality of chips MF and AD are respectively collectively sealed in multiple form. An epoxy resin is used as the mold resin 17.

The whole surfaces of the chips MF and AD are covered with the mold resin 17 in the illustrated example. However, the backs of the chips MF and AD may be set to such a structure as to be exposed from the mold resin 17. In that case, the normal transfer mold method is not utilized. That is, a resin processed in sheet form is applied to the upper surfaces of the tape carriers 2a and 2b and heated and pressed under pressure, whereby the resin may be poured into the main surfaces and sides of the chips MF and AD. However, this method needs to control the amount of casting of the resin with high accuracy so that the resin does not overflow from the upper surfaces of the tape carriers 2a and 2b.

In the package according to the present invention, the thickness of the mold resin 17 for sealing the chips MF and AD therewith is extremely thin. Thus, when the reverse sides of the chips MF and AD are exposed from the mold resin 17 and when there are differences between the thicknesses of the mold resins 17 formed over the main surfaces and backs of the chips MF and AD in a structure in which the whole surfaces of the chips MF and AD are covered with the mold resin 17, warpage occurs in the TCP1A and TCP1B if there is a difference in thermal expansion coefficient between each of the chips MF and AD and the mold resin 17, thereby causing chip cracks and connection failures at substrate implementation. It is thus necessary to select as the mold resin 17, a material low in thermal expansion coefficient and whose thermal expansion coefficient is close to the thermal expansion coefficients of the chips MF and AD.

Figure 43:
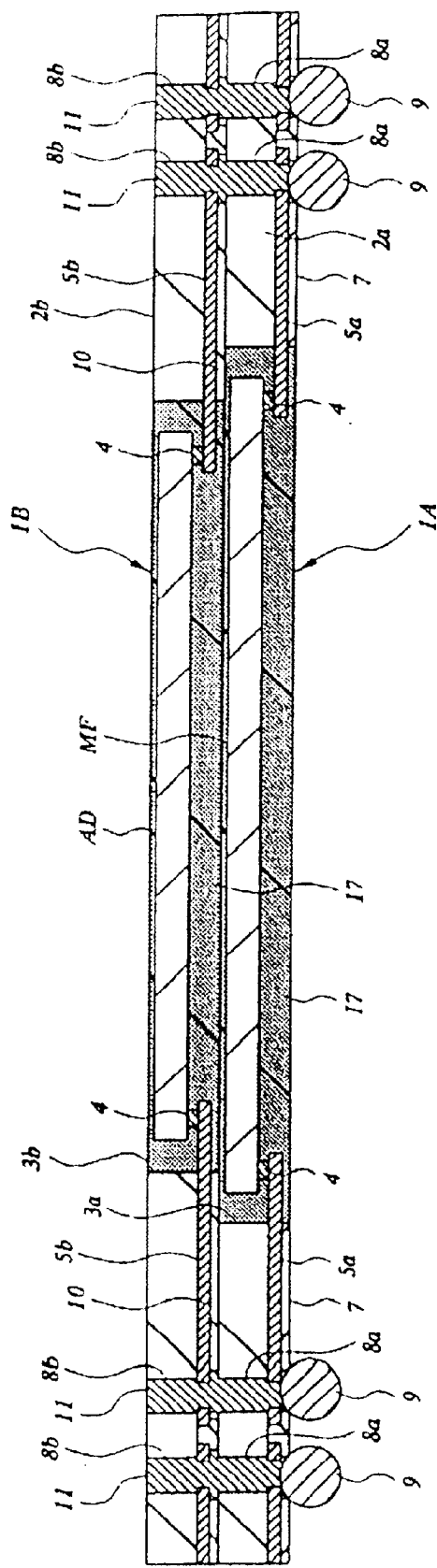
Figure 44:
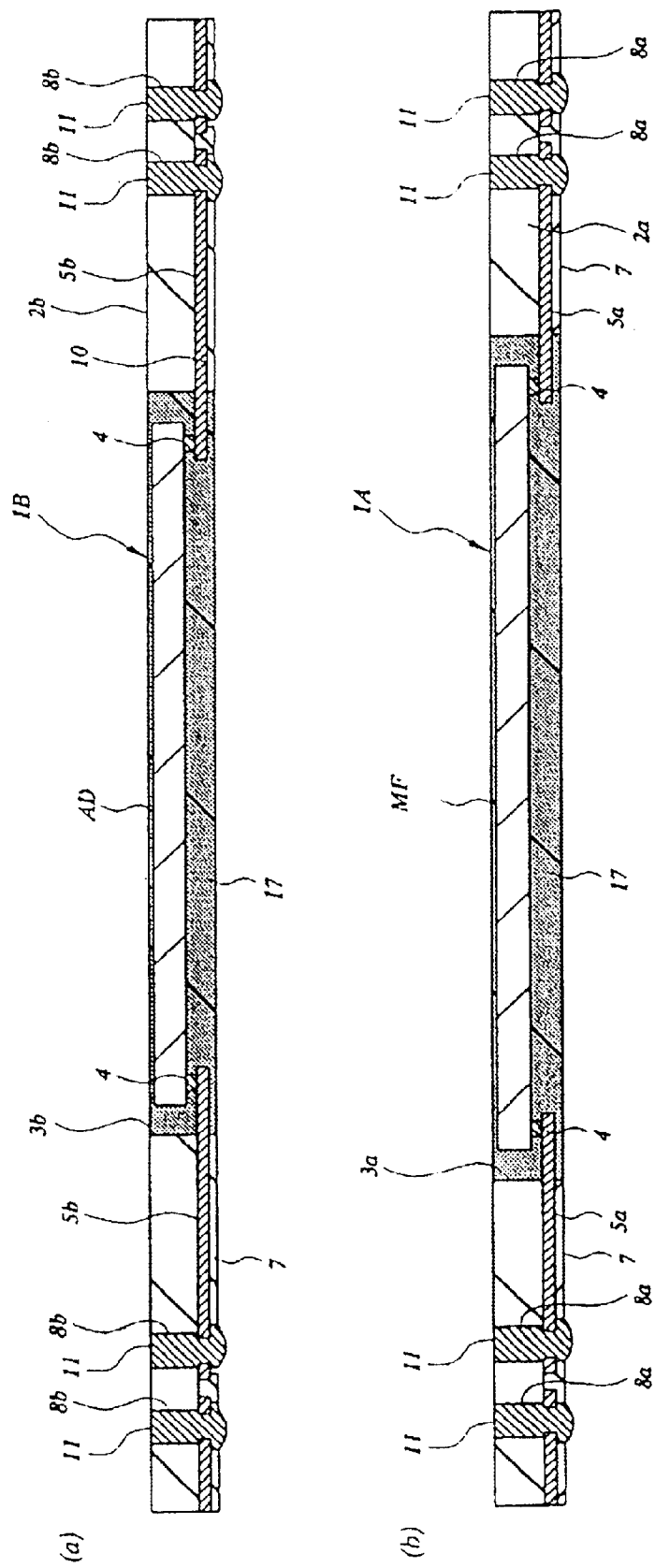

Next, the tape carriers 2a and 2b are divided into pieces by a cutting die. Each individual TCP1A and TCP1B are subjected to an aging test to thereby select good products or items. Thereafter, the tape carriers 2a and 2b are superimposed on one another so that opposed through holes 8a and 8b coincide in position with each other as shown in FIG. 43. Further, the so-superimposed tape carriers 2a and 2b are heated and pressed under pressure to thereby join the two with an adhesive 10. Afterwards, solder 11 is formed inside the through holes 8a and 8b in accordance with the aforementioned method. Further, solder bumps 9 are formed at one ends of the through holes 8a of the tape carrier 2a, whereby the corresponding stacked TCP is completed. Alternatively, a TCP1A and a TCP1B may be stacked on each other so as to be combined into one package after the solder 11 has been charged into the through holes 8a of the TCP1A and the through holes 8b of the TCP1B as shown in FIG. 44.

Figure 45:
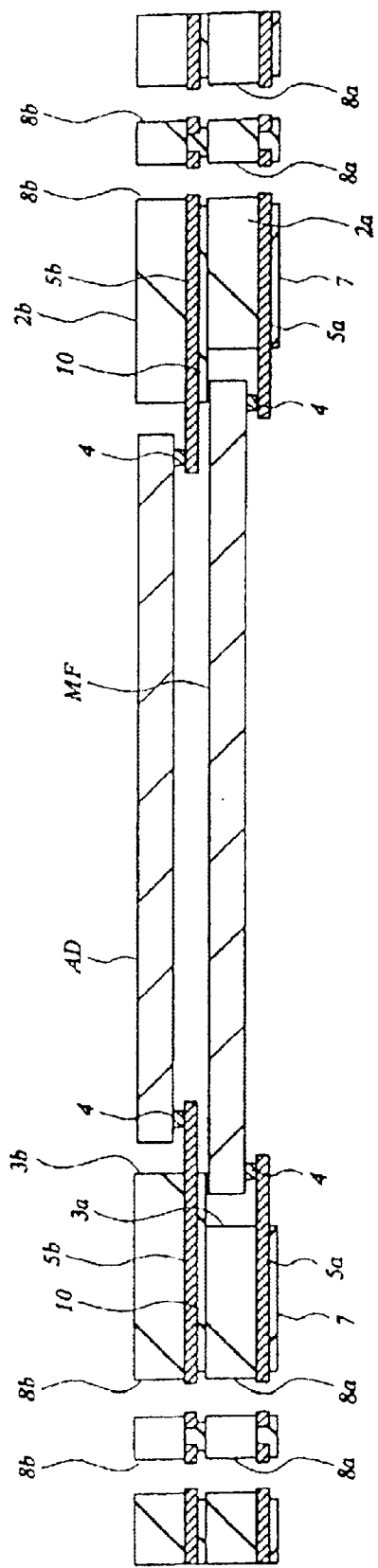
Figure 46:
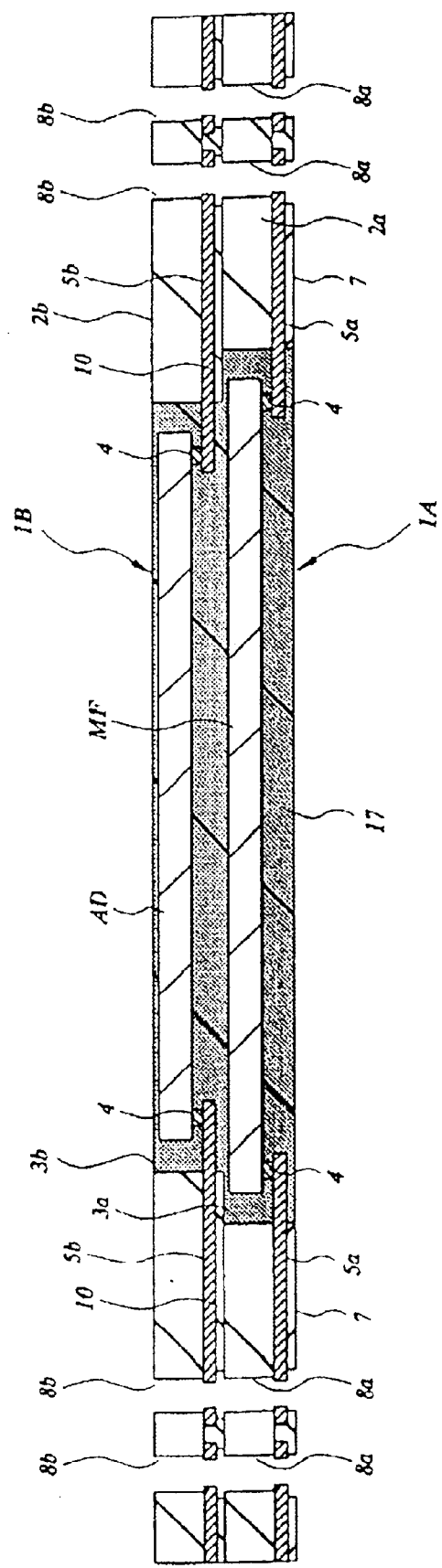
Figure 47:
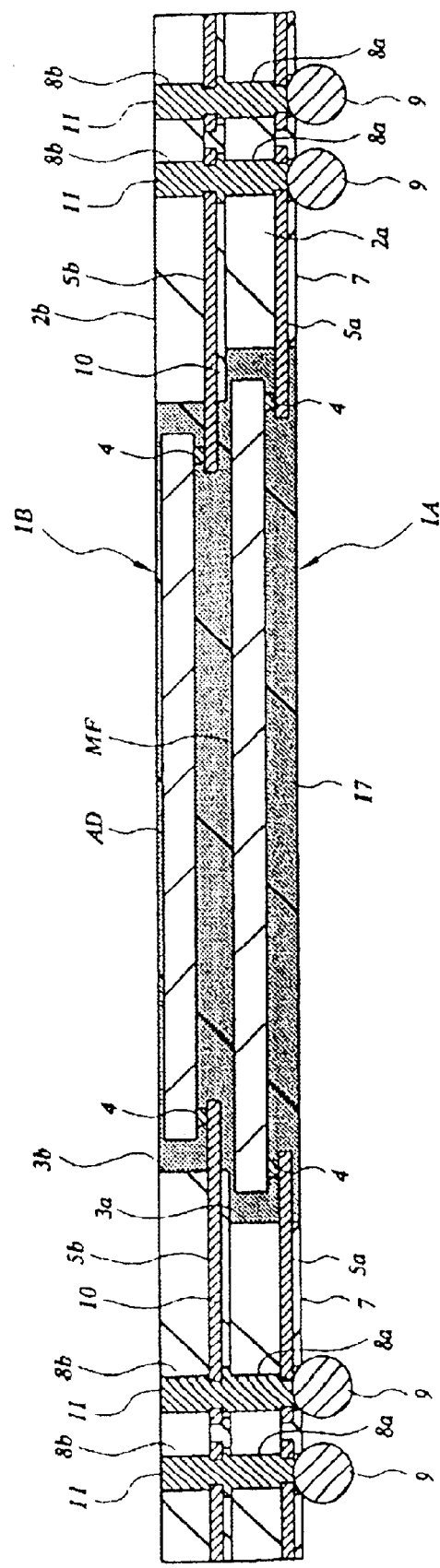

Both chips MF and AD may be simultaneously collectively sealed with a mold resin 17. In this case, as shown in FIG. 45, bump electrodes 4 of the chip MF and leads 5a of a tape carrier 2a are respectively electrically connected to one another in accordance with the aforementioned method, and bump electrodes 4 of the chip AD and leads 5b of a tape carrier 2b are respectively electrically connected to one another. Thereafter, the tape carriers 2a and 2b are superimposed on one another and heated and pressed under pressure, whereby the two are joined each other with an adhesive 10. Next, the chips MF and AD are simultaneously sealed with the mold resin 17 as shown in FIG. 46. Thereafter, the solder 11 is formed inside the through holes 8a and 8b according to the aforementioned method and the solder bumps 9 are formed at one ends of the through holes 8a of the tape carrier 2a, as shown in FIG. 47.

According to the above-described method of sealing the chips MF and AD with the mold resin 17, the accuracy of the outside dimension of each sealed portion is improved as compared with the method of sealing the chips MF and AD with the potting resin 6. It is therefore possible to manufacture a multilayered or stacked TCP high in dimension stability and uniform in shape. Further, a sealing time interval can be shortened by collectively sealing a plurality of chips MF and MD in multiple form. Moreover, since no clearance is defined between the TCP1A and TCP1B by setting the thickness of the mold resin 17 so as to be identical to the thicknesses of the tape carriers 2a and 2b, it is possible to prevent malfunctions such as gathering of moisture between the TCP1A and TCP1B, etc. and hence manufacture a multilayered TCP high in reliability.

The multilayered TCP according to the present invention may adopt a method of forming the external connecting terminals with the leads 5a and 5b as an alternative to the method of forming the external connecting terminals with the solder bumps 9. A method of manufacturing the present multilayered TCP will be explained with reference to FIGS. 48 through 53.

Tape carriers 2a and 2b each composed of a polyimide film are first punched to define a device hole 3a in the tape carrier 2a and define a device hole 3b in the tape carrier 2b as shown in FIG. 48. The above-described through holes 8a and 8b are not defined in these tape carriers 2a and 2b.

Next, as shown in FIG. 49, the leads 5a are formed on the tape carrier 2a and leads 5b are formed on the tape carrier 2b in accordance with the aforementioned method. The surfaces of one ends (inner lead portions) of these leads are given Au or Sn plating. Thereafter, a solder resist 7 is placed over the whole surface of the tape carrier 2a and an adhesive 10 is bonded to the whole surface of the tape carrier 2b. The leads 5a and 5b are formed to such lengths as to be able to utilize their other ends (outer lead portions) as external connecting terminals.

Figure 50:
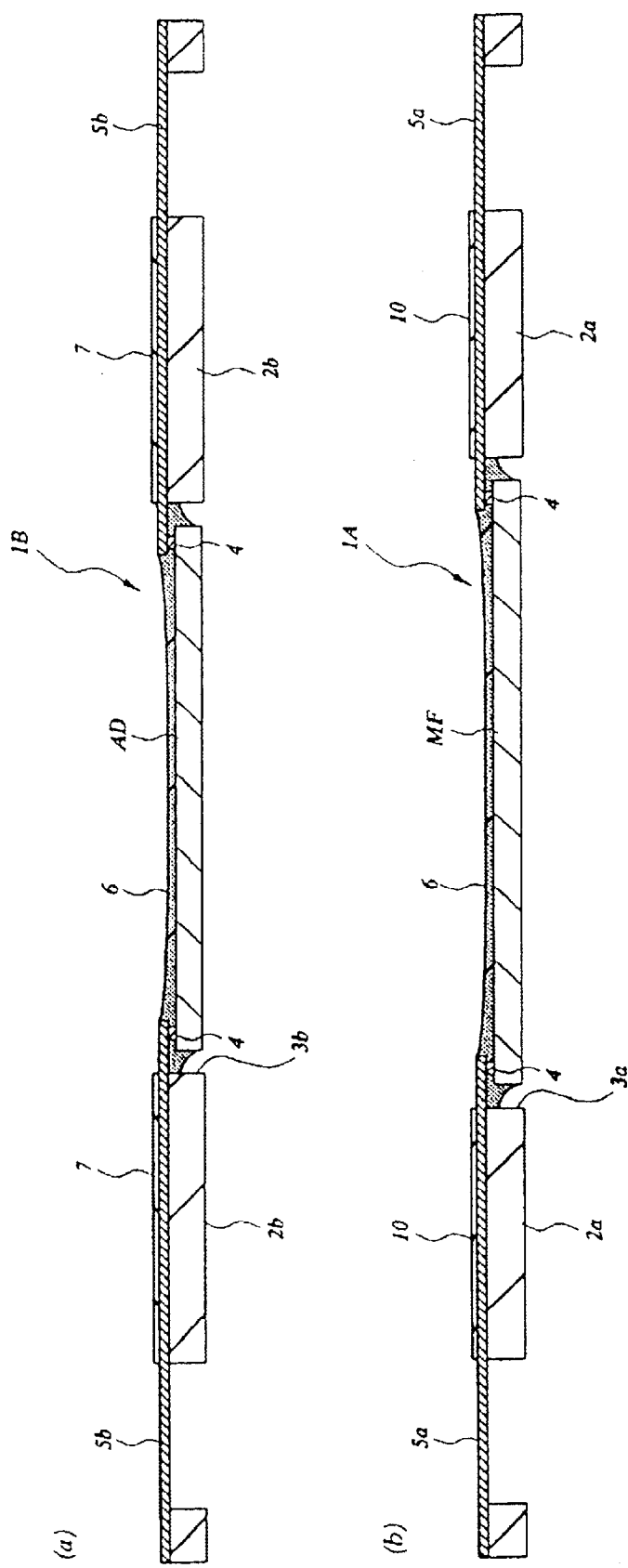

Next, as shown in FIG. 50, bump electrodes 4 of a chip MF and the leads 5a of the tape carrier 2a are electrically connected to one another and bump electrodes 4 of a chip AD and the leads 5b of the tape carrier 2b are electrically connected to one another, in accordance with the aforementioned method. Thereafter, the chips MF and AD are sealed with a potting resin 6. Subsequently, the tape carriers 2a and 2b are brought into pieces or fractions and each individuals TCP1A and TCP1B are subjected to an aging test to thereby select good products or items.

Figure 51:
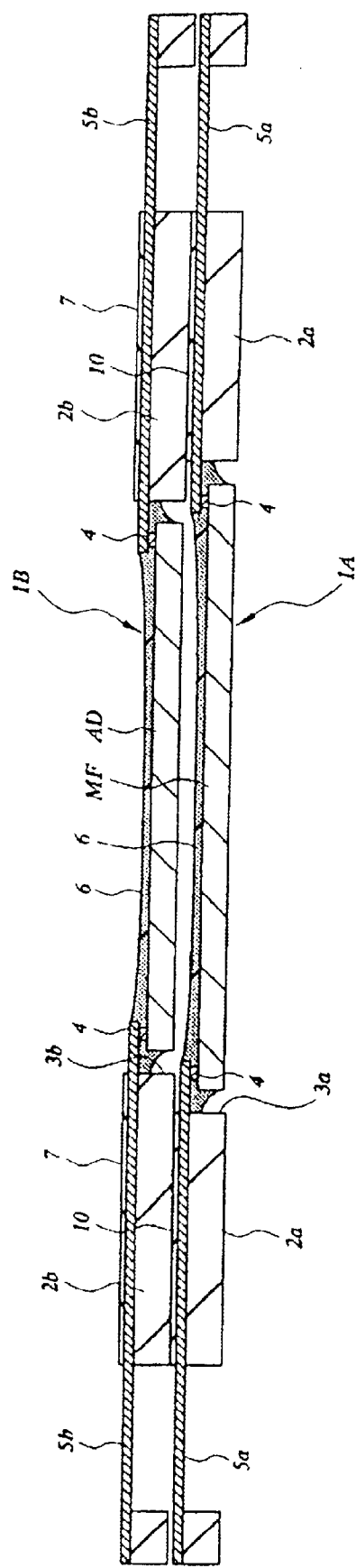
Figure 52:
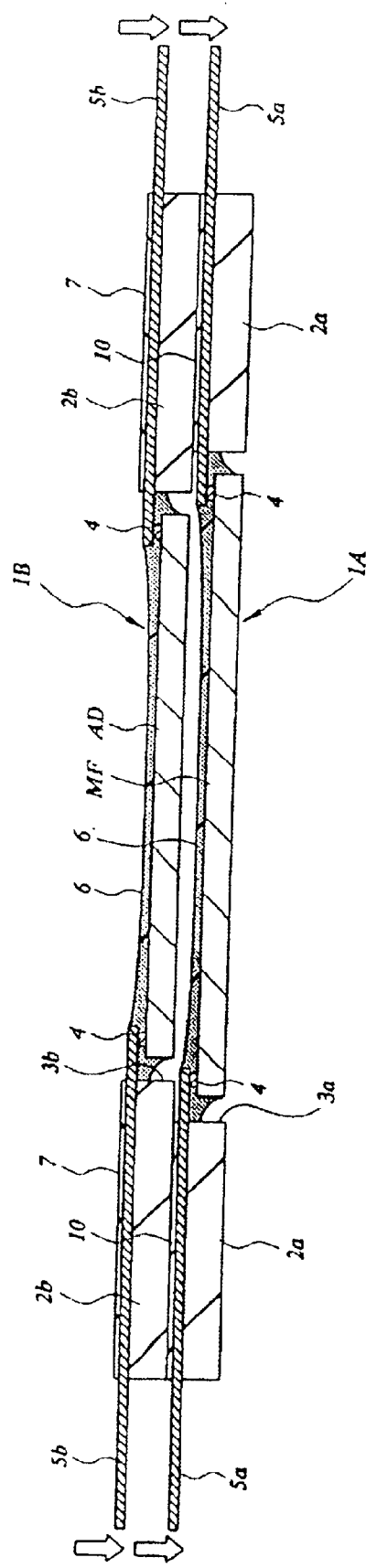
Figure 53:
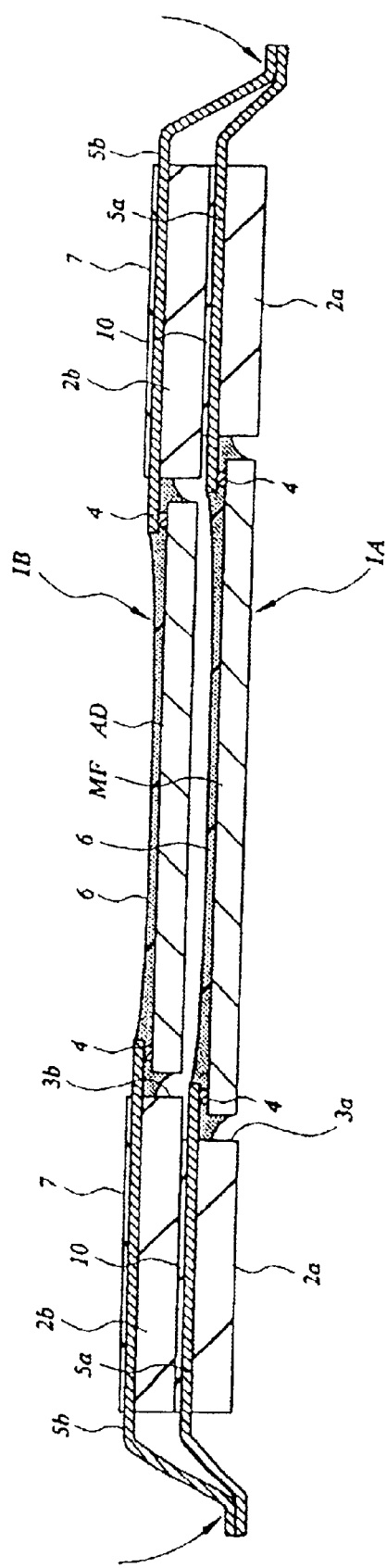

Next, as shown in FIG. 51, the tape carriers 2a and 2b are superimposed on one another to join together in accordance with the aforementioned method, whereby the TCP1A and TCP1B are brought into one package. Thereafter, the tape carriers 2a and 2b supporting the other ends (outer lead portions) of the leads 5a and 5b are cut and removed as shown in FIG. 52.

Next, the surfaces of the other ends (outer lead portions) of the leads 5a and 5b are given solder plating. Thereafter, the other ends (outer lead portions) of the leads 5a and 5b are shaped into galwing form by using lead molding dies. The leads 5a and 5b are simultaneously formed by using the same dies.

Figure 54:
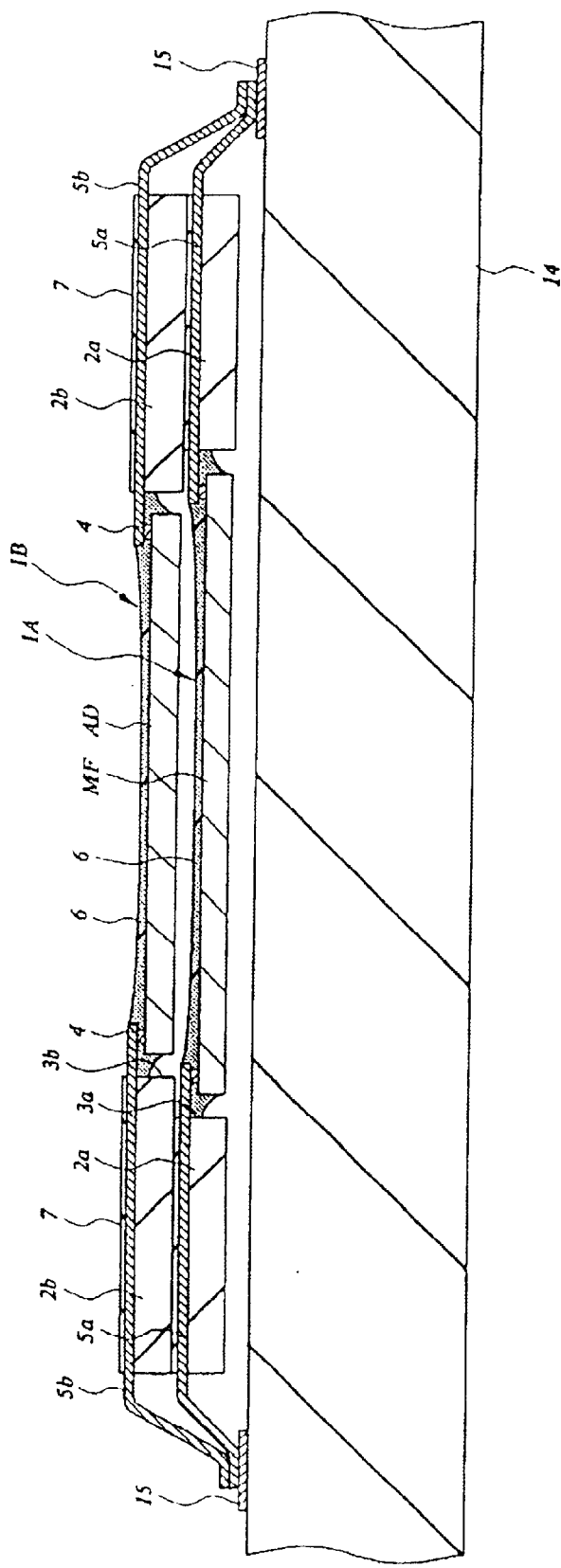

In order to implement the multilayered TCP manufactured in this way in a printed wiring board, the other ends (outer lead portions) of the leads 5a and 5b are superimposed on their corresponding electrodes 15 of the printed wiring board 14 and solder plating is caused to reflow, as shown in FIG. 54. At this time, the leads 5a and 5b electrically connected to their corresponding connecting terminals shared between the two chips MF and AD are respectively electrically connected to the same electrodes 15 of the printed wiring board 14. That is, the present stacked TCP has a structure wherein the connecting terminals common to the two chips MF and AD are electrically connected to one another through the leads 5a and 5b and commonly drawn to the outside (printed wiring board) through the leads 5a and 5b.

Figure 55:
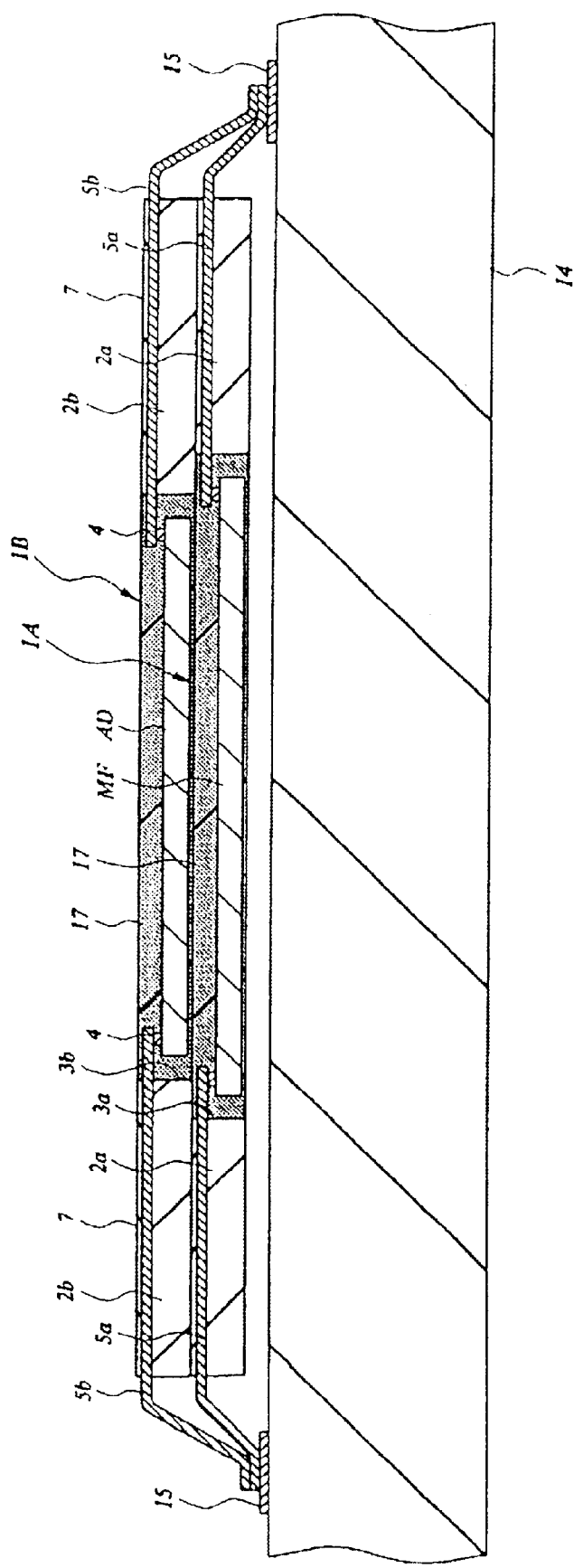

While the illustrated multilayered TCP is placed with the main surfaces of the chips MF and AD directed upward, it may be placed with their surfaces directed downward. While the chips MF and AD are sealed with the potting resin 6, they may be sealed with a mold resin 17 as shown in FIG. 55.

According to the stacked TCP of such a type that the external connecting terminals are respectively formed by the leads 5a and 5b, a manufacturing process can be simplified as compared with the stacked TCP wherein the external connecting terminals are formed by the solder bumps 9. It is therefore possible to reduce the manufacturing cost of the present stacked TCP. Further, since it is also unnecessary to define the through holes 8a and 8b in the tape carriers 2a and 2b, the routing of the leads 5a and 5b becomes easy and the tape carriers 2a and 2b can be also reduced in manufacturing cost.

Further, the leads 5a of the tape carrier 2a and the leads 5b of the tape carrier 2b are simultaneously formed with the same dies, thereby making it possible to shorten the time required to form the external connecting terminals. By electrically connecting the other ends (outer lead portions) of the leads 5a and 5b to their corresponding electrodes 15 of the printed wiring board 14 by superposition, the area of each electrode 15 taken on the surface of the printed wiring board 14 can be reduced and implementations (connections between the leads 5a and 5b and the electrodes 15) of the stacked TCP can be performed at one time.

Figure 56:
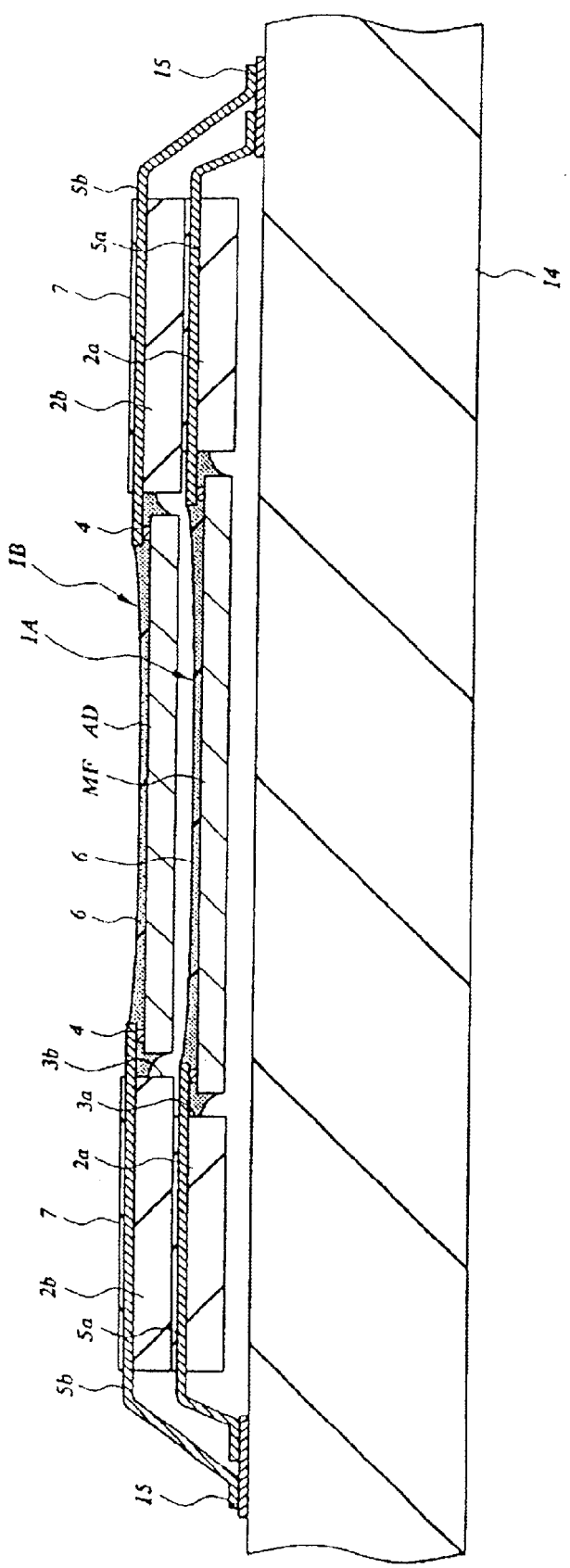
Figure 57:
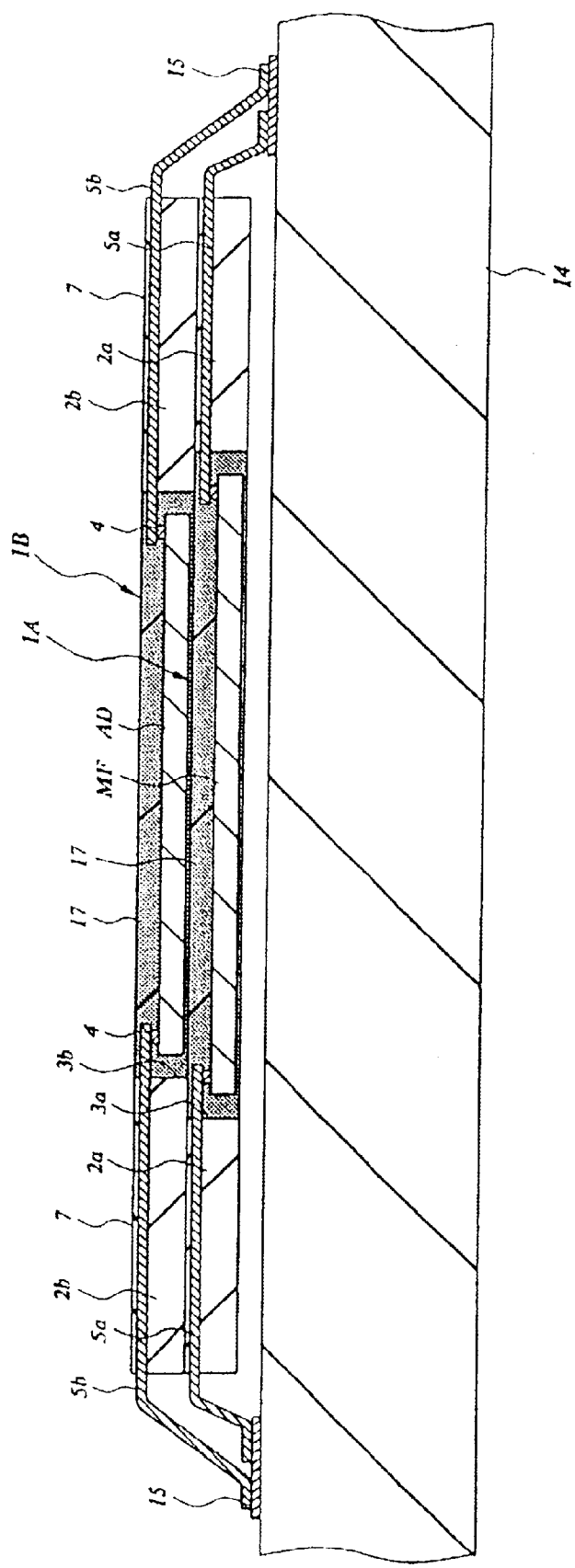

The leads 5a and 5b constituting the external connecting terminals may be individually formed by using two dies. Even in this case, the leads 5a and 5b electrically connected to their corresponding connecting terminals shared between the two chips MF and AD are respectively electrically connected to the same electrodes 15 of the printed wiring board 14 as shown in FIGS. 56 (showing a structure wherein chips MF and AD are sealed with a potting resin 6) and FIG. 57 (showing a structure wherein chips MF and AD are sealed with a mold resin 17).

Figure 58:
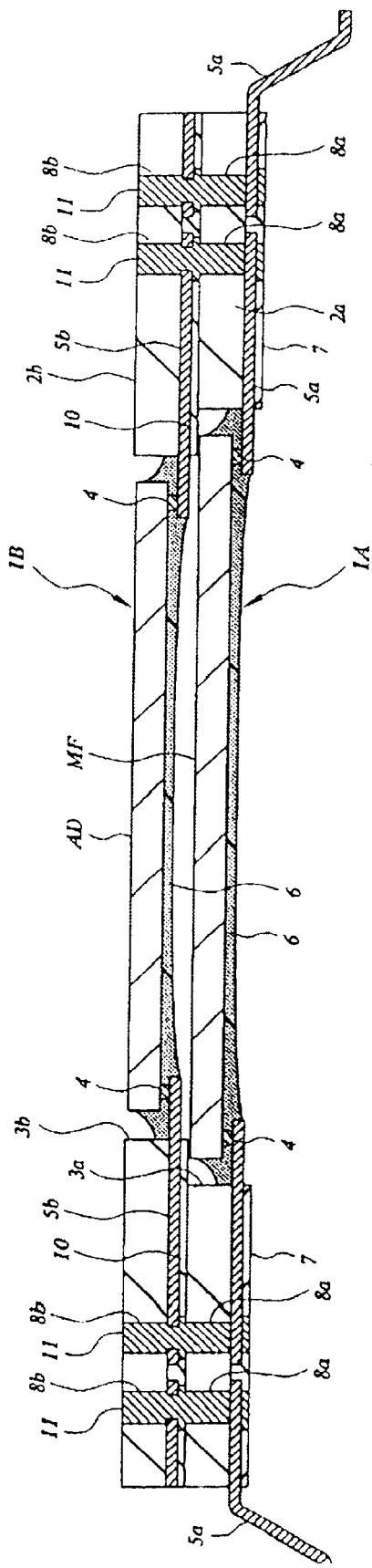

In a multilayered TCP shown in FIG. 58, the other ends (outer lead portions) of leads 5a formed at a TCP1A corresponding to a lower layer are shaped into galwing form to form external connecting terminals. Electrical connections between TCP1A and TCP1B are made via solder 11 embedded inside through holes 8a and 8b defined in tape carriers 2a and 2b.

Since stresses applied to connecting portions between the stacked TCP and a printed wiring board due to the difference in thermal expansion coefficient between the two are accommodated and lightened by deformations of flexible leads, the above-described structure of such a type that the external connecting terminals are respectively formed by the leads shaped into the galwing form, provides high reliability for the connection with the substrate as compared with the structure wherein the external connecting terminals are respectively formed by the solder bumps.

Figure 59:
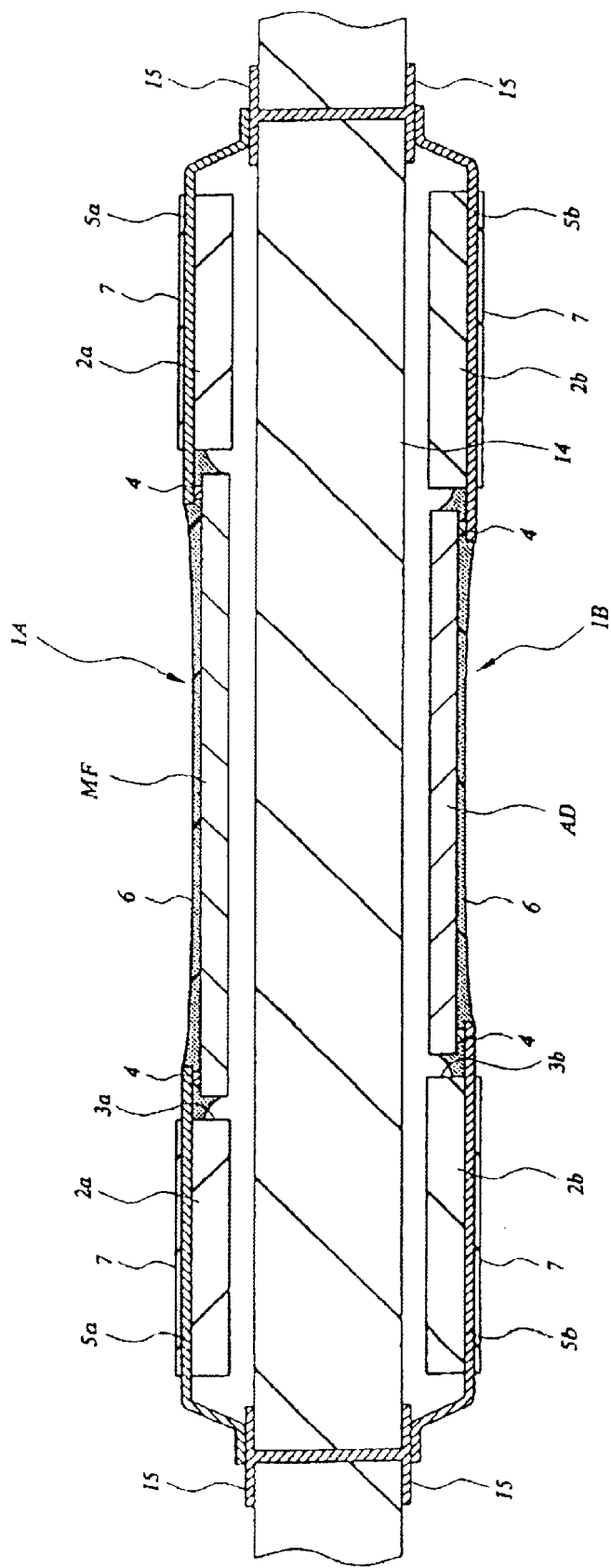

In the package according to the present invention, a TCP1A and a TCP1B can be also implemented individually in a printed wiring board 14 as shown in FIG. 59 without bringing them into one package. In this case, the present package is reduced in packing density as compared with the stacked TCP wherein the TCP1A and TCP1B are brought into one package. However, since a process for stacking the TCP1A and TCP1B on each other so as to be brought into one package becomes unnecessary, the package can be reduced in manufacturing cost.

Figure 60:
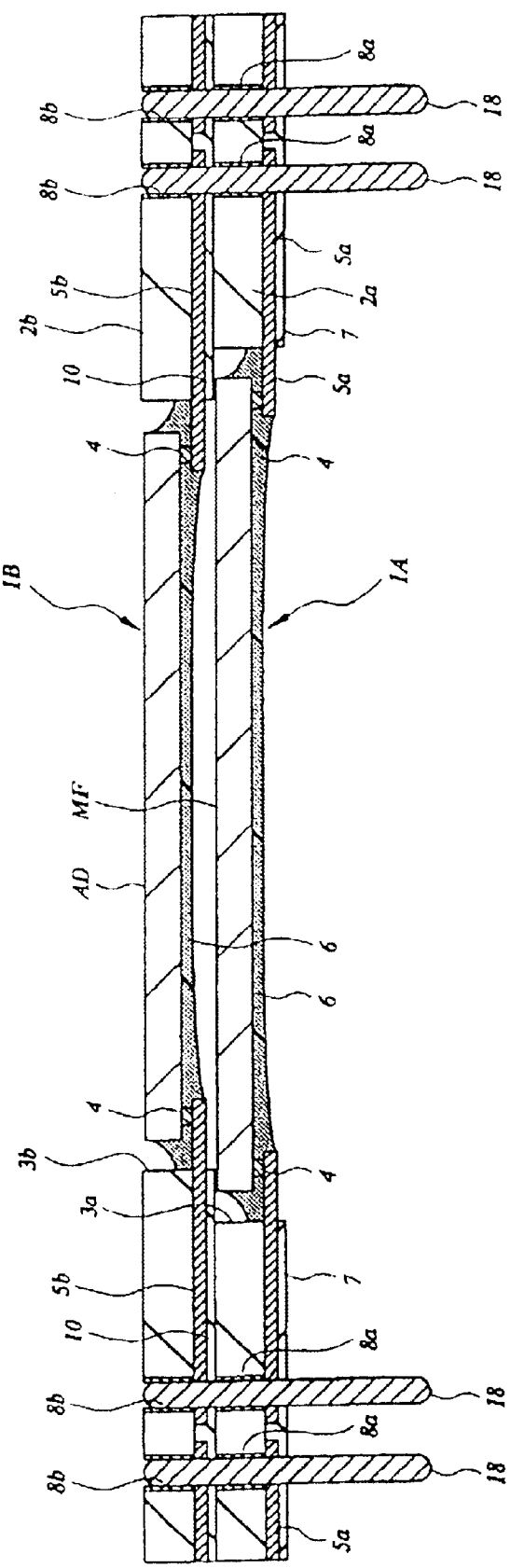

In the multilayered TCP according to the present invention, external connecting terminals can be also formed by pins 18 used in a PGA (Pin Grid Array) type package as shown in FIG. 60 as an alternative to the method of forming the external connecting terminals by the solder bumps 9 and the leads 5a and 5b. The surfaces of the pins 18 are given plating using Sn (tin) or the like. Thus, the pins 18 are electrically connected to their corresponding leads 5a and/or leads 5b inside through holes 8a and 8b.

Further, the stacked TCP according to the present invention can also provide electrical connections between the chip MF and the leads 5a and between the chip AD and the leads 5b by means of anisotropic conductive films.

In order to manufacture the stacked TCP using the anisotropic conductive films, first of all, a device hole 3a, through holes 8a and leads 5a are formed in a tape carrier 2a, and a device hole 3b, through holes 8b and leads 5b are formed in a tape carrier 2b in accordance with the aforementioned method as shown in FIG. 61. Thereafter, a solder resist 7 is placed on the whole surface of the tape carrier 2a and an adhesive 10 is applied onto the whole surface of the tape carrier 2b.

Figure 62:
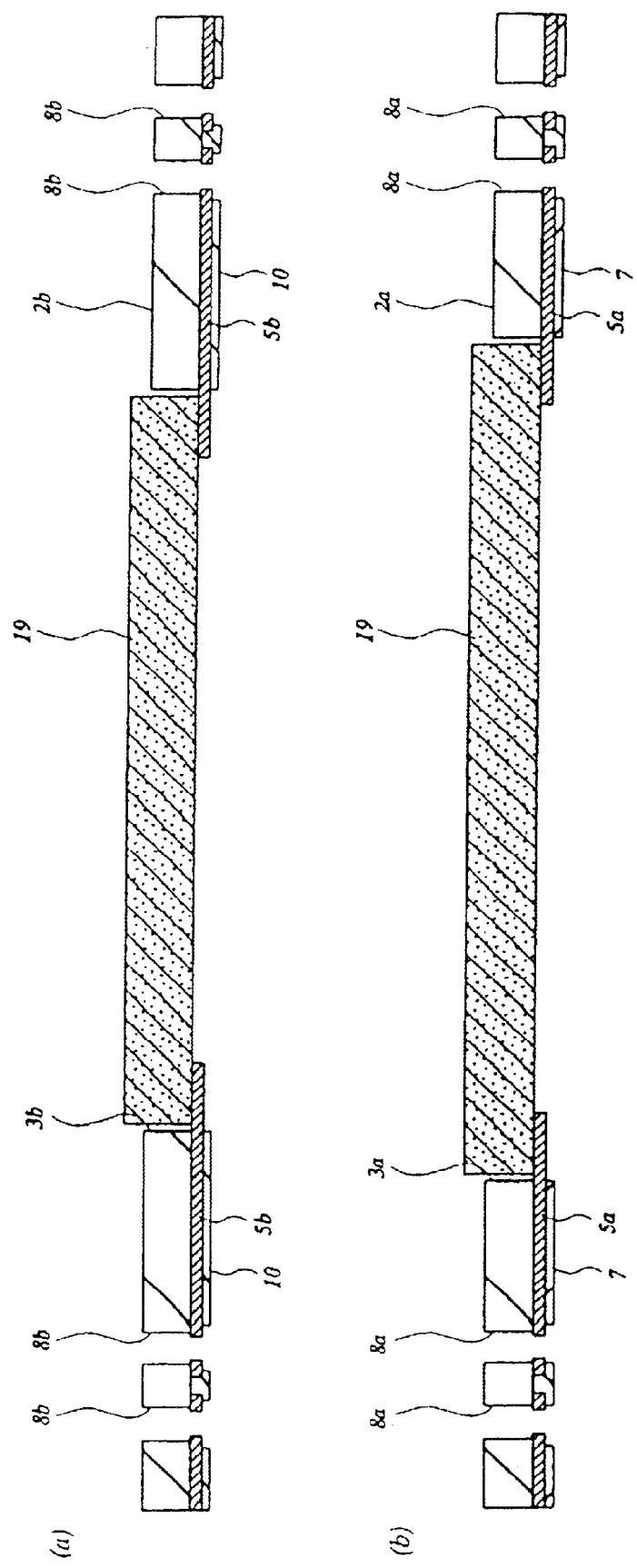

Next, as shown in FIG. 62, an anisotropic conductive film 19a cut to substantially the same size as that of the device hole 3a of the tape carrier 2a in advance is positioned onto one ends (inner lead portions) of the leads 5a which protrude inside the device hole 3a. Similarly, an anisotropic conductive film 19b cut to substantially the same size as that of the device hole 3b of the tape carrier 2b in advance is positioned onto one ends (inner lead portions) of the leads 5b which protrude inside the device hole 3b.

Figure 63:
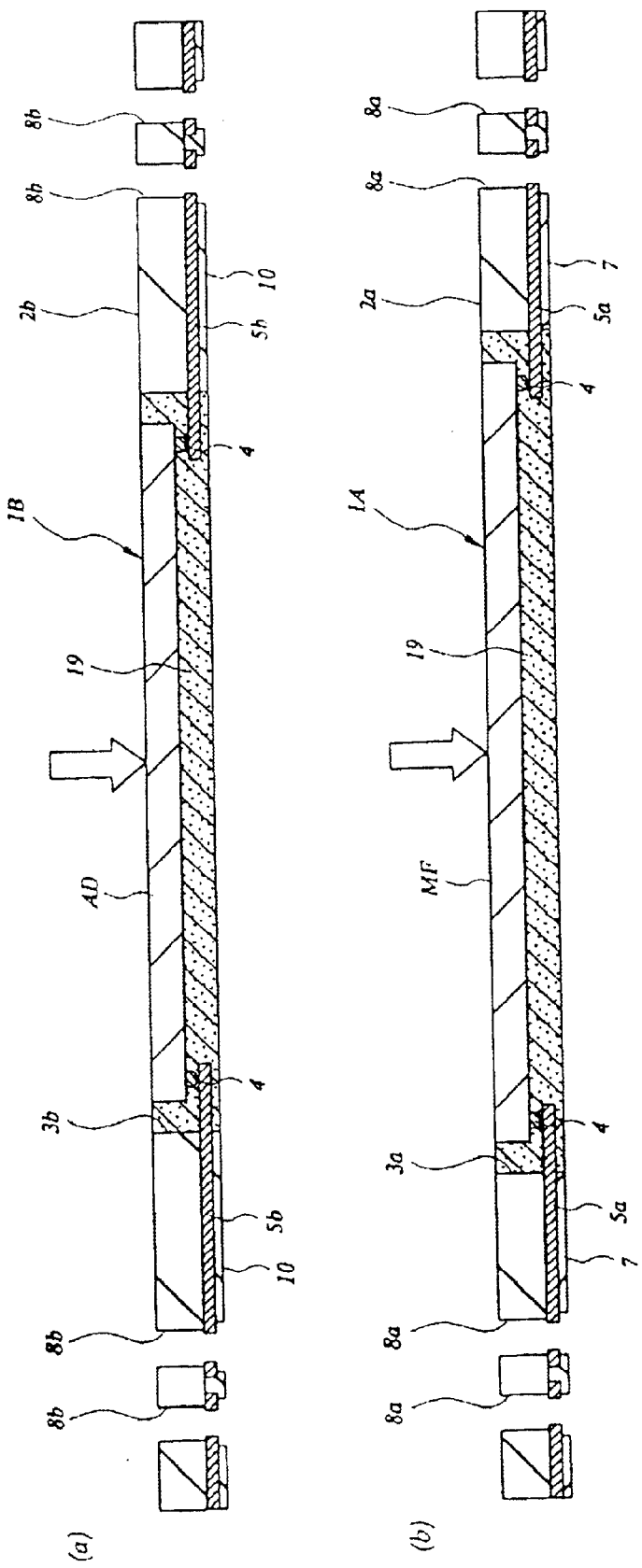

Next, as shown in FIG. 63, a chip MF with bump electrodes 4 formed thereon is positioned onto the anisotropic conductive film 19a with the main surface of the chip MF directed downward and thereafter the anisotropic conductive film 19a is heated and pressurized, whereby the bump electrodes 4 and the leads 5a are respectively electrically connected to one another via conductive particles in the anisotropic conductive film 19a. Similarly, a chip AD with bump electrodes 4 formed thereon is positioned onto the anisotropic conductive film 19b with the main surface of the chip AD directed downward and thereafter the anisotropic conductive film 19b is heated and pressurized, whereby the bump electrodes 4 and the leads 5b are respectively electrically connected to one another via conductive particles in the anisotropic conductive film 19b. Subsequently, the tape carriers 2a and 2b are brought into pieces and each individual TCP1A and TCP1B are subjected to an aging test to thereby select good products or items.

Figure 64:
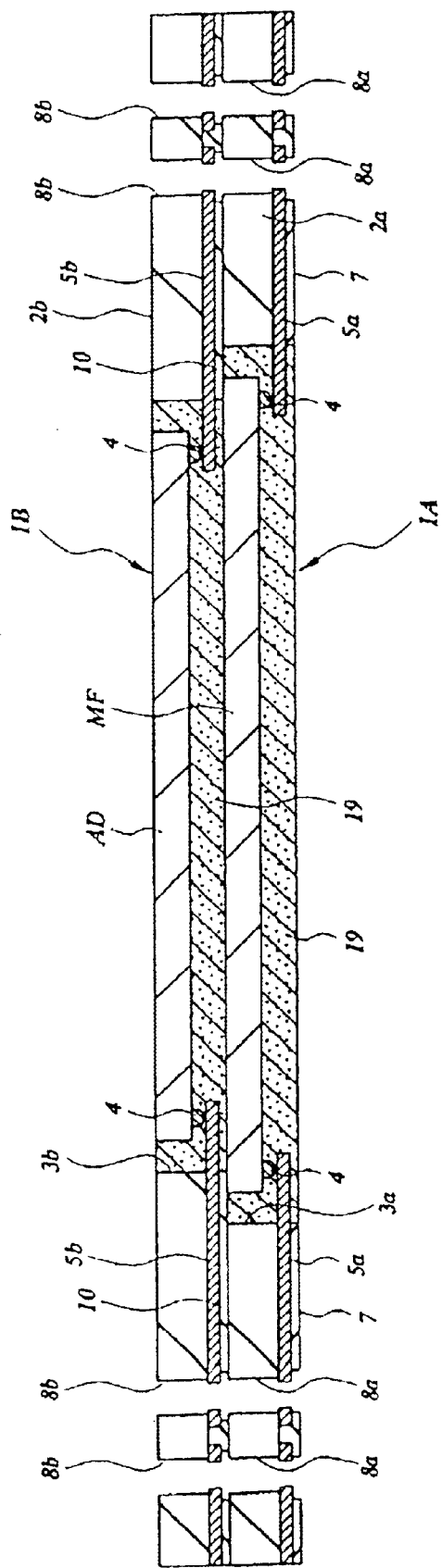
Figure 65:
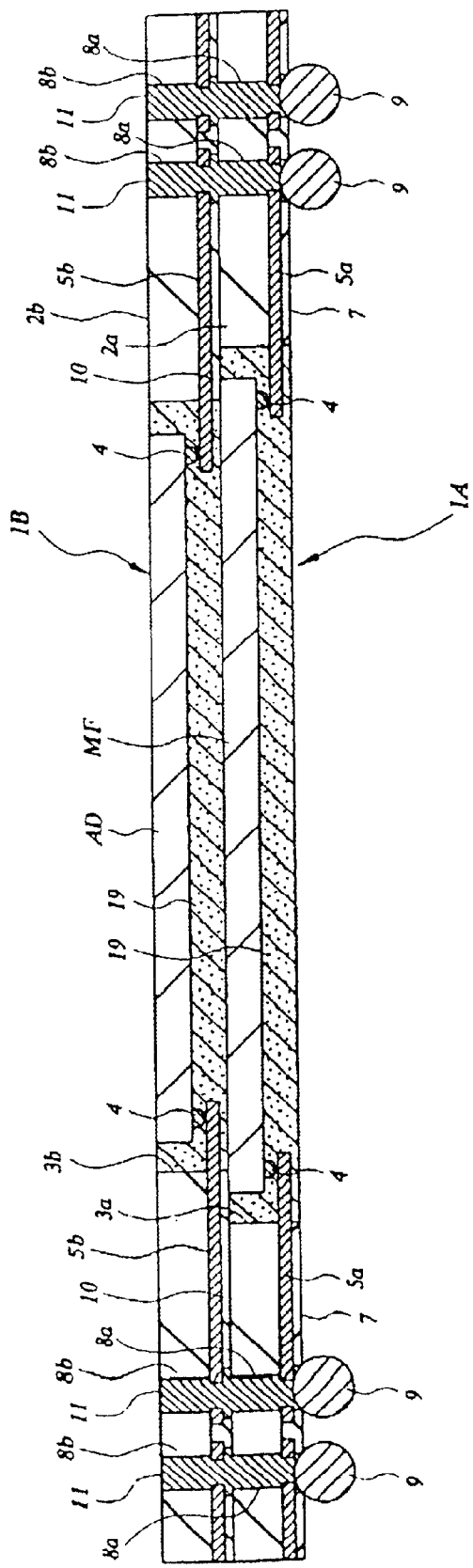

Next, the tape carriers 2a and 2b are superimposed on one another so as to be brought into one package in accordance with the above-described method as shown in FIG. 64. Thereafter, solder 11 is charged into the through holes 8a and 8b and solder bumps 9 are formed at one ends of the through holes 8a, as shown in FIG. 65.

It is needless to say that the above-described various stacked TCP according to the present invention can be applied even to configurational examples such as the above-described chip MFA+chip D, chip MFA+chip AD, chip MF+chip D, etc. as well as a combination of the chip MF+chip AD. Further, the stacked TCP according to the present invention can be applied even to the case in which three or more chips are layered.

Figure 66:
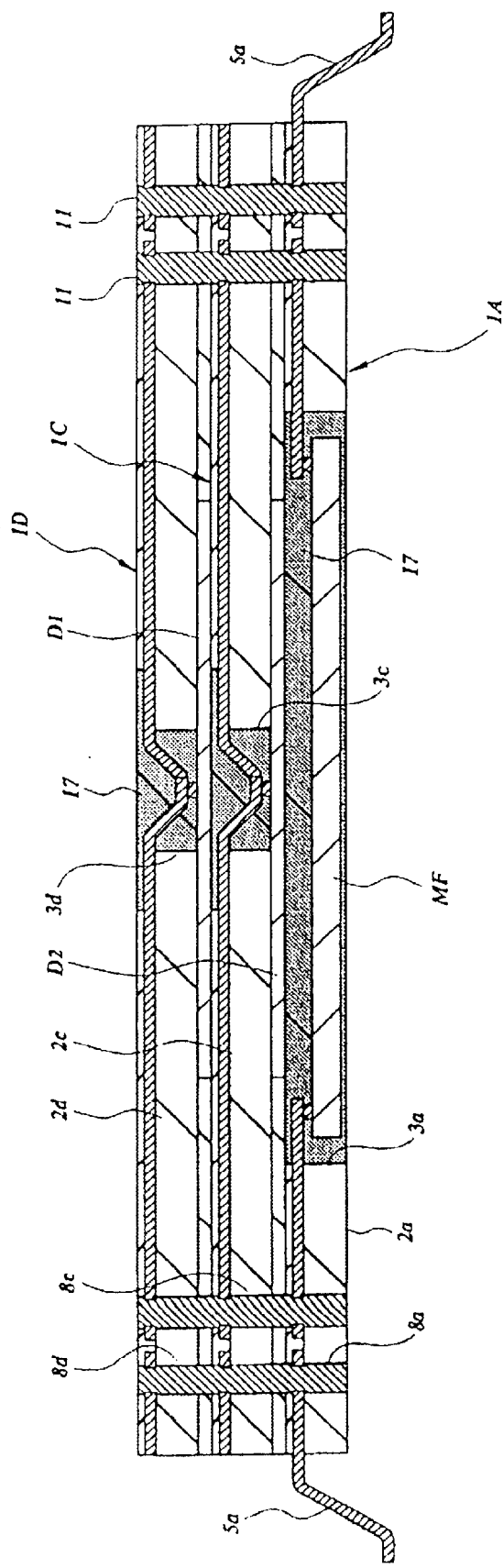

A stacked TCP shown in FIG. 66 has a stacked TCP structure wherein a chip MF with a microcomputer and a flash memory formed therein is sealed into or with a TCP1A and two chips $D_1$ and $D_2$ with only DRAMs formed therein are respectively sealed into or with two TCP1C and TCP1D, and these three TCP1A, TCP1C and TCP1D are superimposed on one another in a vertical direction so as to be integrally joined together.

The chip MF sealed with the TCP1A corresponding to the lowest layer is placed within a device hole 3a of a tape carrier 2a with its main surface (device forming surface) directed upward. The chip MF is electrically connected to one ends (inner lead portions) of leads 5a formed over the whole surface of the tape carrier 2a via bump electrodes 4 formed at a peripheral portion of the main surface thereof. The chip MF is sealed with a mold resin 17. The leads 5a formed over the whole surface of the tape carrier 2a have patterns shown in FIG. 67 respectively.

Figure 68:
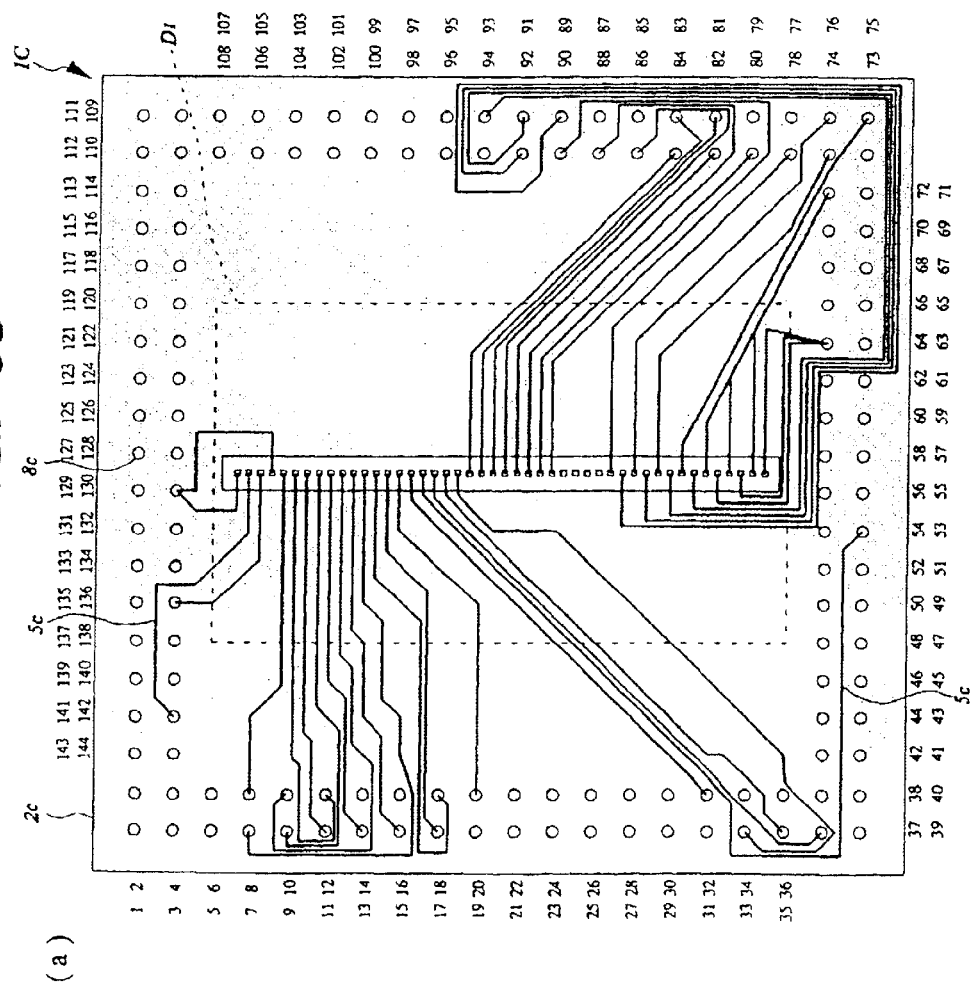
Figure 69:
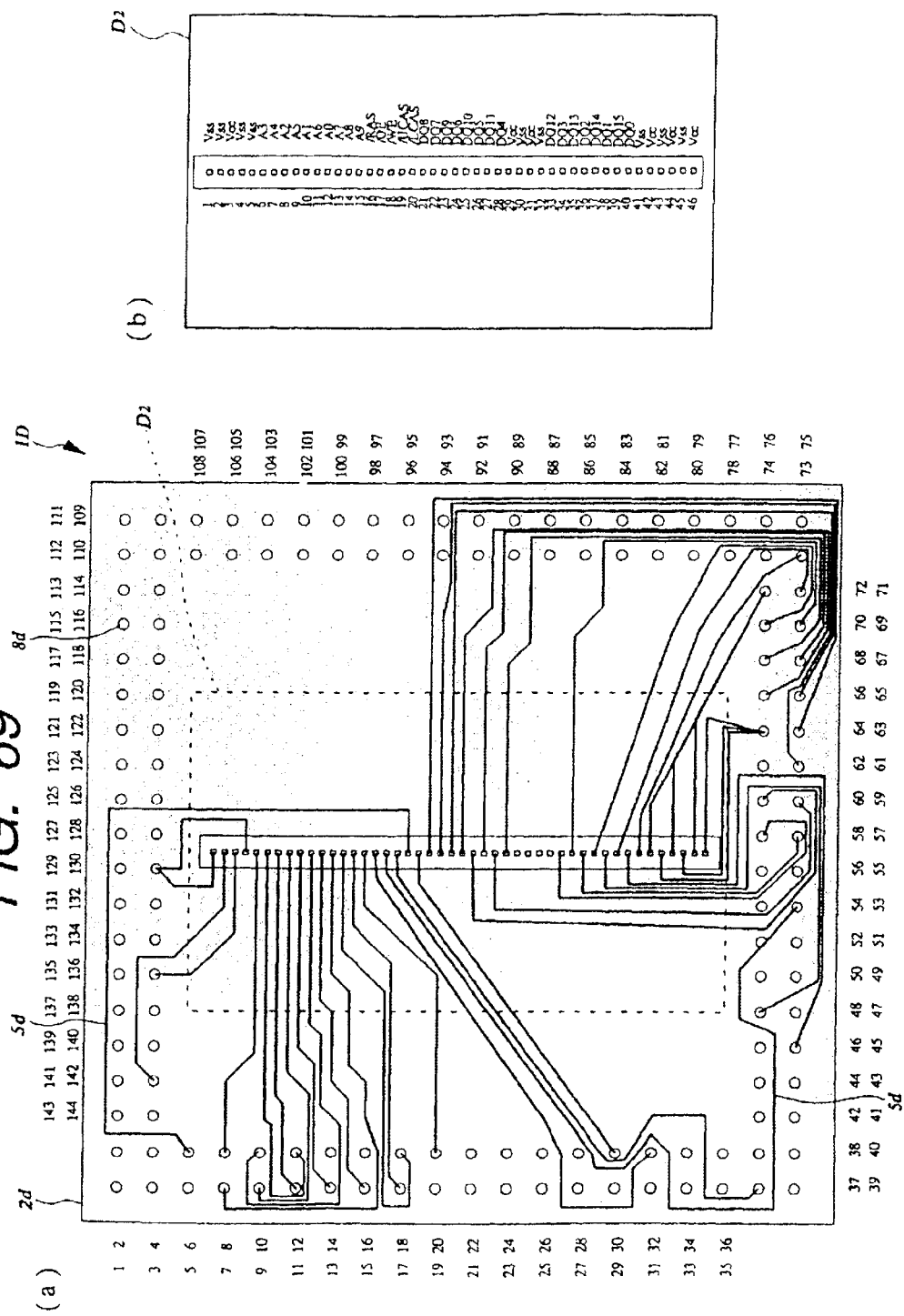

The TCP1C, which has sealed the chip $D_1$, is layered at an upper portion of the TCP1A. Further, the TCP1D, which has sealed the chip $D_2$, is layered at an upper portion of the TCP1C. The chip $D_1$ sealed with the TCP1C is placed within a device hole 3c defined in a central portion of a tape carrier 2c with its principal surface directed upward. Further, the chip $D_1$ is electrically connected to one ends (inner lead portions) of leads 5c formed over the whole surface of the tape carrier 2c via bump electrodes 4 formed in a central portion of its principal surface. Similarly, the chip $D_2$ sealed by the TCP1D is placed within a device hole 3d defined in a central portion of a tape carrier 2d with its principal surface directed upward. Further, the chip $D_2$ is electrically connected to one ends (inner lead portions) of leads 5d formed over whole surface of the tape carrier 2d via bump electrodes 4 formed in a central portion of its principal surface. These chips $D_1$ and $D_2$ are also sealed with the mold resin 17. The leads 5c formed over the whole surface of the tape carrier 2c have patterns shown in FIG. 68 respectively. The leads 5d formed over the whole surface of the tape carrier 2d have patterns shown in FIG. 69 respectively.

The present stacked TCP takes a structure wherein connecting terminals (pins) shared (i.e, which have the same functions) between the three chips MF, $D_1$ and $D_2$ are electrically connected to one another via through holes 8a, 8c and 8d placed in the same positions of the tape carriers 2a, 2c and 2d, and are drawn in common to the outside (printed wiring board) through the other ends (outer lead portions) of the leads 5a formed on the tape carrier 2a. It is needless to say that the external connecting terminals can be formed by the above-described solder bumps or pins or the like in addition to the leads.

Figure 67:
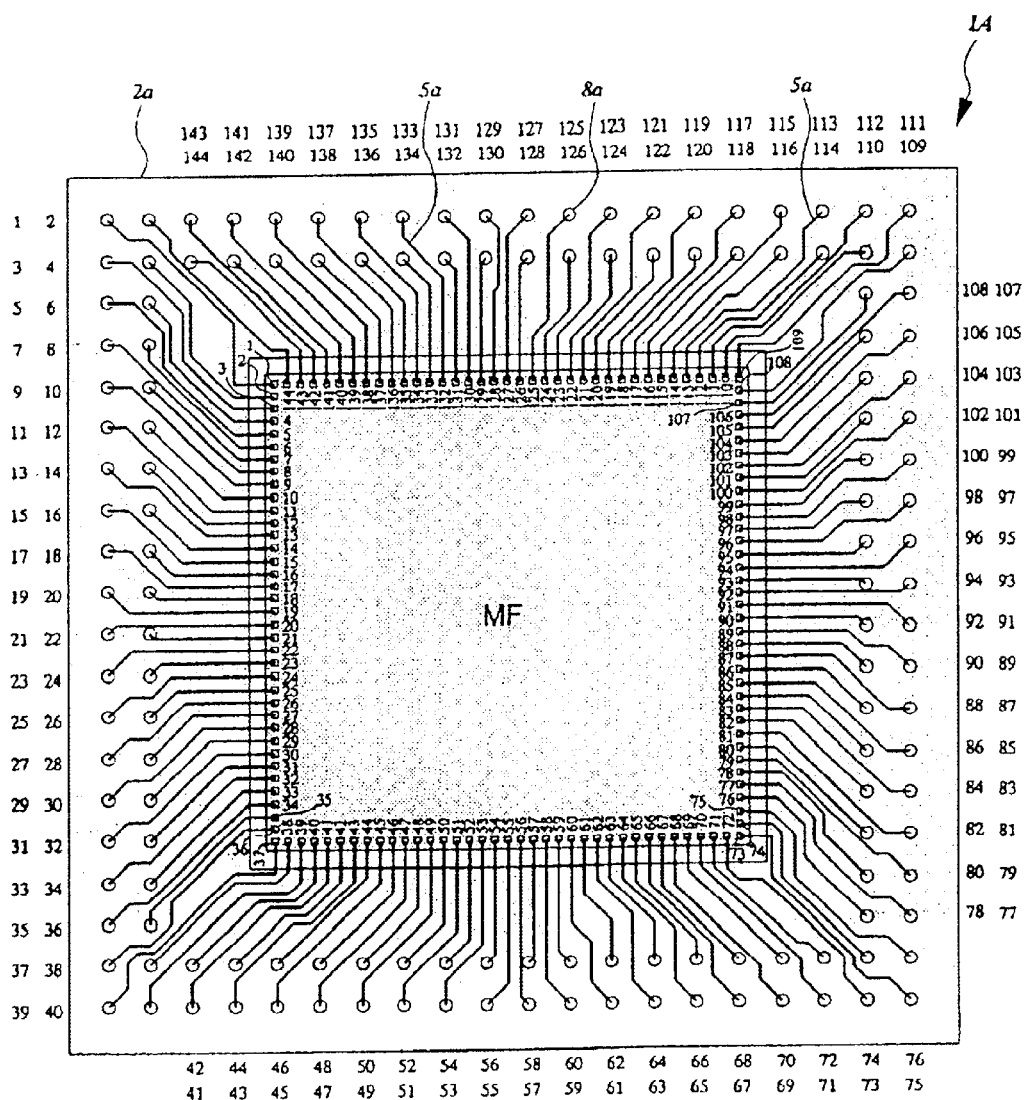
FIGS. 67 through 69 are respectively plan views showing patterns of leads formed over the whole surfaces of tape carriers.

Numbers (1 through 144) of the connecting terminals formed in the chip MF and numbers (1 through 144) of the through holes 8a defined in the tape carrier 2a are assigned to FIG. 67. Further, numbers (1 through 46) of the connecting terminals formed in the chip $D_1$ and numbers (1 through 144) of the through holes 8c defined in the tape carrier 2c are assigned to FIG. 68. Numbers (1 through 46) of the connecting terminals formed in the chip $D_2$ and numbers (1 through 144) of the through holes 8d defined in the tape carrier 2d are assigned to FIG. 69. The through holes 8a, 8c and 8d placed in the same positions of the tape carriers 2a, 2c and 2d are identified by the same numbers.

Figure 70:
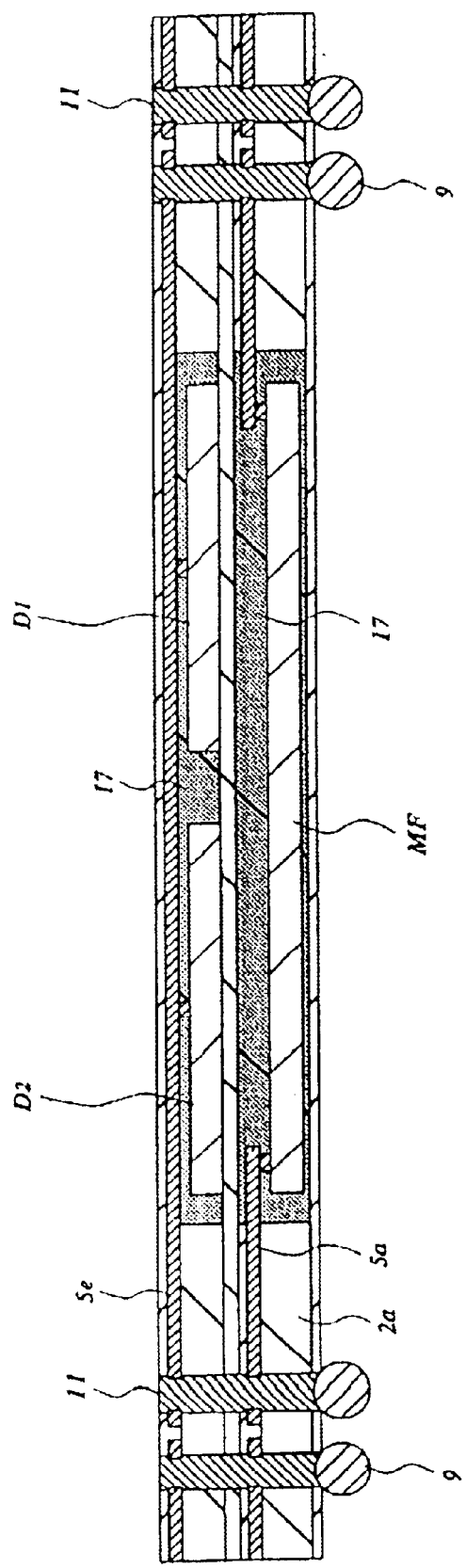
FIGS. 70 through 72 are respectively cross-sectional views illustrating other embodiments of the semiconductor device.

When both the areas of the chip $D_1$ and $D_2$ are less than or equal to one-half the area of the chip MF, the chips $D_1$ and $D_2$ are transversely placed side by side and the connecting terminals shared between the chip $D_1$ and $D_2$ can be connected to each other by a common lead 5e, as shown in FIG. 70. In doing so, an ultra-thin package can be implemented in a manner similar to the above-described stacked TCP equipped with the two chips MF and AD.

Figure 71:
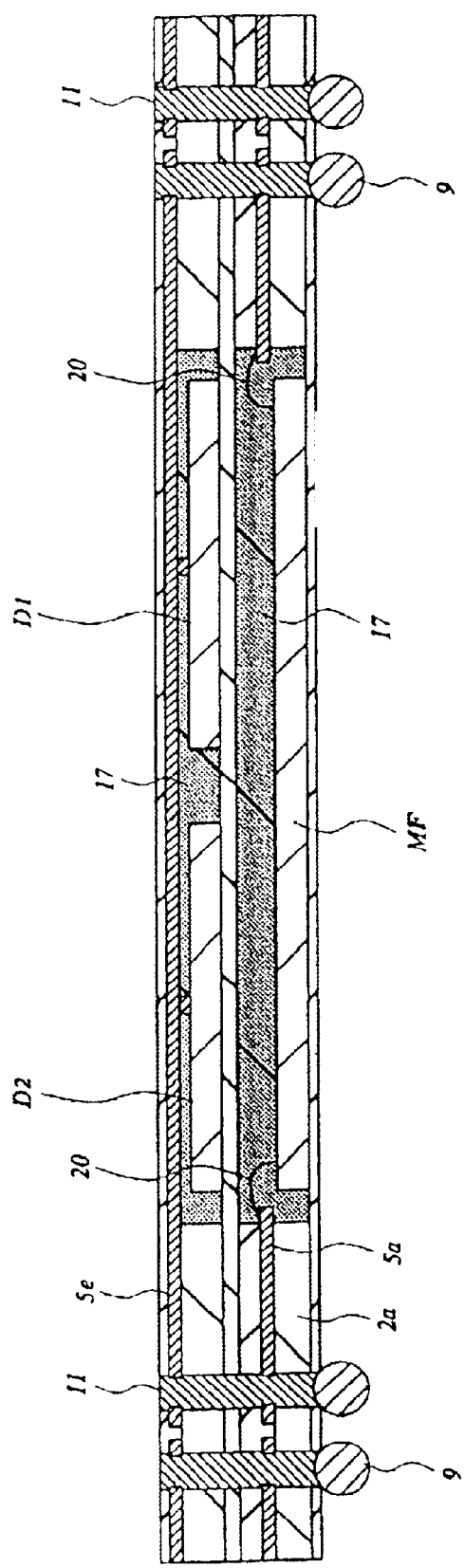

The package according to the present invention is not limited to the above-described structure. Various engineering changes can be made to its details. As shown in FIG. 71 by way of example, the package can also adopt a structure in which a chip MF sealed with a TCP1A and leads 5a formed on a tape carrier 2a are electrically connected by wires 20 composed of Au.

Figure 72:
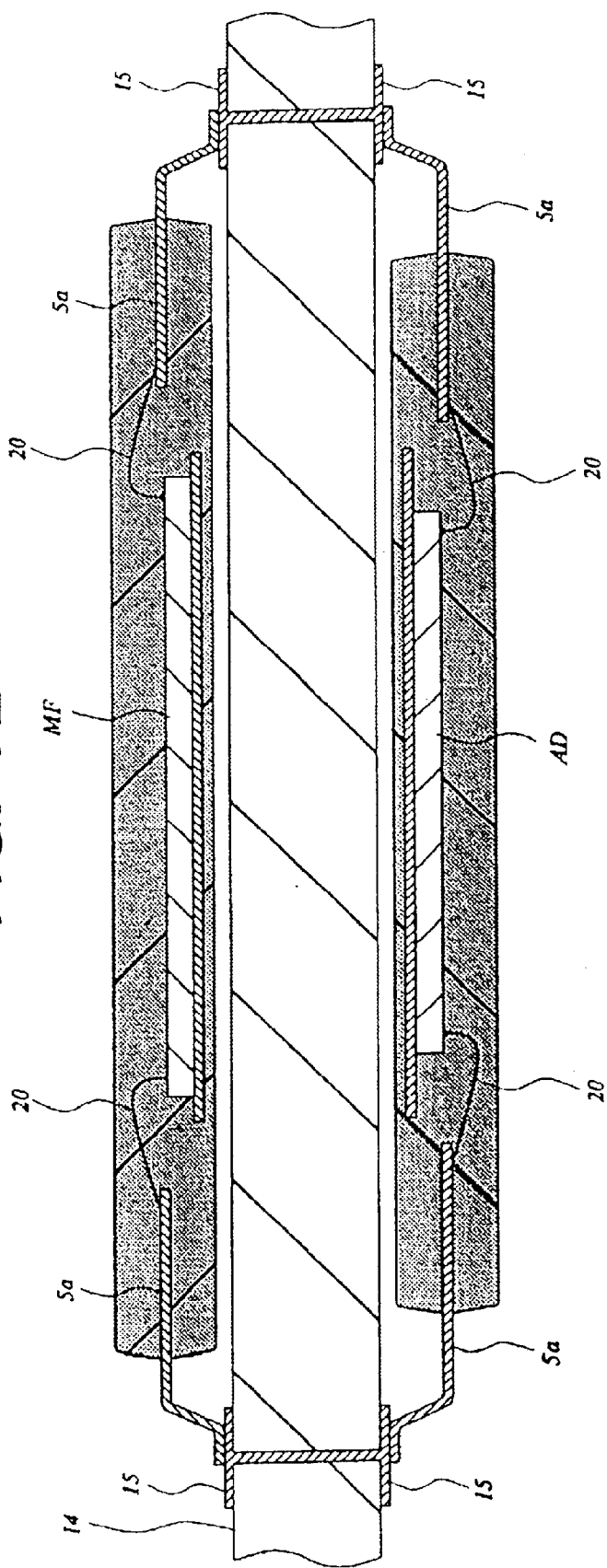

As shown in FIG. 72 by way of example except the stacked TCP structure, chips MF and AD are individually sealed into QFP (Quad Flat package) type packages without being brought into one package and thereafter they can be also implemented to a printed wiring board 14.

Figure 73:
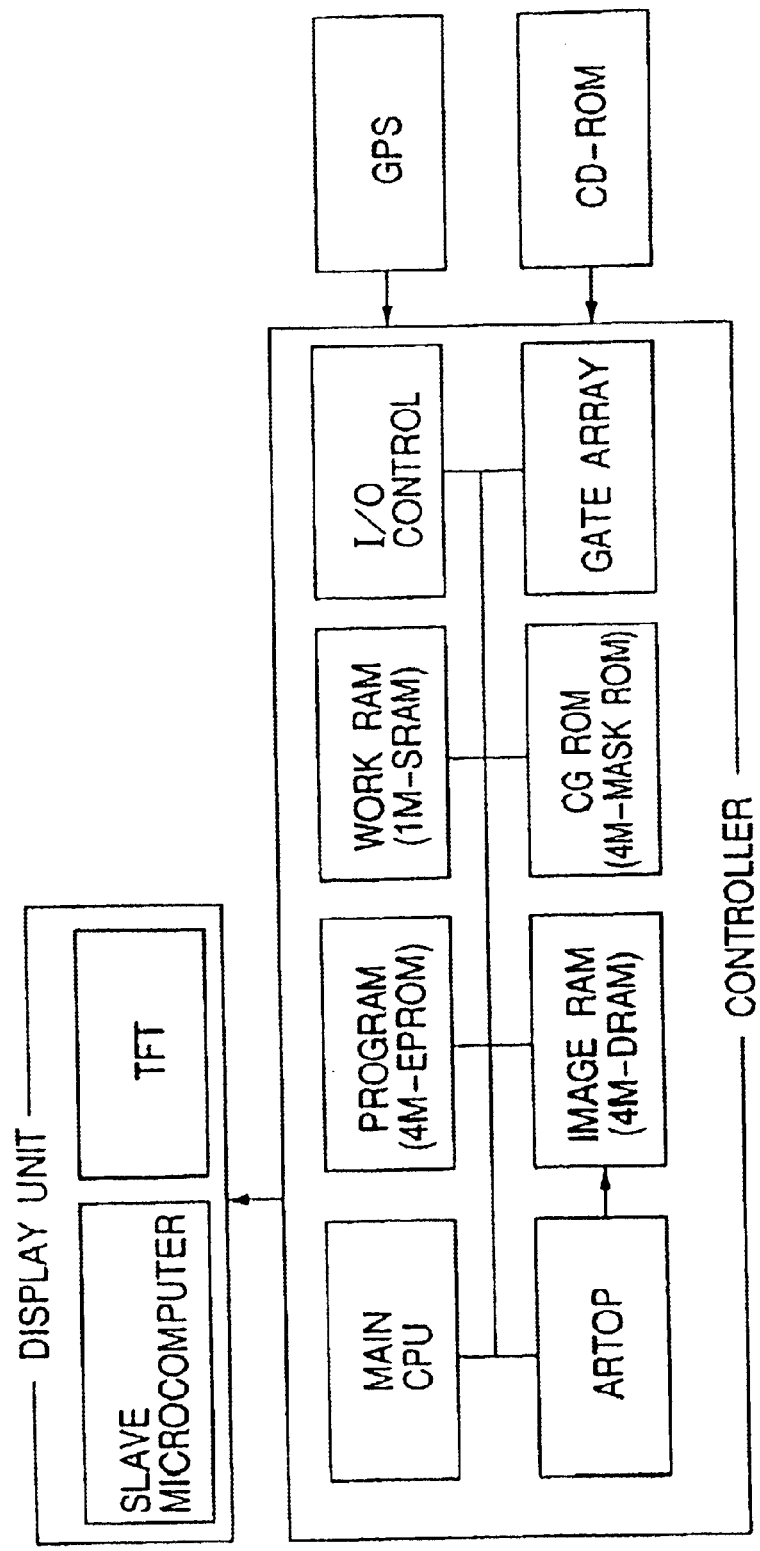
FIGS. 73 through 77 are respectively functional block diagrams showing an example of a system configuration using the semiconductor device according to the present embodiment.
Figure 74:
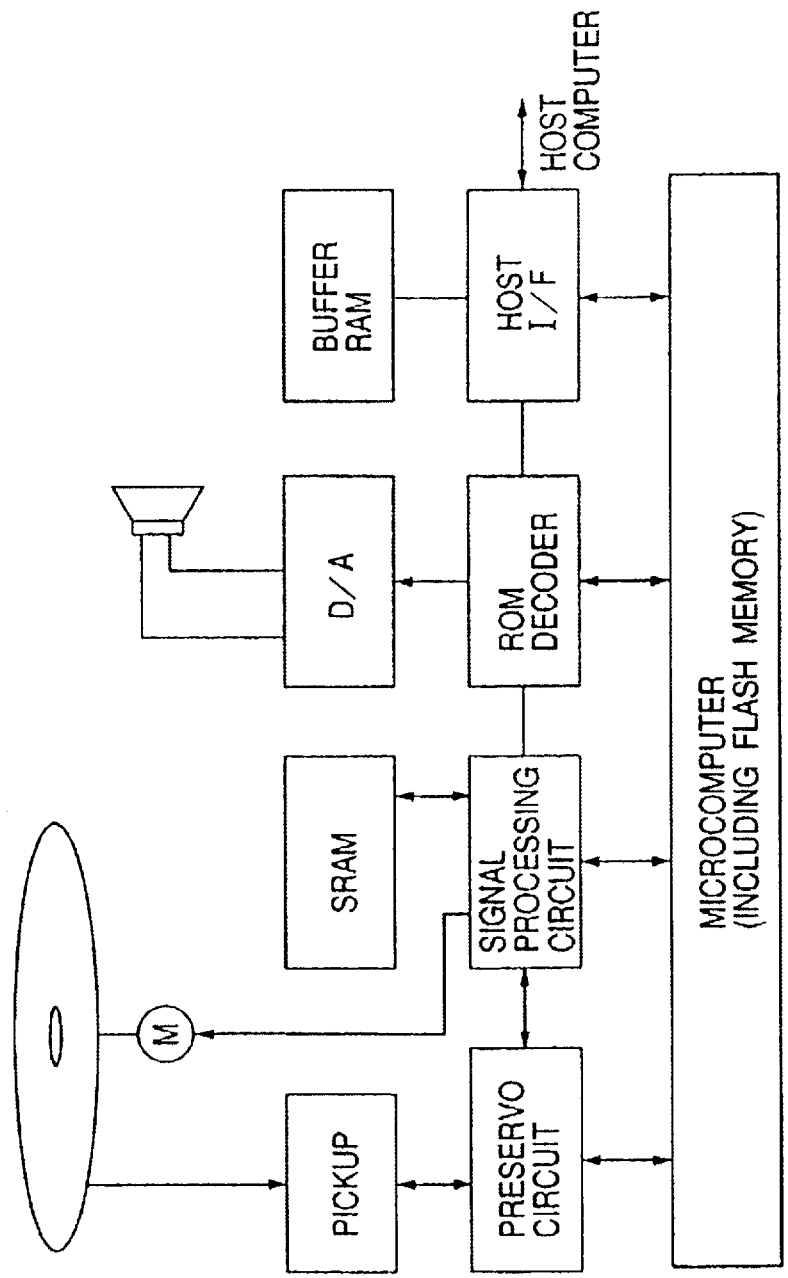
Figure 75:
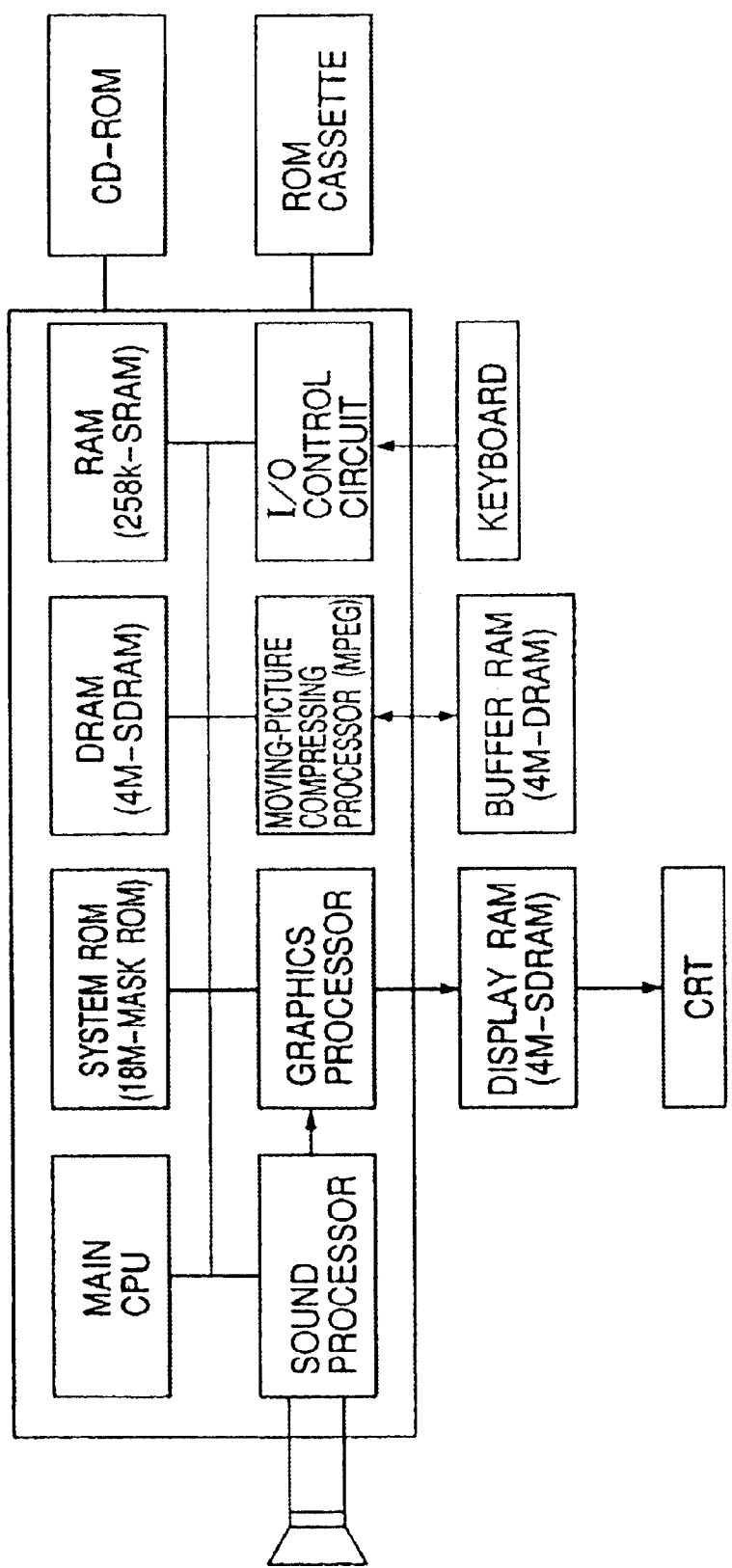
Figure 76:
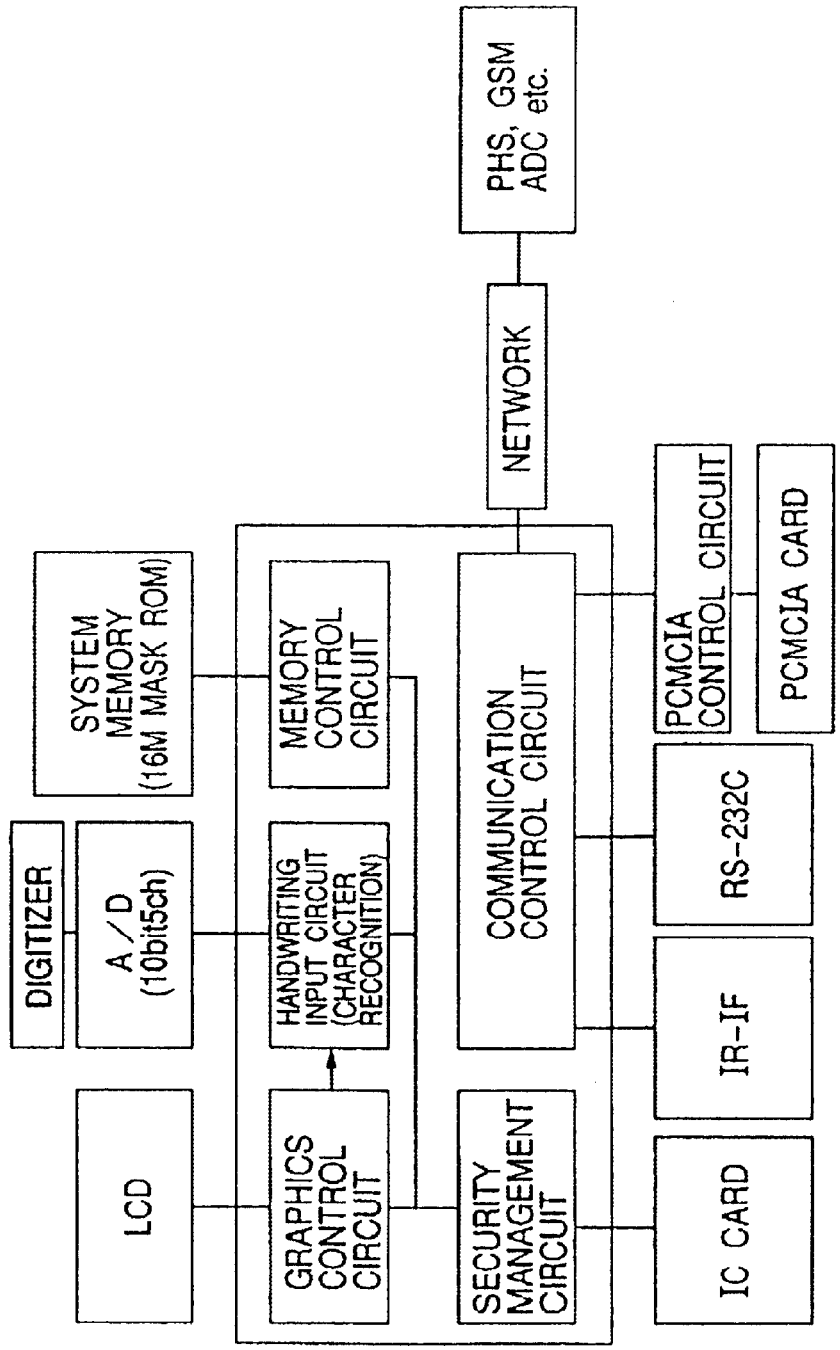
Figure 77:
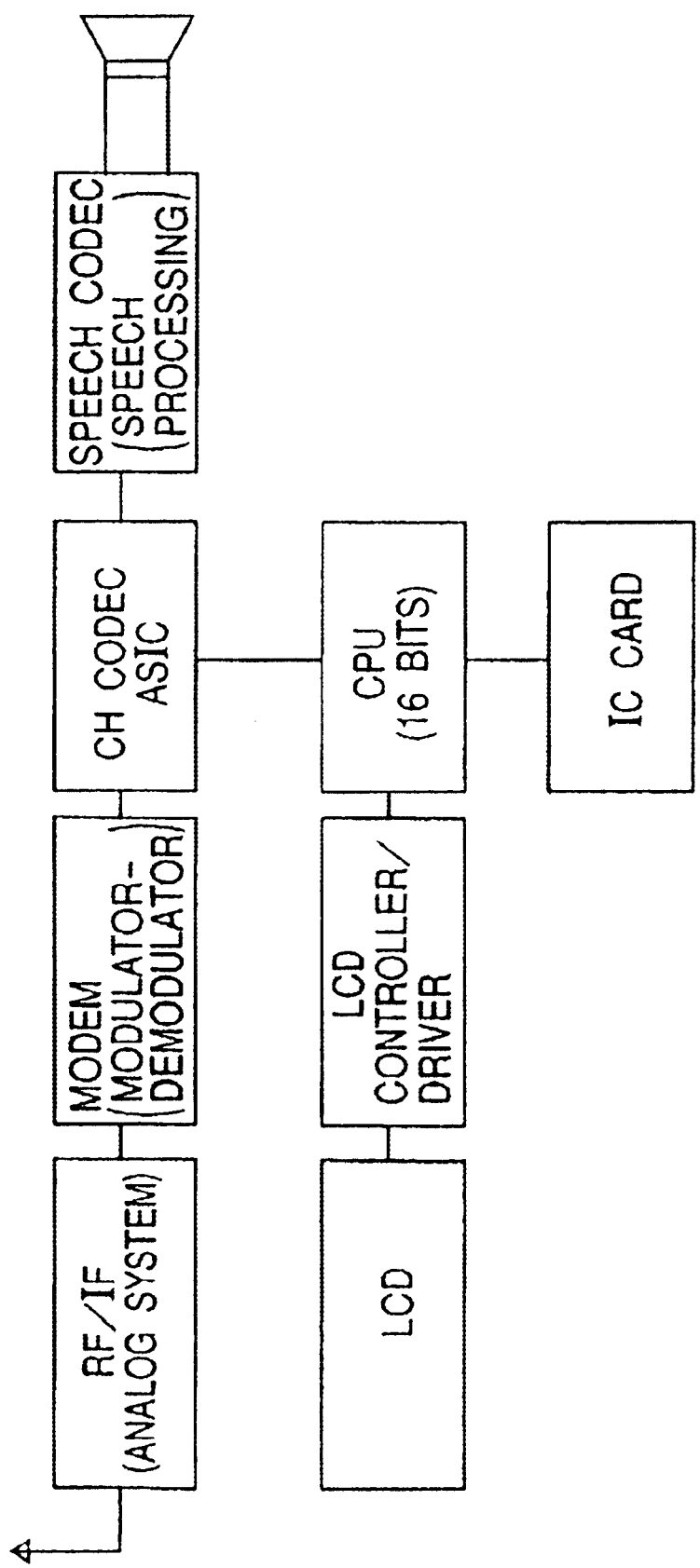
Figure 78:
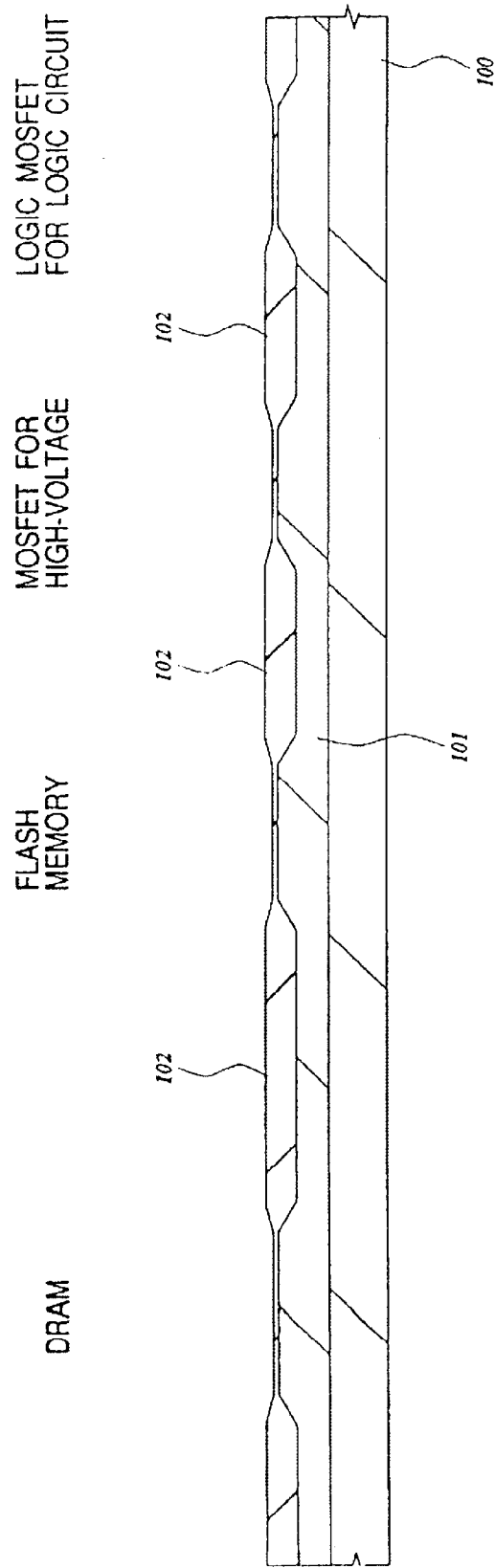
FIGS. 78 through 94 are respectively cross-sectional views illustrating a process for mixing a microcomputer, a flash memory, a DRAM and an ASIC together, which has been discussed by the present inventors.
Figure 79:
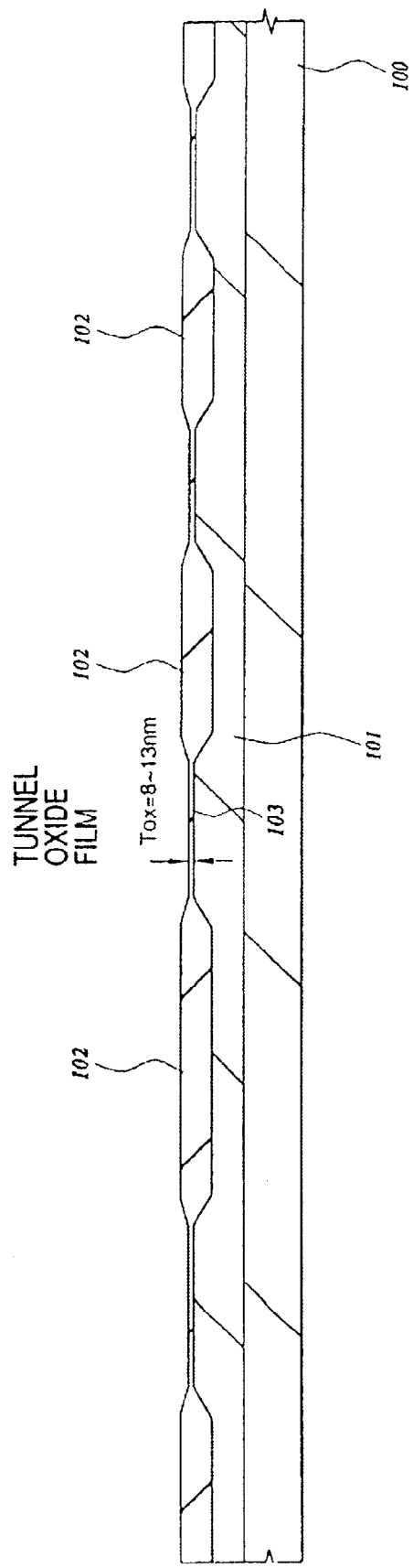
Figure 80:
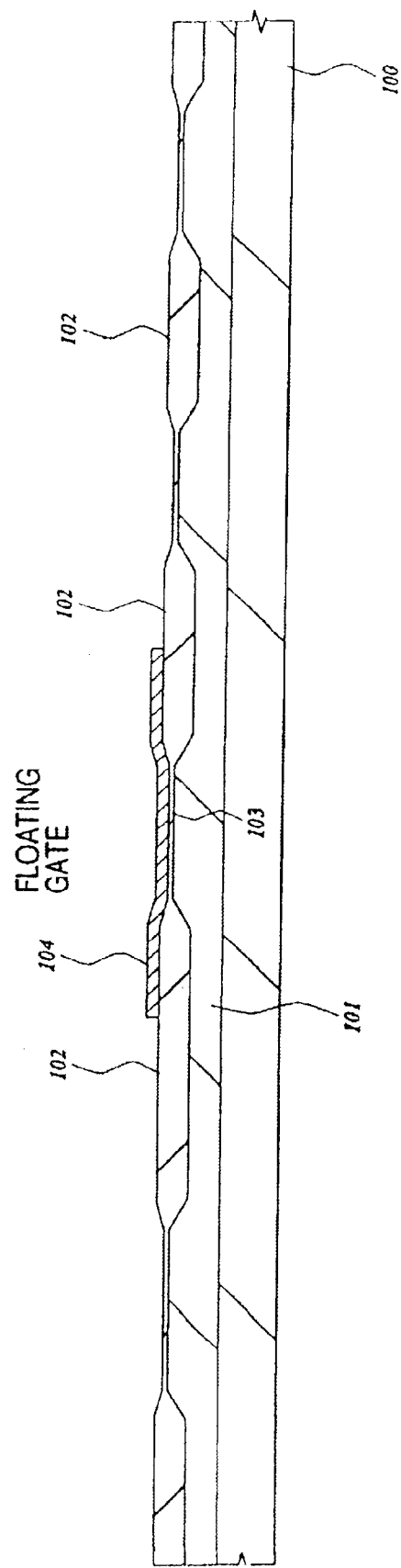
Figure 81:
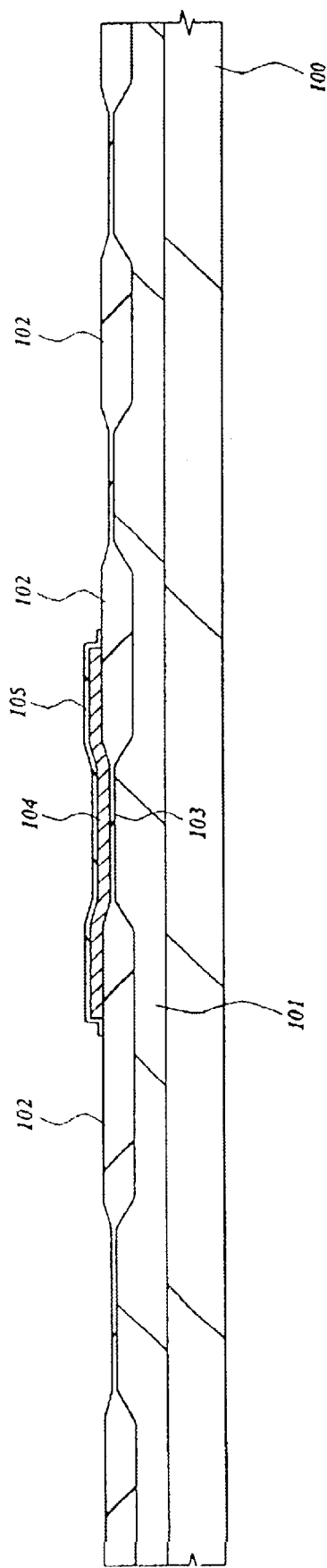
Figure 82:
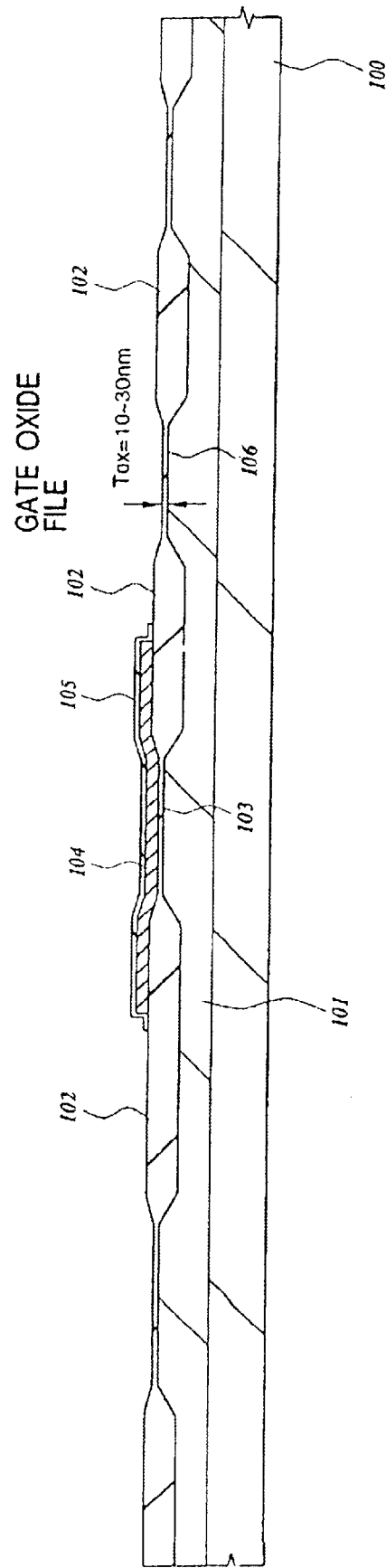
Figure 83:
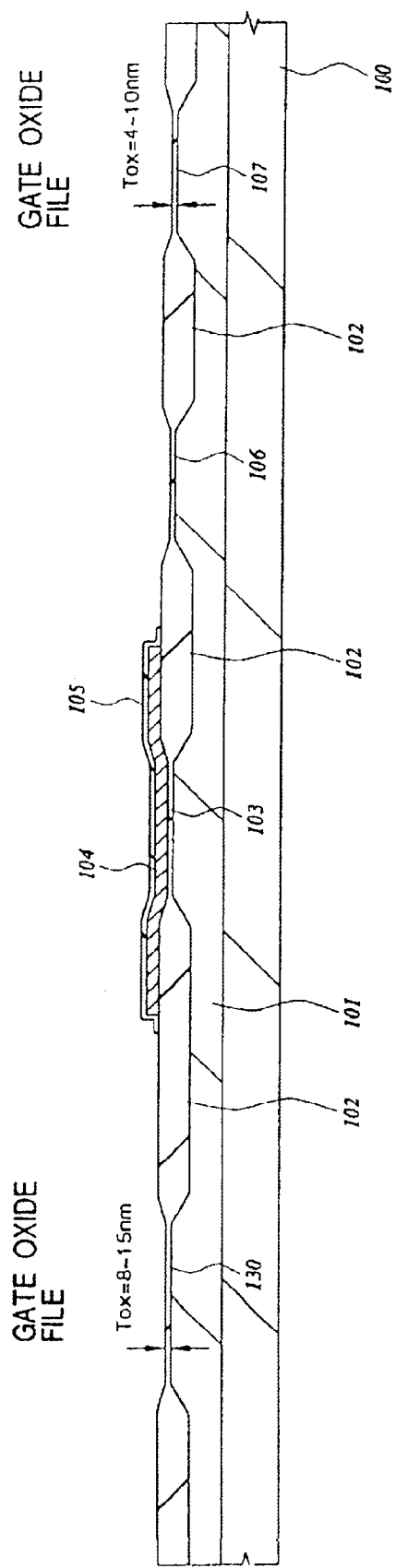
Figure 84:
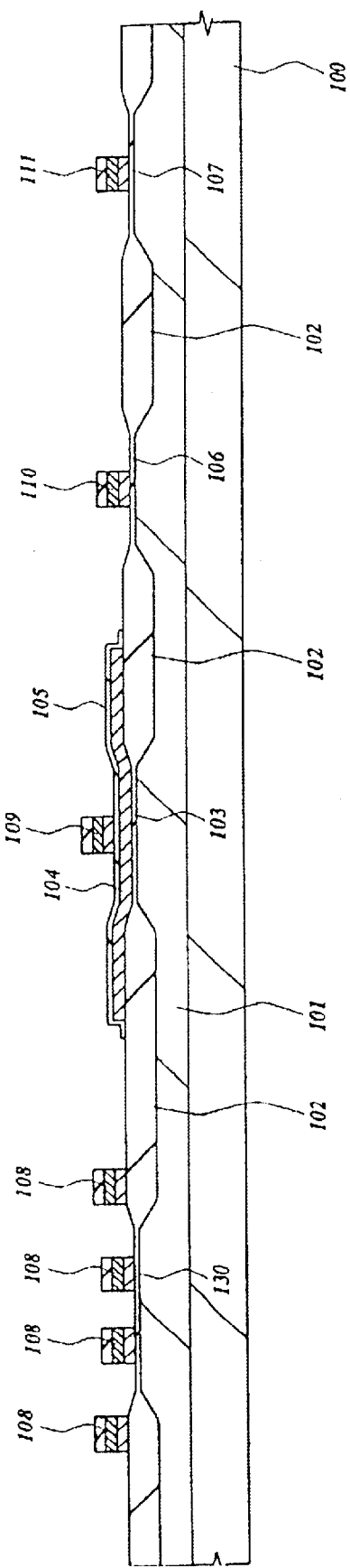
Figure 85:
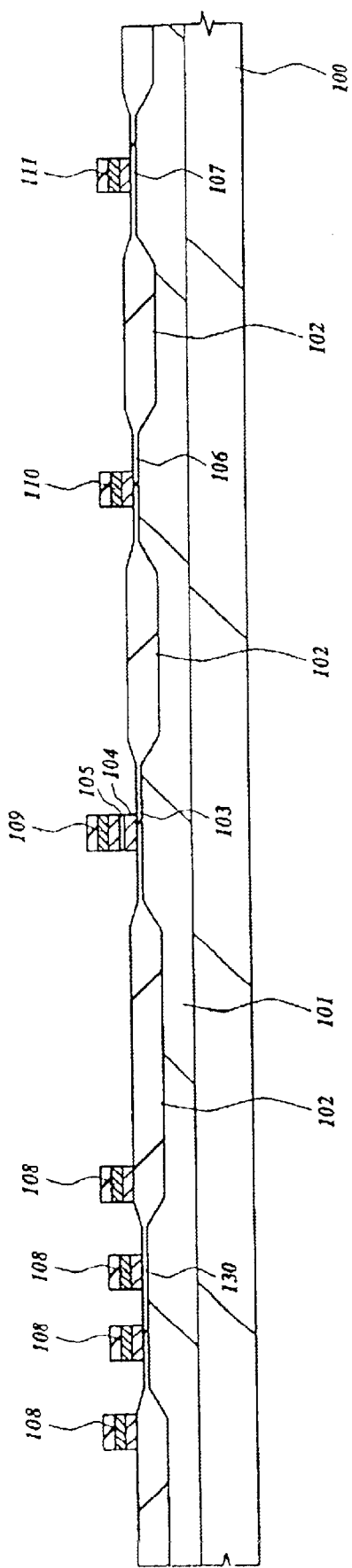
Figure 86:
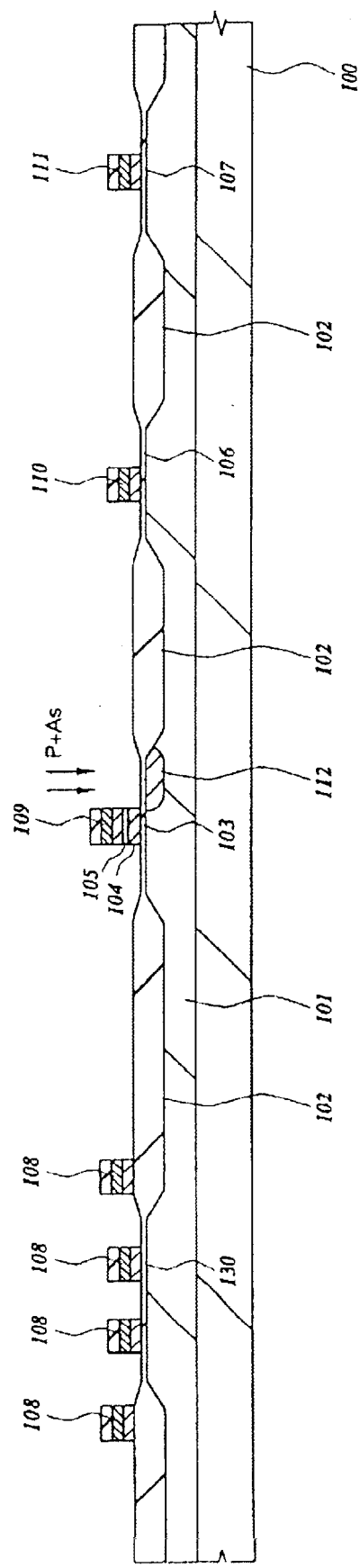
Figure 87:
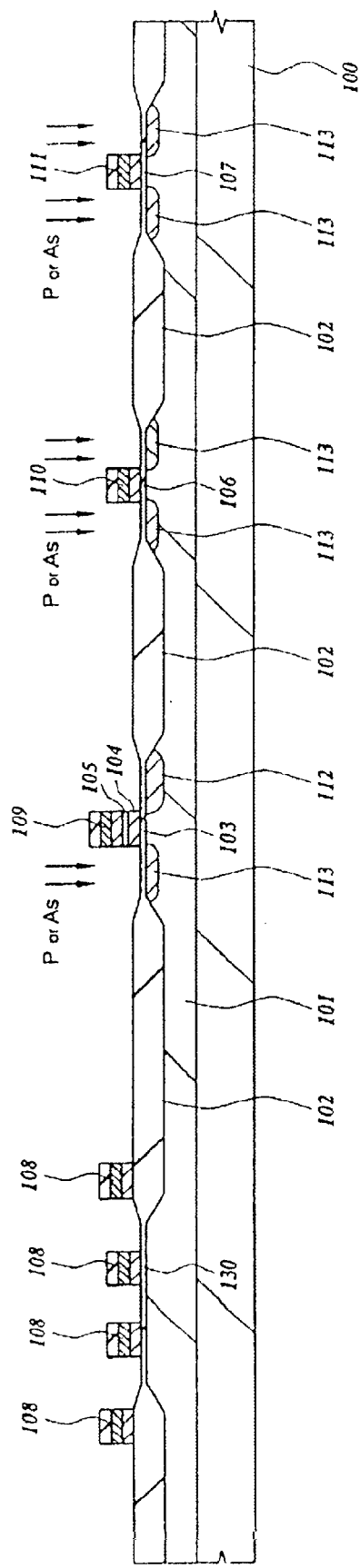
Figure 88:
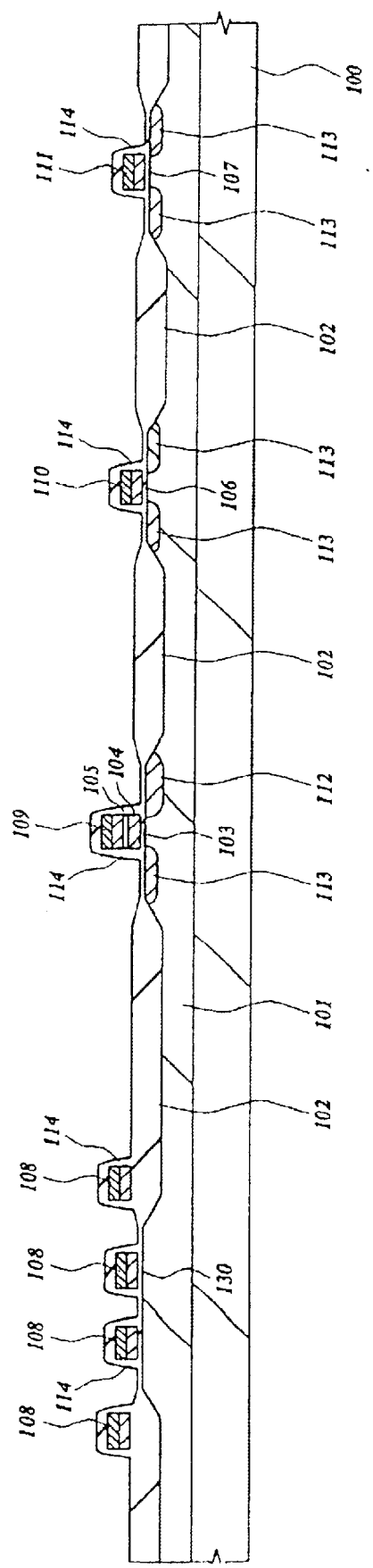
Figure 89:
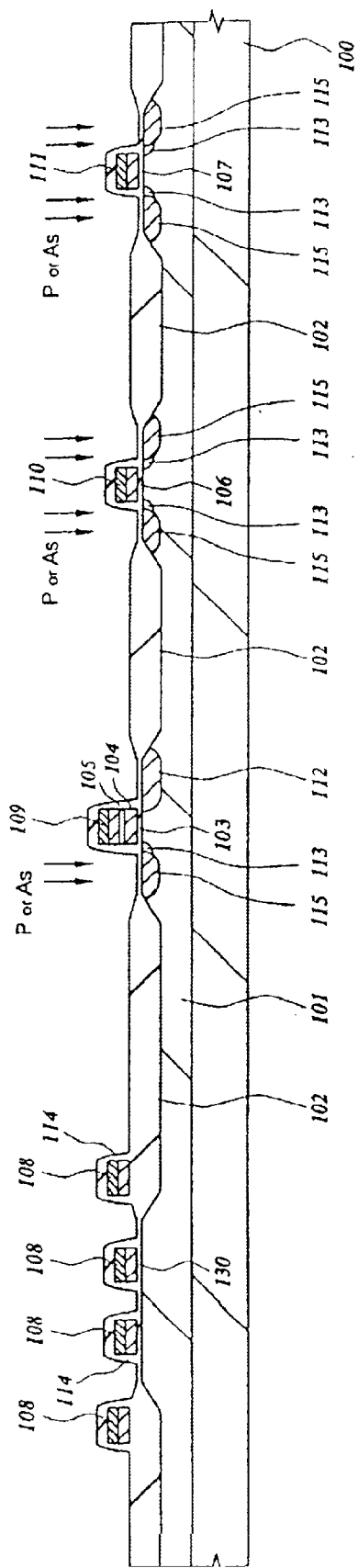
Figure 90:
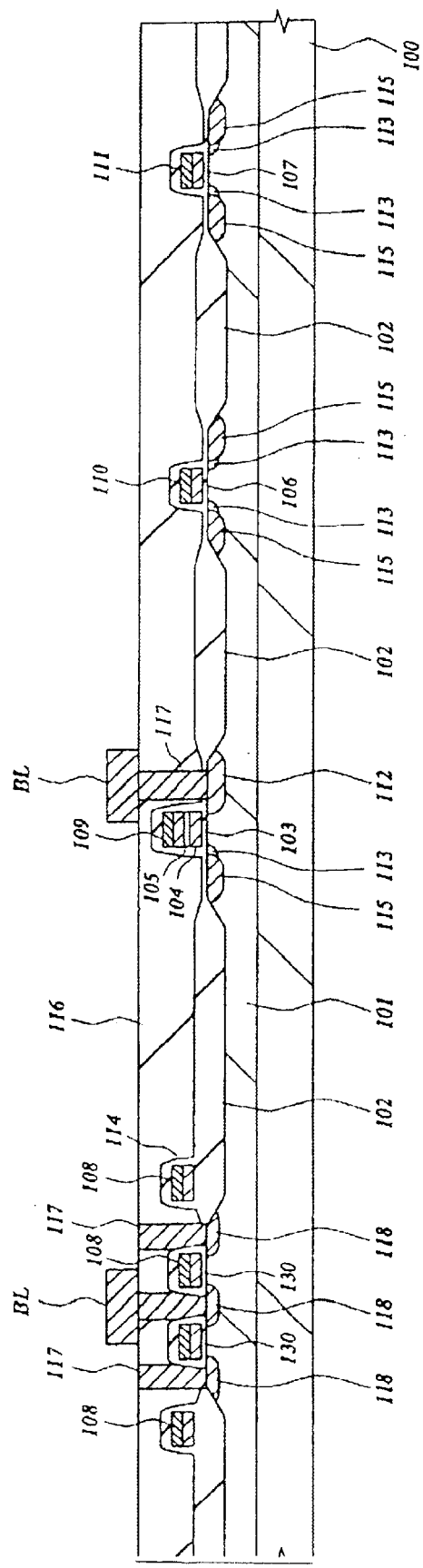
Figure 91:
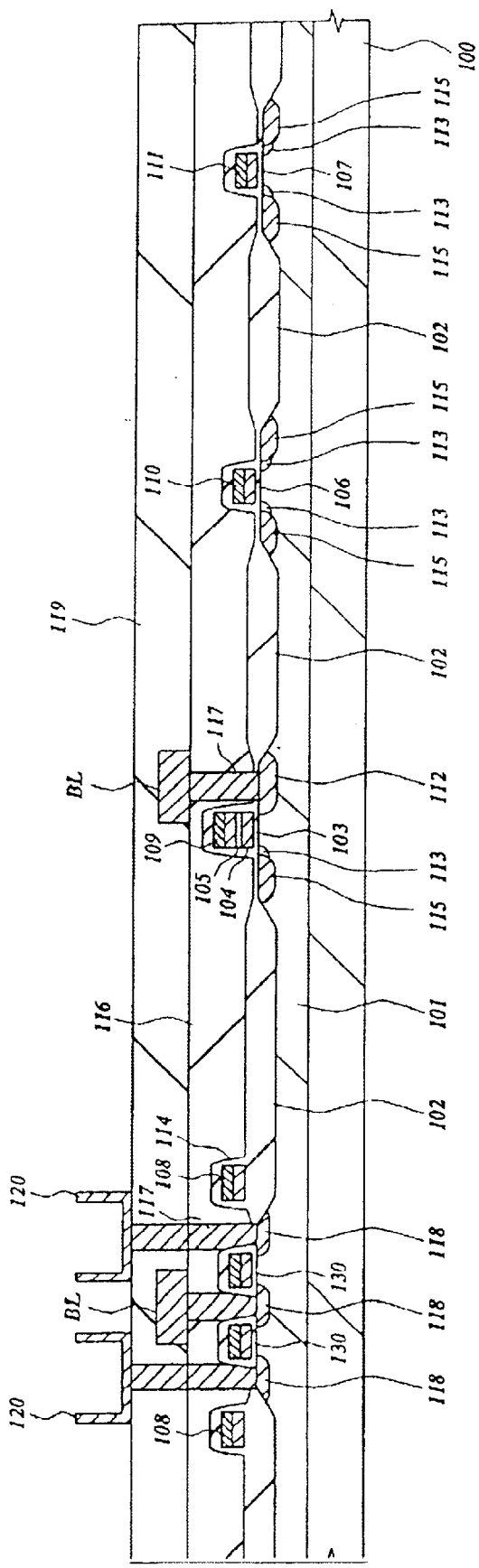
Figure 92:
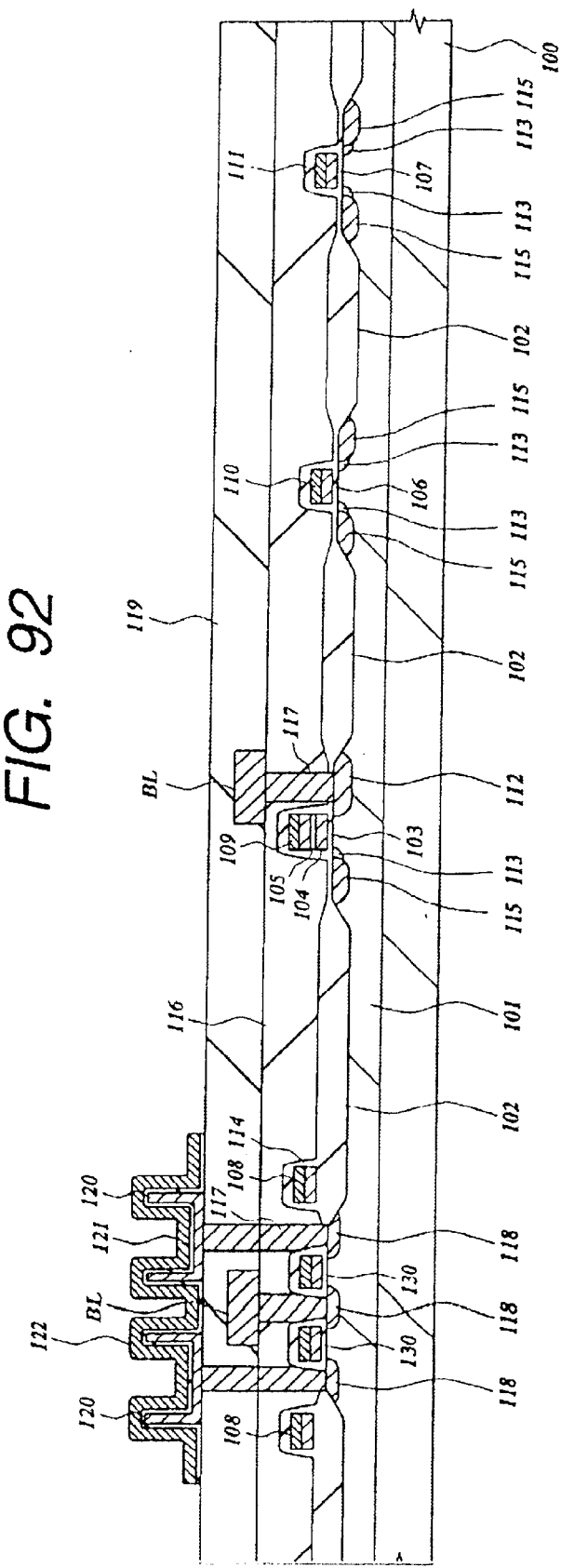
Figure 93:
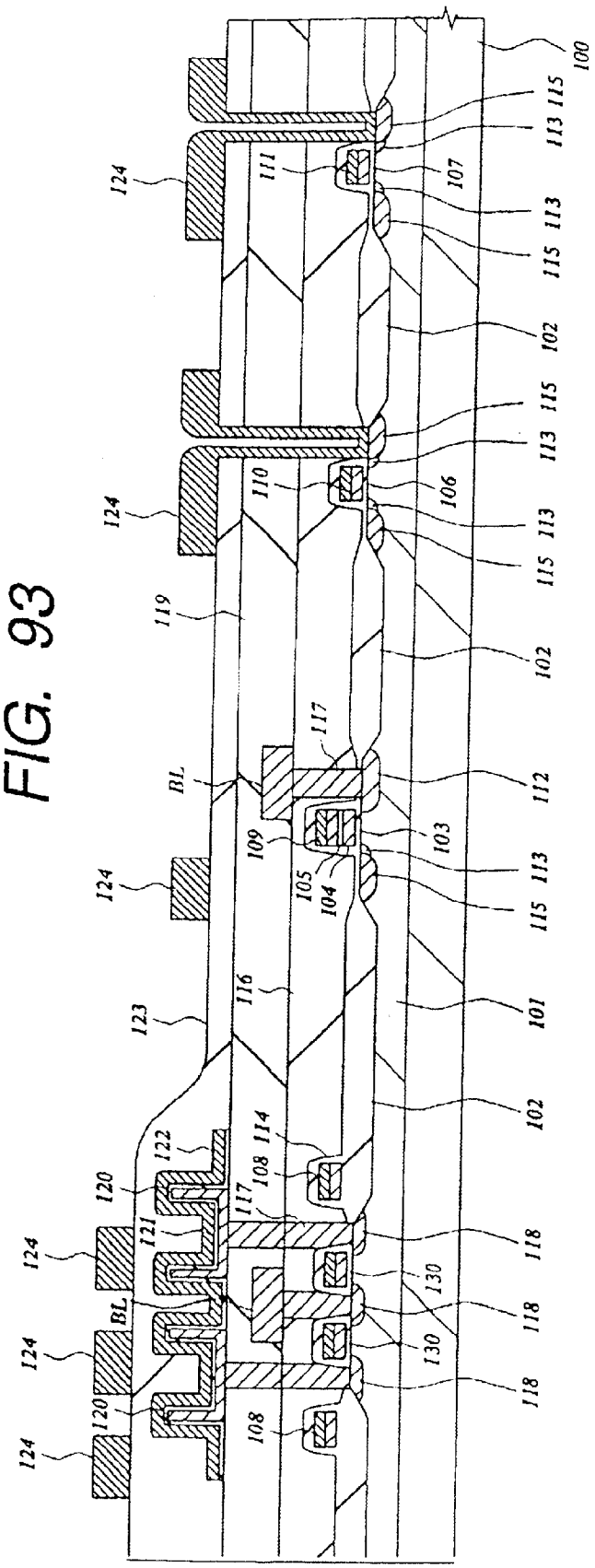
Figure 94:
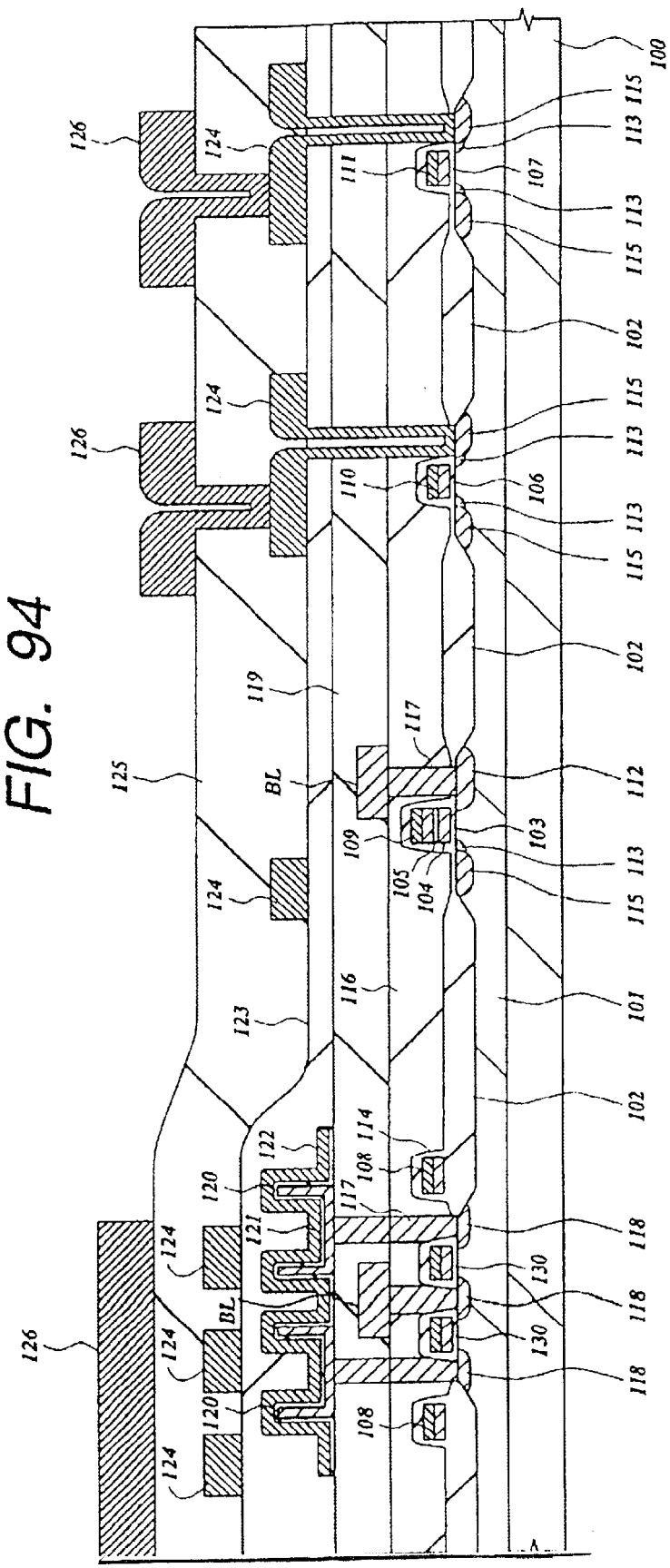

The package according to the present invention is used in multimedia devices, devices such as information electrical appliances, systems, e.g., a car navigation system shown in FIG. 73, a CD-ROM (Compact Disk ROM) driving device shown in FIG. 74, a game device shown in FIG. 75, a PDA (Personal Digital Assistance) shown in FIG. 76, a mobile communication device shown in FIG. 77, etc. Their outlines will be explained below.

FIG. 73 is a functional block diagram showing an example of an internal configuration of a car navigation system. The car navigation system comprises a controller, a display unit electrically connected to the controller, a GPS and a CD-ROM. The controller comprises a main CPU, a program EPROM (4M), a work RAM (SRAM: 1M), an I/O control circuit, an ARTOP, an image RAM (DRAM: 4M), a CG (Computer Graphics) ROM (mask ROM: 4M), a gate array, etc. Further, the display unit comprises a slave microcomputer, a TFT, etc.

In the car navigation system, the main CPU of the controller controls performs control in accordance with control programs stored in the program EPROM. First of all, the controller receives therein position information obtained from the GPS for measuring the position of each vehicle between a satellite and each ground station, and map information stored in the CD-ROM through the I/O control circuit and the gate array and causes the work RAM to store these information therein.

The ARTOP performs, for example, a process for placing each vehicle position on a map, based on the position information and map information stored in the word RAM in accordance with a processing program stored in the CG ROM. Image or pictorial information obtained from the ARTOP is stored in the image RAM. Thereafter, the pictorial information stored in the image RAM is transferred to the display unit where the image information is displayed on the TFT-based screen under the control of the slave microcomputer, whereby an image indicative of each vehicle position placed on the map can be displayed thereon.

In the car navigation system, the main CPU, the program EPROM, and the ARTOP or the like are comprised of a processor, a flash memory, an ASIC-based logic circuit and the like respectively. Thus, the chip MFA according to the present embodiment can be used for each block portion referred to above. Further, the image RAM is comprised of a DRAM and the gate array is comprised of an ASIC-based logic circuit. Thus, the chip AD according to the present embodiment can be used for each block portion referred to above. Further, the chip MF and the chip D may be simply used for portions such as the main CPU and the program EPROM and a portion corresponding to the image RAM respectively.

FIG. 74 is a functional block diagram showing an example of an internal configuration of the CD-ROM driving device. The CD-ROM driving device comprises a microcomputer including a flash memory, a preservo circuit bidirectionally electrically connected to the microcomputer, a signal processing circuit, a ROM decoder, a host I/F, a pickup bidirectioanally electrically connected to the preservo circuit and the signal processing circuit respectively, an SRAM, a D/A electrically connected to the ROM decoder, a buffer RAM electrically connected to the host I/F, etc.

A motor M for driving the CD-ROM is electrically connected to the signal processing circuit. A signal in the CD-ROM is read by the pickup. The rotation of the motor is controlled by signals produced from the preservo circuit and the signal processing circuit. Further, a speaker is electrically connected to the D/A. The present CD-ROM driving device is electrically connected to a host computer through the host I/F.

In the CD-ROM driving device, the signal of the CD-ROM is read by the pickup under the control of the microcomputer. The read signal information is processed by the signal processing circuit. The so-processed information is stored in the SRAM. Further, the information stored in the SRAM is decoded by the ROM decoder, which in turn is converted into an analog signal by the D/A, after which it can be outputted from the speaker and is temporarily stored in the buffer RAM. Thereafter, the so-processed signal can be outputted to the host computer through the host I/F.

In the CD-ROM driving device, the chip MFA according to the present embodiment can be used for each individual block portions such as the microcomputer including the flash memory, the signal processing circuit, etc. Further, the chip AD according to the present embodiment can be used for each individual block portions such as the buffer RAM and the host I/F. The chip MF and the chip D may be simply used for portions such as the microcomputer including the flash memory, and the buffer RAM respectively.

FIG. 75 is a functional block diagram showing an example of an internal configuration of the game device. The game device comprises a body controller, a speaker electrically connected to the body controller, a CD-ROM, a ROM cassette, a display RAM (SDRAM: 4M) to which a CRT is connected, a buffer RAM (DRAM: 4M), and a keyboard. The body controller comprises a main CPU, a system ROM (mask ROM: 16M), a DRAM (SDRAM: 4M), a RAM (SRAM: 256 k), a sound processor, a graphics processor, a moving-picture compressing processor, an I/O control circuit, etc.

In the game device, the main CPU of the body controller performs control in accordance with control programs stored in the system ROM. The main CPU receives picture/voice information stored in the CD-ROM and ROM cassette and instruction information inputted via the keyboard through the I/O control circuit respectively and causes the DRAM and RAM to store these information therein.

The respective information stored in the DRAM and RAM are respectively processed into audio and video signals by the sound processor and graphics processor. The audio signal is outputted as the voice through the speaker, whereas the video signal is temporarily stored in the display RAM, after which it can be displayed on the screen of the CRT as an image. At this time, the amount of information about the video signal is compressed by the moving-picture compressing processor and the so-compressed information is stored in the buffer RAM and used therefrom.

In the game device, the chip MFA according to the present embodiment can be used for each individual block portions such as the main CPU, system ROM, sound processor, graphics processor, etc. Further, the chip AD according to the present embodiment can be used for each individual block portions such as the DRAM, moving-picture compressing processor, etc. The chip MF may be simply used for portions such as the main CPU and system ROM and the chip D may be simply used for portions such as the DRAM, RAM, buffer RAM, etc.

FIG. 76 is a functional block diagram showing an example of an internal configuration of a PDA. The PDA comprises a microcomputer including a flash memory, which comprises a graphics control circuit, a handwriting input circuit, a memory control circuit, a security management circuit and a communication control circuit, an LCD electrically connected to the graphics control circuit of the microcomputer, a digitizer electrically connected to the handwriting input circuit through an A/D, a system memory (mask ROM: 16M) electrically connected to the memory control circuit, an IC card electrically connected to the security management circuit, an IR-IF and a RS-232C electrically connected to the communication control circuit, and a PCMCIA card provided through a PCMCIA control circuit. The present microcomputer is electrically connected to a PHS, a GSM, an ADC, etc. through a network from the communication control circuit.

The PDA is controlled by the memory control circuit in accordance with a control program stored in the system memory. Information written with the digitizer is converted to a digital signal by the A/D, which in turn is stored in the handwriting input circuit. The information stored in the handwriting input circuit is subjected to signal processing by the graphics control circuit and thereafter the so-processed signal can be displayed on the screen of the LCD. In addition to this display, information about communications with the outside, security management information, etc. can be displayed on the screen of the LCD through the graphics control circuit.

Further, communications with the PHS, GSM, ADC, etc. can be performed under the control of the communication control circuit through the network. Information outputted from the PCMCIA card or the like through the PCMCIA control circuit can be brought into the microcomputer. Moreover, information inputted from the IC card is used for security management of the security management circuit.

In the PDA, the chip MFA according to the present embodiment can be used for a block portion corresponding to the microcomputer including the flash memory, which comprises the graphics control circuit, handwriting input circuit, memory control circuit, security management circuit and communication control circuit. Further, the chip D may simply be used for portions such as the graphics control circuit, the handwriting input circuit, etc.

FIG. 77 is a functional block diagram showing an example of an internal configuration of the mobile communication device. The mobile communication device comprises a CPU including a flash memory, a CH codec electrically connected to the CPU, an LCD controller/driver, an IC card, an RF/IF electrically connected to the CH codec through a modem, a speech codec, and an LCD electrically connected to the LCD controller/driver. An antenna is electrically connected to the RF/IF and a speaker and a microphone are electrically connected to the speech codec, respectively.

The mobile communication device is controlled by a program stored in the flash memory of the CPU. Upon signal reception, the mobile communication device receives a signal inputted from the antenna via the RF/IF and modulates it using the modem. Further, the modulated signal is converted to a speech signal by using the CH codec and the speech codec, after which the so-converted signal can be outputted through the speaker as the voice.

Upon signal transmission, the mobile communication device converts a speech signal inputted via the microphone to another form by using the speech codec and the CH codec. After the so-converted signal has been demodulated by the modem, the demodulated signal can be transmitted from the antenna through the RF/IF.

In the mobile communication device, the chip MFA according to the present embodiment is used for each individual block portions such as the CPU, CH codec, etc. The chip AD according to the present embodiment can be used for each individual portions such as the LCD controller/driver, etc. The chip MF may be simply used for a CPU portion.

As described above, the semiconductor device comprised of the combinations of the chips MF, MFA, AD, D etc. according to the present embodiment can be widely applied to the multimedia devices such as the car navigation system, CD-ROM driving device, game device, PDA, mobile communication device, etc., the devices such as the information home appliances or the like, a system, etc.

Thus, according to the present invention, the following advantageous effects can be obtained.

(1) Since a package structure wherein two types of chips corresponding to a chip MF based on a CPU and a flash memory or the like and a chip D based on a DRAM are brought into one package, is adopted in terms of circuital costs, the number of external connecting terminals can be reduced and a reduction in mounting packing areas owing to the integration of the two types of chips into one package can be achieved, whereby the cost down to the semiconductor device can be achieved. Further, an apparatus, a system, etc. each using the present semiconductor device can be also reduced in cost.

(2) When a chip MFA and a chip AD are adopted wherein a logic circuit such as an ASIC or the like is incorporated in chips MF and D respectively, and a DRAM is used as a synchronous DRAM, external connecting terminals can further be set in common. Therefore, the number of external connecting terminals is still further reduced so that the cost down can be achieved.

(3) In terms of a circuital operation, the need for wait control can be eliminated by using a chip AD equipped with a DRAM and a logic circuit such as an ASIC, and an access operation to the DRAMA from the logic circuit can be performed during a self-refresh period of the DRAM as viewed from the outside. Therefore, the transfer of data between the outside and the chip AD can be speeded up.

Since a CPU need not perform wait-signal exchanges in particular because the CPU itself controls time so as to achieve one clock cycle, a high-speed access can be performed. Further, the processing made to an apparatus, a system, etc. using the present semiconductor device can be speeded up.

(4) Even in the case of a package structure wherein two types of chips corresponding to a chip AD equipped with a DRAM and a logic circuit, and chips MF and MFA each equipped with a CPU, a flash memory, etc. are brought into one package, an access operation to the DRAM from the logic circuit can be performed during a self-refresh period of the DRAM as viewed from the CPU. Therefore, the transfer of data between the chip AD and the chip MF and between the chip AD and the chip MFA can be speeded up.

(5) Since wait control used to perform wait-signal exchanges becomes unnecessary, timing provided for processing itself can be controlled from the CPU. That is, since the timing itself provided to perform processing can be recognized from within each program set to the CPU, it is possible to easily create programs for the semiconductor device.

(6) The use of a general-purpose DRAM interface makes it possible to directly connect a chip AD equipped with a DRAM and a logic circuit and chips MF and MFA each equipped with a CPU, a flash memory, etc. to one another so as to be operable at high speed.

(7) Since a DRAM, logic, a flash memory, etc. different in power level from one another are formed in parts as two or more chips so as to reduce a load on a process, the manufacturing cost of each chip can be greatly reduced as compared with the case in which these are formed in mixed form as one chip.

(8) Two types of chips corresponding to a chip MF based on a CPU and a flash memory or the like and a chip D based on a DRAM are installed in an ultra-thin stacked package so as to take on one package, whereby the packing area of each chip can be greatly reduced.

While the present invention which has been made by the present inventors, has been described specifically based on the illustrative embodiments of the invention, the present invention is by no means limited to the above-described embodiments. It is needless to say that various changes can be made thereto within the scope departing from the substance of the invention.

INDUSTRIAL APPLICABILITY

As described above, the semiconductor device according to the present invention has a package structure wherein from an MCM-based approach, a plurality of types of semiconductor chips such as a first chip in which a flash memory and a logic circuit such as an ASIC or the like are formed in a microcomputer including a CPU, one or a plurality of second chips in which a DRAM and a logic circuit such as an ASIC or the like are formed, are accommodated or held inside the same package so that signals can be input and outputted. This type of package structure is useful for a semiconductor device capable of reducing the number of external connecting terminals, achieving a reduction in the packing area owing to the integration of two types of chips into one package, and allowing the cost down even from the circuital standpoint of a functional block configuration. Further, the present invention can be widely applied to multimedia devices, devices such as an information home appliance or the like, a system, etc. each using the present semiconductor device.

What is claimed is:

1. A method of manufacturing a semiconductor device comprising the steps of:
   (a) providing a first semiconductor chip having a semiconductor substrate, a first integrated circuit formed on one surface of the semiconductor substrate thereof and electrodes electrically connecting the first integrated circuit, the first integrated circuit having a first function;
   (b) providing a second semiconductor chip having a semiconductor substrate and a second integrated circuit formed on one surface of the semiconductor substrate thereof and electrodes electrically connecting the second integrated circuit, the second integrated circuit having a second function that is different from the first function;
   (c) providing a first wiring substrate and a second wiring substrate each having wirings;
   (d) electrically connecting the electrodes of the first semiconductor chip with the wirings of the first wiring substrate;
   (e) after step (d), sealing the first semiconductor chip with a first resin sealing body;
   (f) electrically connecting the electrodes of the second semiconductor chip with the wirings of the second wiring substrate;
   (g) after step (f), sealing the second semiconductor chip with a second resin sealing body;
   (h) superimposing the second wiring substrate on the first wiring substrate, and the second semiconductor chip with the second resin sealing body on the first semiconductor chip with the first resin sealing body; and
   (i) after step (h), electrically connecting the wirings of the first wiring substrate with the wirings of the second wiring substrate;
   wherein the second semiconductor chip has a memory circuit,
   wherein the second semiconductor chip has electrodes for control signal terminals of the memory circuit, and the electrodes for control signal terminals of the memory circuit are electrically connected with the electrodes of the first semiconductor chip through the wirings of the first wiring substrate and the wirings of the second wiring substrate,
   wherein the first integrated circuit of the first semiconductor chip has a function to generate a control signal and output the control signal to the electrodes for control signal terminals of the memory circuit, and
   wherein the memory circuit of the second semiconductor chip is controlled by the control signal generated by the first integrated circuit.

2. A method of manufacturing a semiconductor device according to claim 1, further comprising a step of:
   (j) after step (e) and before step (h), subjecting the first semiconductor chip connected with the first wiring substrate to a test to select a good product.

3. A method of manufacturing a semiconductor device according to claim 2, further comprising a step of:
   (k) after step (g) and before step (h), subjecting the second semiconductor chip connected with the second wiring substrate to a test to select a good product.

4. A method of manufacturing a semiconductor device according to claim 1, further comprising a step of:
   (j) after step (g) and before step (h), subjecting the second semiconductor chip connected with the second wiring substrate to a test to select a good product.

5. A method of manufacturing a semiconductor device according to claim 1, wherein step (i) is performed to electrically connect the wirings at an outside of an arranging area of the first semiconductor chip and the second semiconductor chip in plan view.

6. A method of manufacturing a semiconductor device according to claim 1, wherein each of the first wiring substrate and the second wiring substrate has a through hole,
   in step (d), arranging the first semiconductor chip in the through hole of the first wiring substrate and
   in step (f), arranging the second semiconductor chip in the through hole of the second wiring substrate.

7. A method of manufacturing a semiconductor device according to claim 6, further comprising a step of forming external connecting terminals on the first wiring substrate, the external connecting terminals being arranged at a periphery of the through hole thereof in plan view.

8. A method of manufacturing a semiconductor device according to claim 7, wherein the external connecting terminals are arrayed in multi rows along the periphery of the through hole thereof.

9. A method of manufacturing a semiconductor device according to claim 8, wherein the external connecting terminals are comprised of solder bumps.

10. A method of manufacturing a semiconductor device according to claim 8, wherein the external connecting terminals include some external connecting terminals electrically connected with the second semiconductor chip and electrically isolated from the first semiconductor chip.

11. A method of manufacturing a semiconductor device according to claim 7, wherein a thickness of the first semiconductor chip is smaller than a depth of the through hole of the first wiring substrate, and a thickness of the second semiconductor chip is smaller than a depth of the through hole of the second wiring substrate.

12. A method of manufacturing a semiconductor device according to claim 1, further comprising a step of forming external connecting terminals on the first wiring substrate, the external connecting terminals including some external connecting terminals electrically connected with the second semiconductor chip and electrically isolated from the first semiconductor chip.

13. A method of manufacturing a semiconductor device according to claim 1, wherein the first semiconductor chip has a CPU.

14. A method of manufacturing a semiconductor device according to claim 1, wherein step (i) is performed to leave a clearance between the first sealing body and the second sealing body.

15. A method of manufacturing a semiconductor device according to claim 14, wherein each of the first wiring substrate and the second wiring substrate have a through hole,
  in step (d), arranging the first semiconductor chip in the through hole of the first wiring substrate and
  in step (f), arranging the second semiconductor chip in the through hole of the second wiring substrate.

16. A method of manufacturing a semiconductor device according to claim 15, wherein step (i) is performed to electrically connect the wirings at an outside of the through holes of the first wiring substrate and the second wiring substrate in plan view.

17. A method of manufacturing a semiconductor device according to claim 16, wherein step (i) is performed to electrically connect the wirings of the first wiring substrate with wirings of the second wiring substrate through solder bumps, respectively.

18. A method of manufacturing a semiconductor device, comprising the steps of:
  (a) providing a first semiconductor chip having a semiconductor substrate, a first integrated circuit formed on one surface of the semiconductor substrate thereof and electrodes electrically connecting the first integrated circuit, the first integrated circuit having a first function;
  (b) providing a second semiconductor chip having a semiconductor substrate and a second integrated circuit formed on one surface of the semiconductor substrate thereof and electrodes electrically connecting the second integrated circuit, the second integrated circuit having a second function that is different from the first function;
  (c) providing a first wiring substrate and a second wiring substrate each having wirings;
  (d) electrically connecting the electrodes of the first semiconductor chip with the wirings of the first wiring substrate;
  (e) after step (d), sealing the first semiconductor chip with a first resin sealing body;
  (f) electrically connecting the electrodes of the second semiconductor chip with the wirings of the second wiring substrate;
  (g) after step (f), sealing the second semiconductor chip with a second resin sealing body;
  (h) superimposing the second wiring substrate on the first wiring substrate, and the second semiconductor chip with the second resin sealing body on the first semiconductor chip with the first resin sealing body; and
  (i) after step (h), electrically connecting the wirings of the first wiring substrate with the wirings of the second wiring substrate;
  wherein the first semiconductor chip has a MOSFET having a first gate oxide film, the second semiconductor chip has a MOSFET having a second gate oxide film, and a thickness of the first gate oxide film is different from a thickness of the second gate oxide film.

19. A method of manufacturing a semiconductor device, comprising the steps of:
  (a) providing a first semiconductor chip having a semiconductor substrate, a first integrated circuit formed on one surface of the semiconductor substrate thereof and electrodes electrically connecting the first integrated circuit, the first integrated circuit having a first function;
  (b) providing a second semiconductor chip having a semiconductor substrate and a second integrated circuit formed on one surface of the semiconductor substrate thereof and electrodes electrically connecting the second integrated circuit, the second integrated circuit having a second function that is different from the first function;
  (c) providing a first wiring substrate and a second wiring substrate each having wirings;
  (d) electrically connecting the electrodes of the first semiconductor chip with the wirings of the first wiring substrate;
  (e) after step (d), sealing the first semiconductor chip with a first resin sealing body;
  (f) electrically connecting the electrodes of the second semiconductor chip with the wirings of the second wiring-substrate;
  (g) after step (f), sealing the second semiconductor chip with a second resin sealing body;
  (h) superimposing the second wiring substrate on the first wiring substrate, and the second semiconductor chip with the second resin sealing body on the first semiconductor chip with the first resin sealing body; and
  (i) after step (h), electrically connecting the wirings of the first wiring substrate with the wirings of the second wiring substrate;
  wherein the first semiconductor chip has a semiconductor element having a first gate isolation film, the second semiconductor chip has a semiconductor element having a second gate isolation film, and a thickness of the first gate isolation film is different from a thickness of the second gate isolation film.

* * * * *